United States Patent
Su et al.

(10) Patent No.: US 12,532,505 B2
(45) Date of Patent: Jan. 20, 2026

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Huan-Chieh Su, Tianzhong Township (TW); Zhi-Chang Lin, Zhubei (TW); Li-Zhen Yu, New Taipei (TW); Chun-Yuan Chen, Hsinchu (TW); Lo-Heng Chang, Hsinchu (TW); Cheng-Chi Chuang, New Taipei (TW); Chih-Hao Wang, Baoshan Township (TW); Lin-Yu Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 848 days.

(21) Appl. No.: 17/671,737

(22) Filed: Feb. 15, 2022

(65) Prior Publication Data
US 2023/0034360 A1    Feb. 2, 2023

Related U.S. Application Data

(60) Provisional application No. 63/226,295, filed on Jul. 28, 2021.

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H10D 30/031* (2025.01);
(Continued)

(58) Field of Classification Search
CPC ............. H10D 30/6713; H10D 30/031; H10D 30/6729; H10D 30/6735; H10D 30/6757; H10D 62/118; H10D 64/017; H10D 30/797; H10D 30/014; H10D 30/43; H10D 62/121; H10D 84/0151; H10D 84/038; H10D 84/83; H10D 62/822; H10D 84/0135; H10D 84/0142; H10D 84/0128; H10D 84/013; H10D 84/0144; H10D 84/0147;
(Continued)

(56) References Cited

U.S. PATENT DOCUMENTS

2022/0223706 A1*    7/2022  Yang .................... H10D 88/00

FOREIGN PATENT DOCUMENTS

TW              202125832 A       7/2021

* cited by examiner

*Primary Examiner* — Karen Kusumakar
(74) *Attorney, Agent, or Firm* — Slater Matsil, LLP

(57) ABSTRACT

A semiconductor structure is provided. The semiconductor structure includes a first gate stack wrapping around first nanostructures, a second gate stack wrapping around second nanostructures, a gate isolation structure interposing between the first gate stack and the second gate stack, a first source/drain feature adjoining the first nanostructures, a second source/drain feature adjoining the second nanostructures, and a source/drain spacer structure interposing between the first source/drain feature and the second source/drain feature. The gate isolation structure covers a sidewall of the source/drain spacer structure.

20 Claims, 37 Drawing Sheets

(51) Int. Cl.
*H10D 30/01* (2025.01)
*H10D 62/10* (2025.01)
*H10D 64/01* (2025.01)

(52) U.S. Cl.
CPC ..... *H10D 30/6729* (2025.01); *H10D 30/6735* (2025.01); *H10D 30/6757* (2025.01); *H10D 62/118* (2025.01); *H10D 64/017* (2025.01)

(58) Field of Classification Search
CPC .............. H10D 84/0158; H10D 84/834; H01L 21/0259; B82Y 10/00
See application file for complete search history.

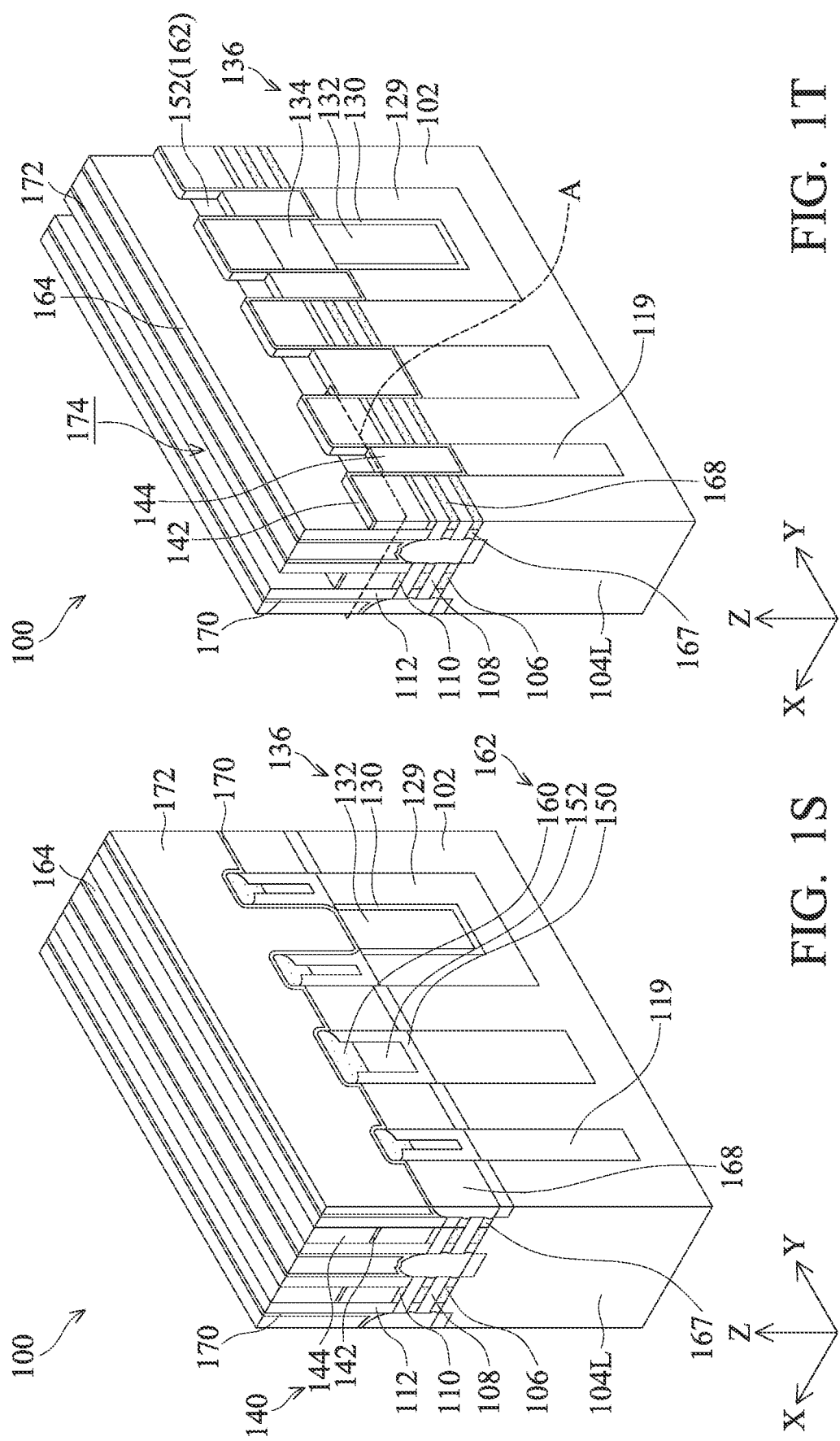

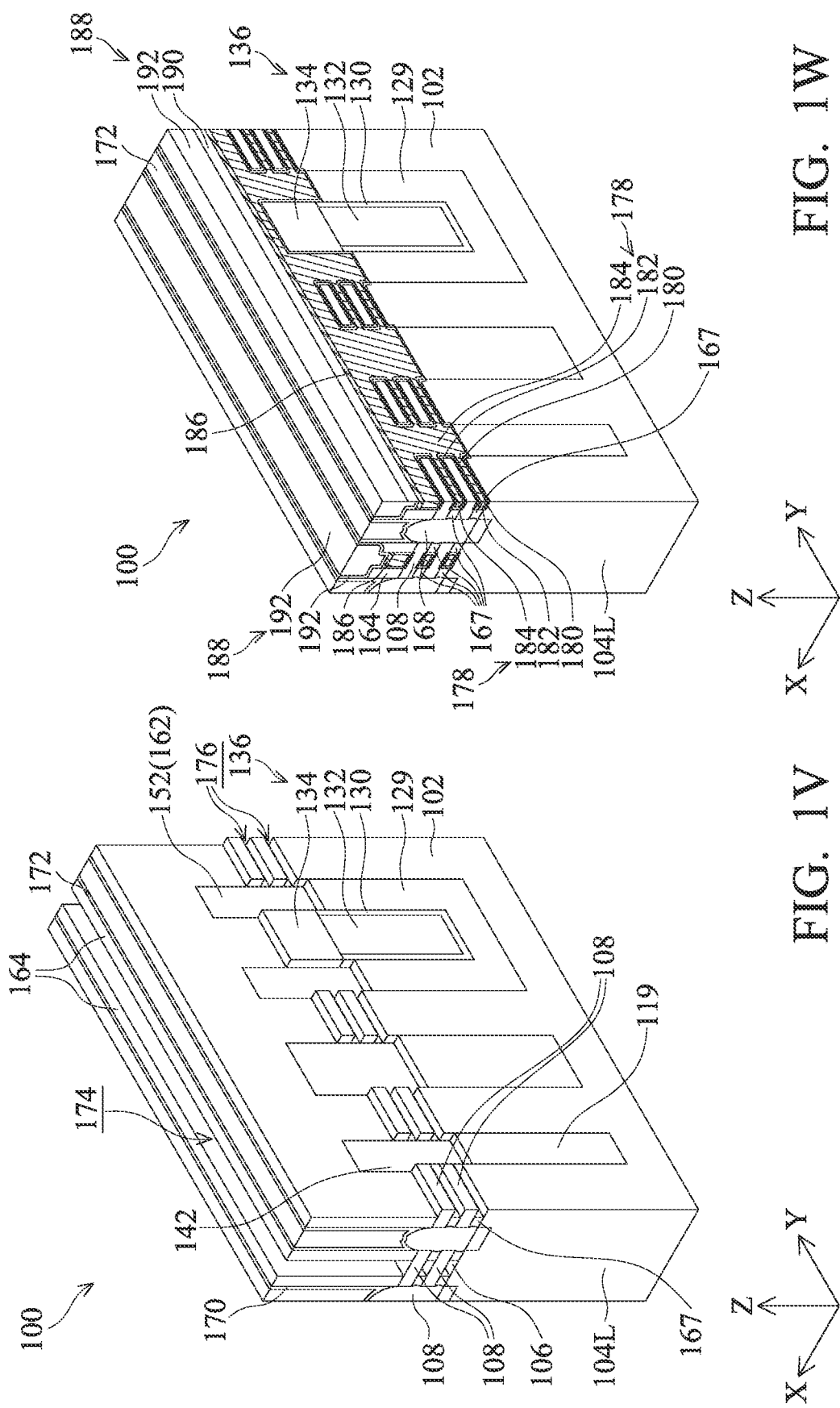

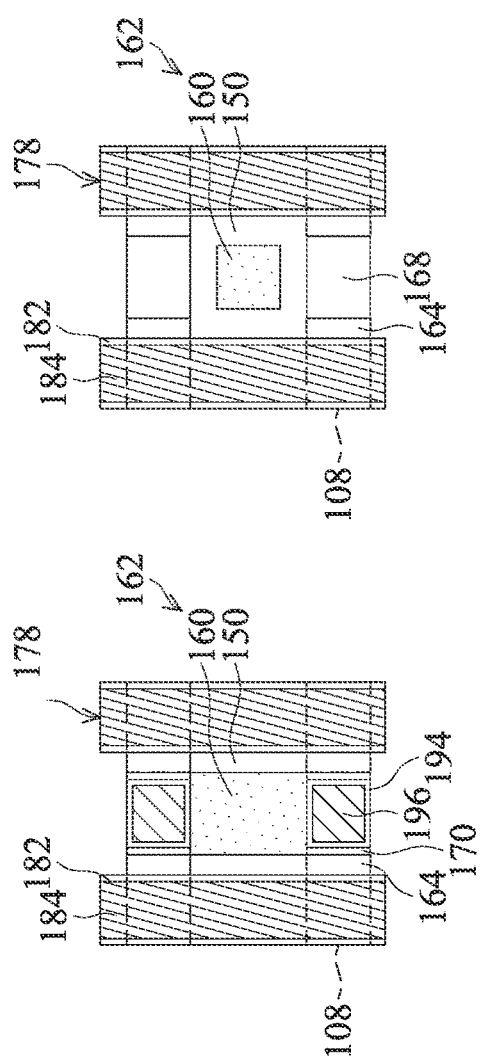
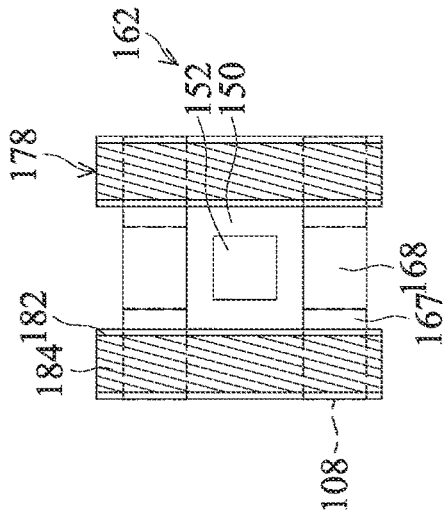
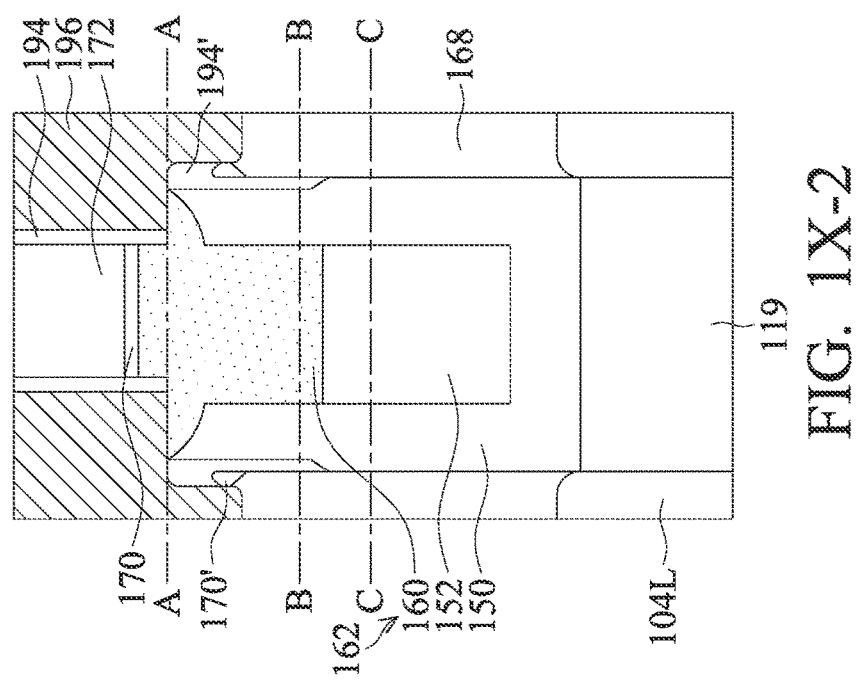
FIG. 1X-3
FIG. 1X-4
FIG. 1X-5
FIG. 1X-2

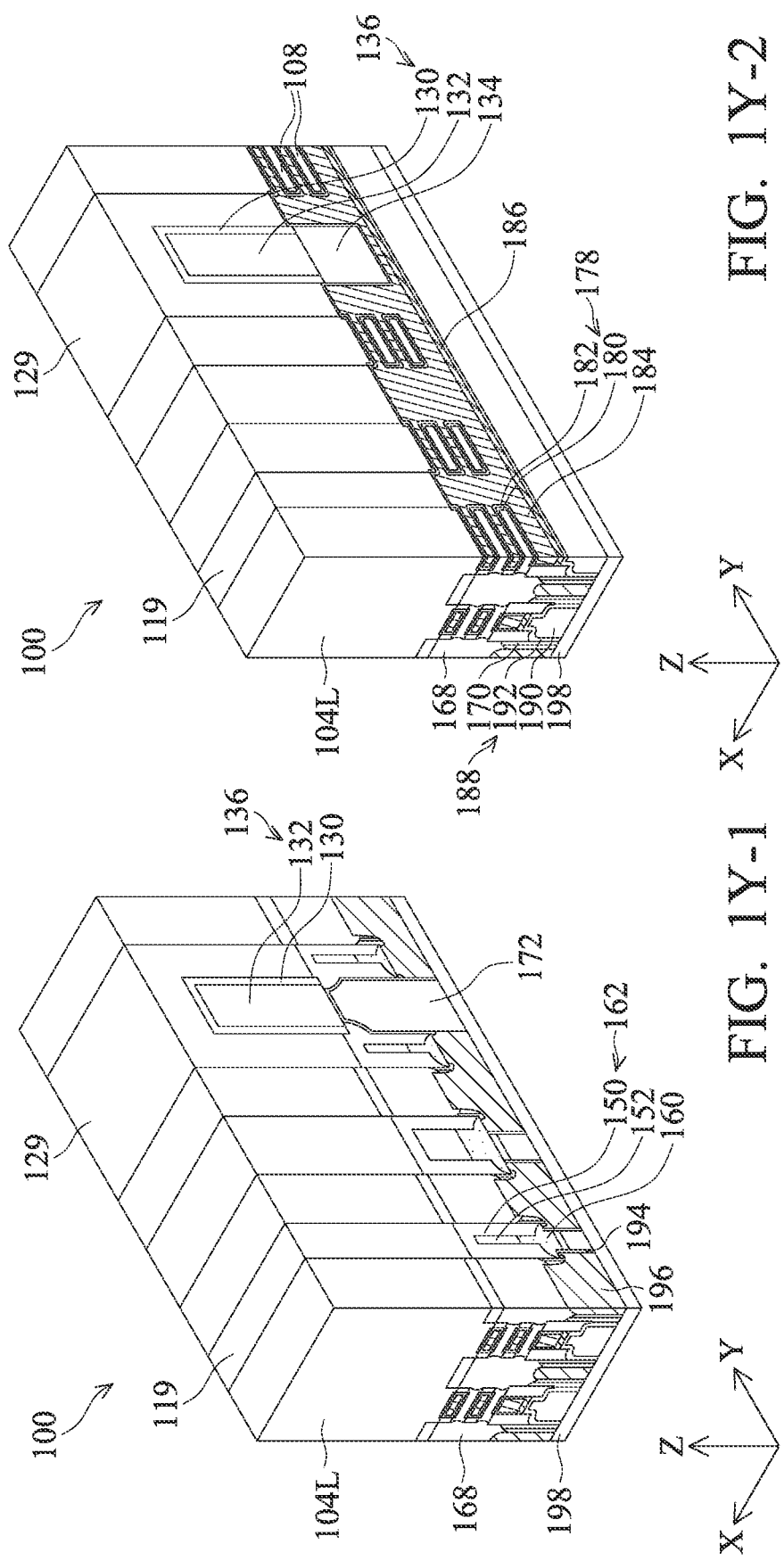

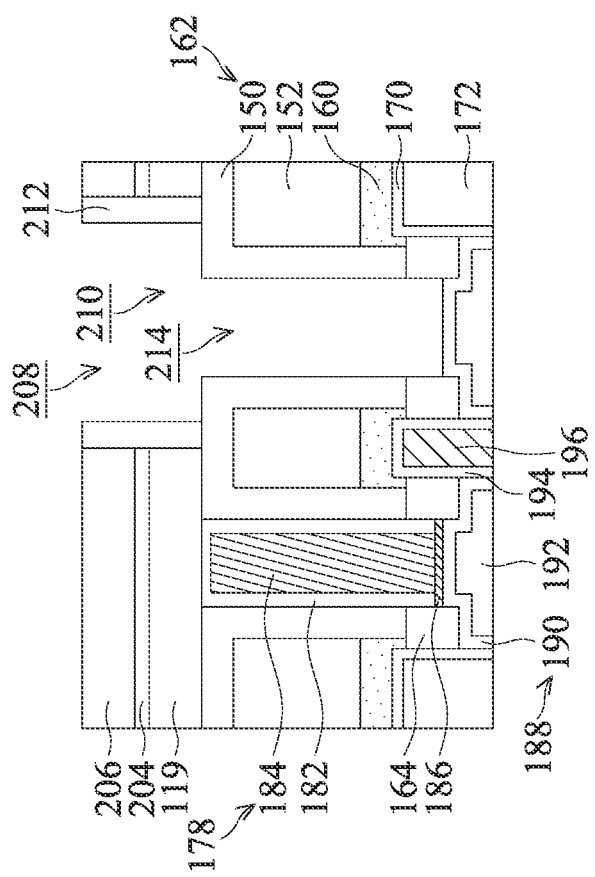
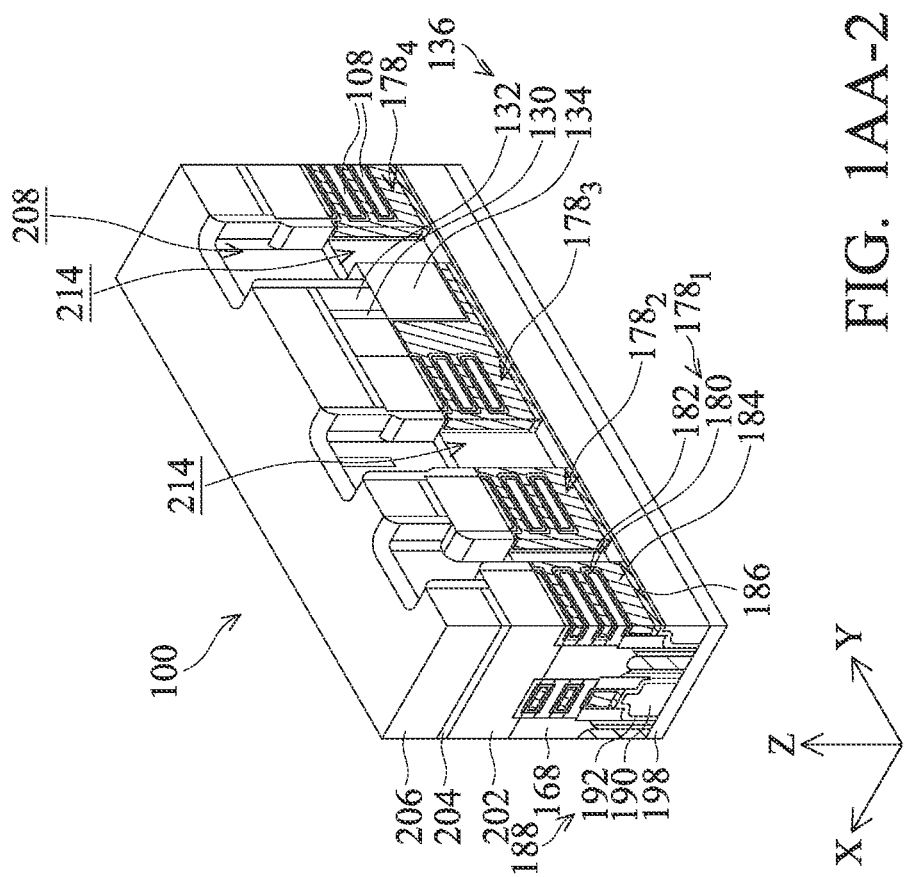
FIG. 1AA-3
FIG. 1AA-2

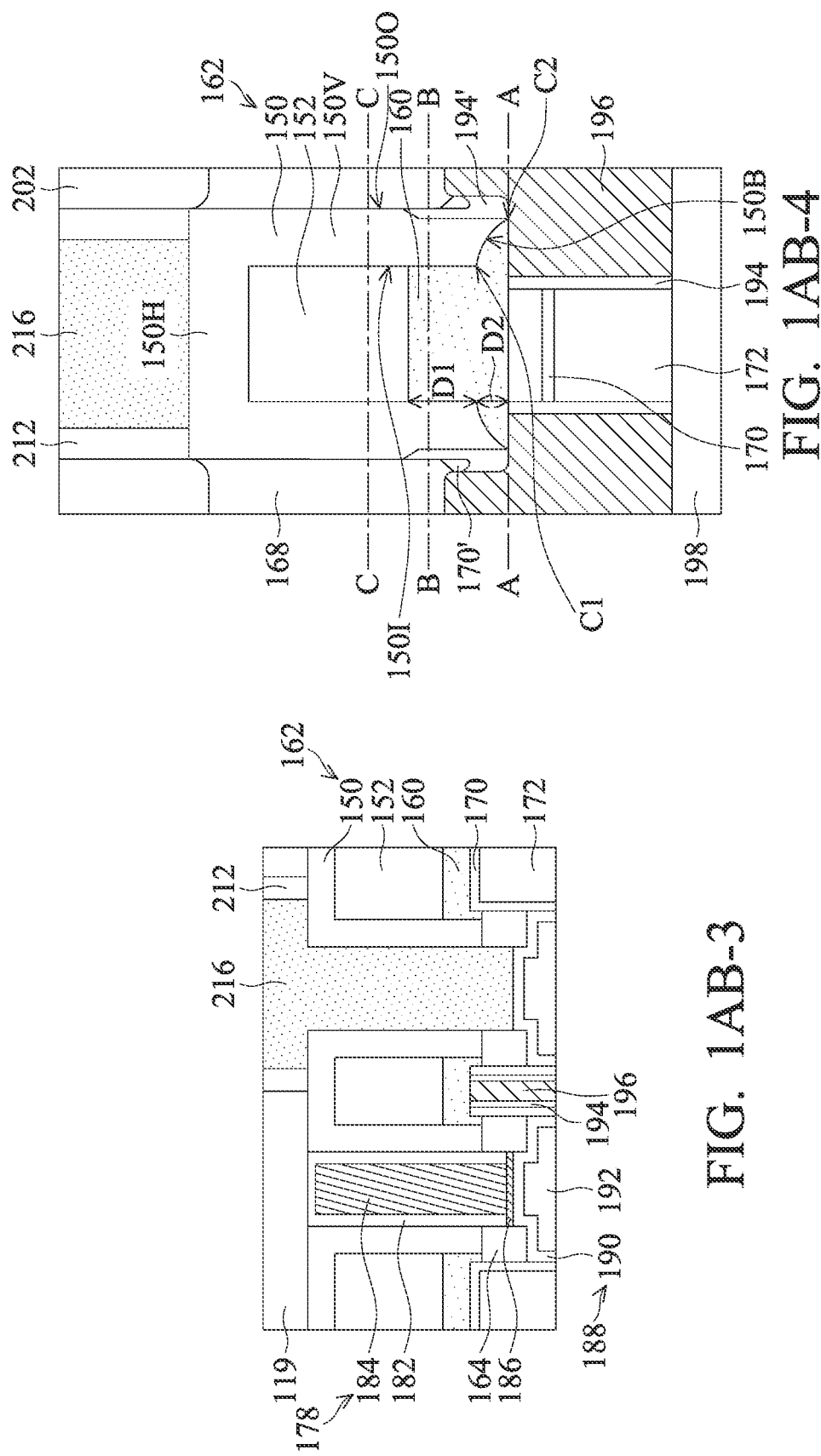

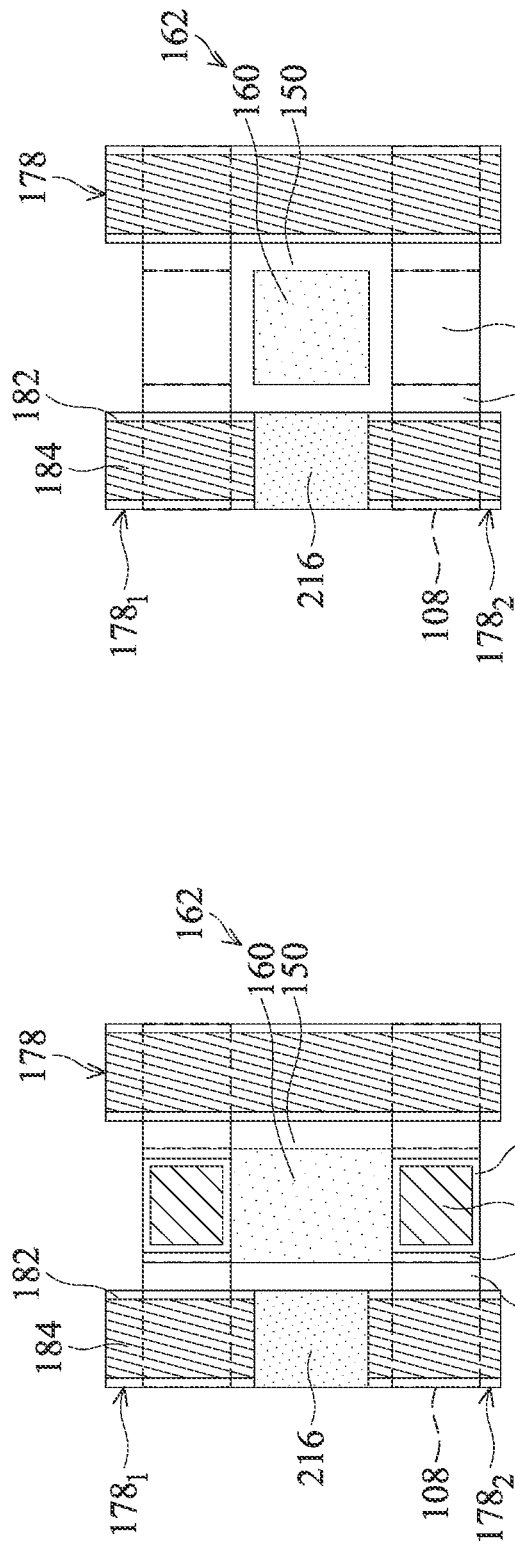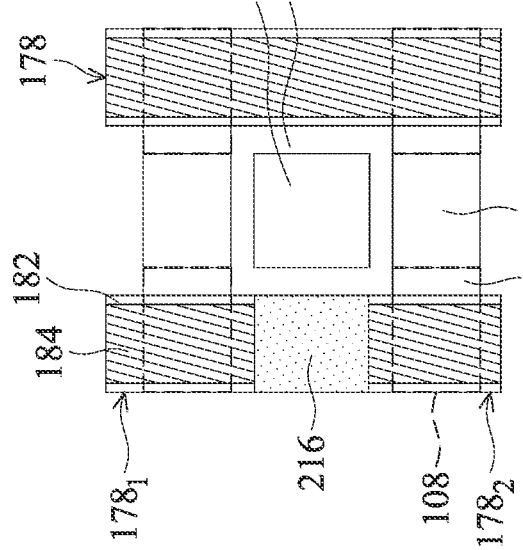

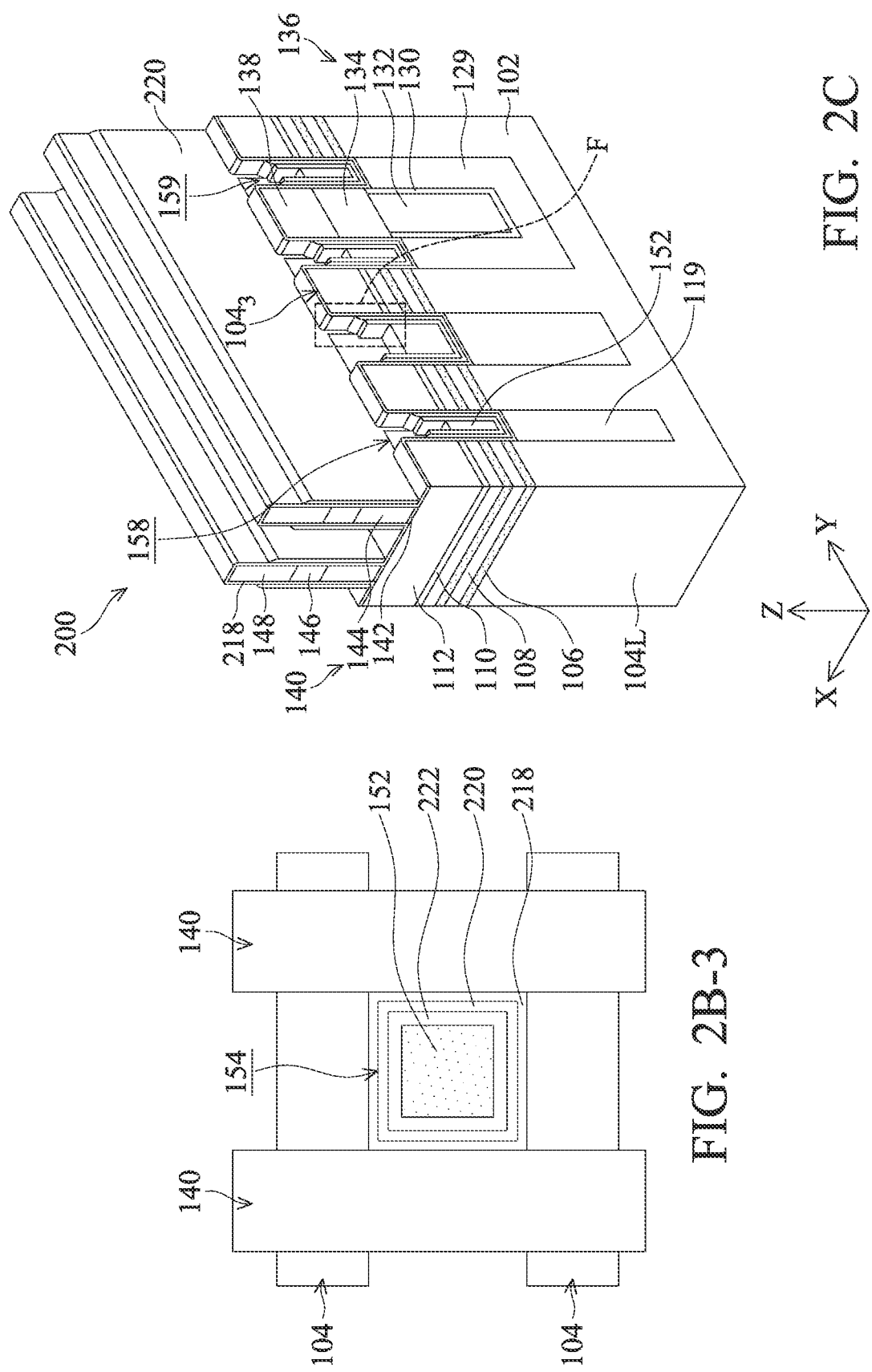

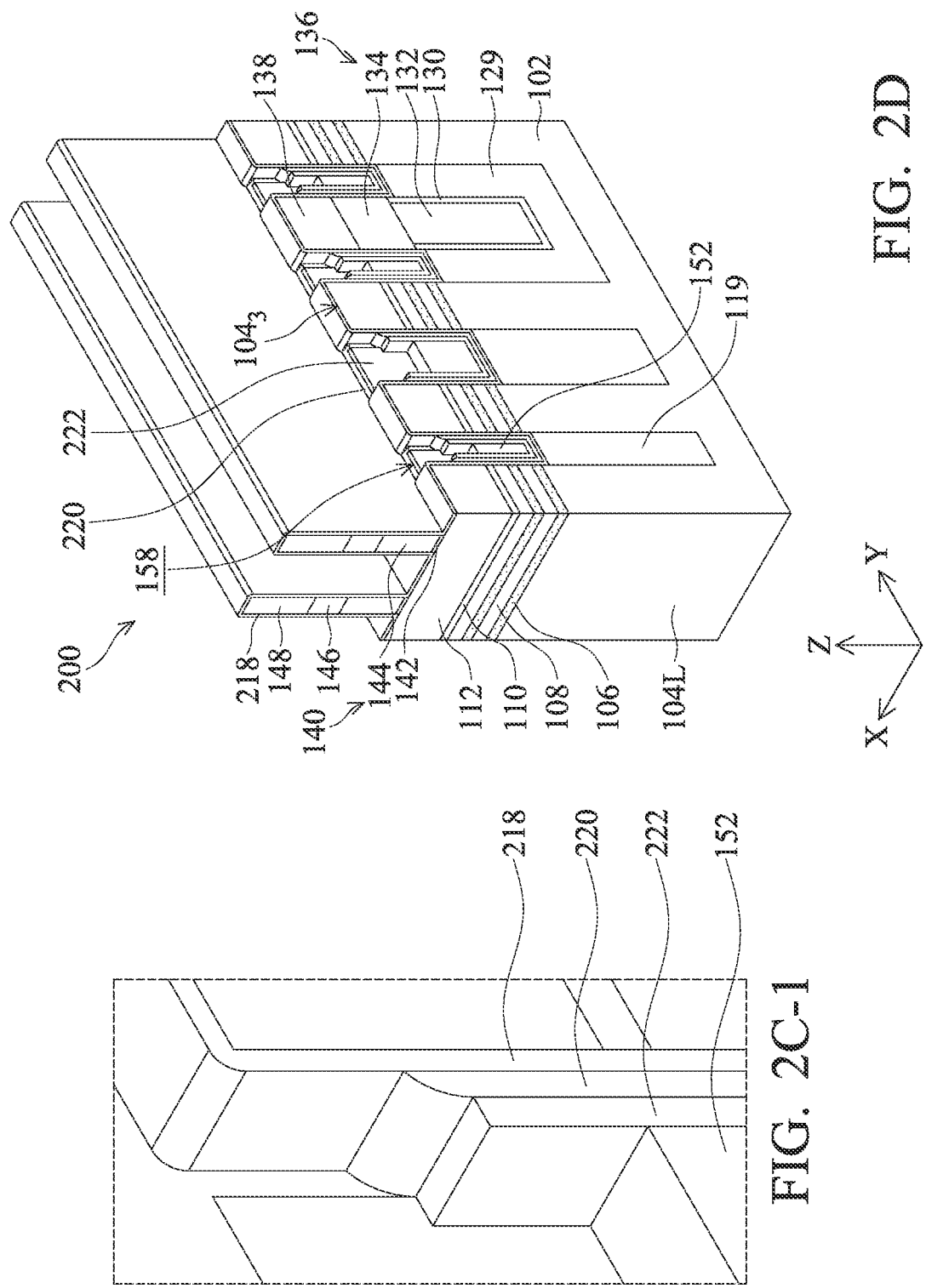

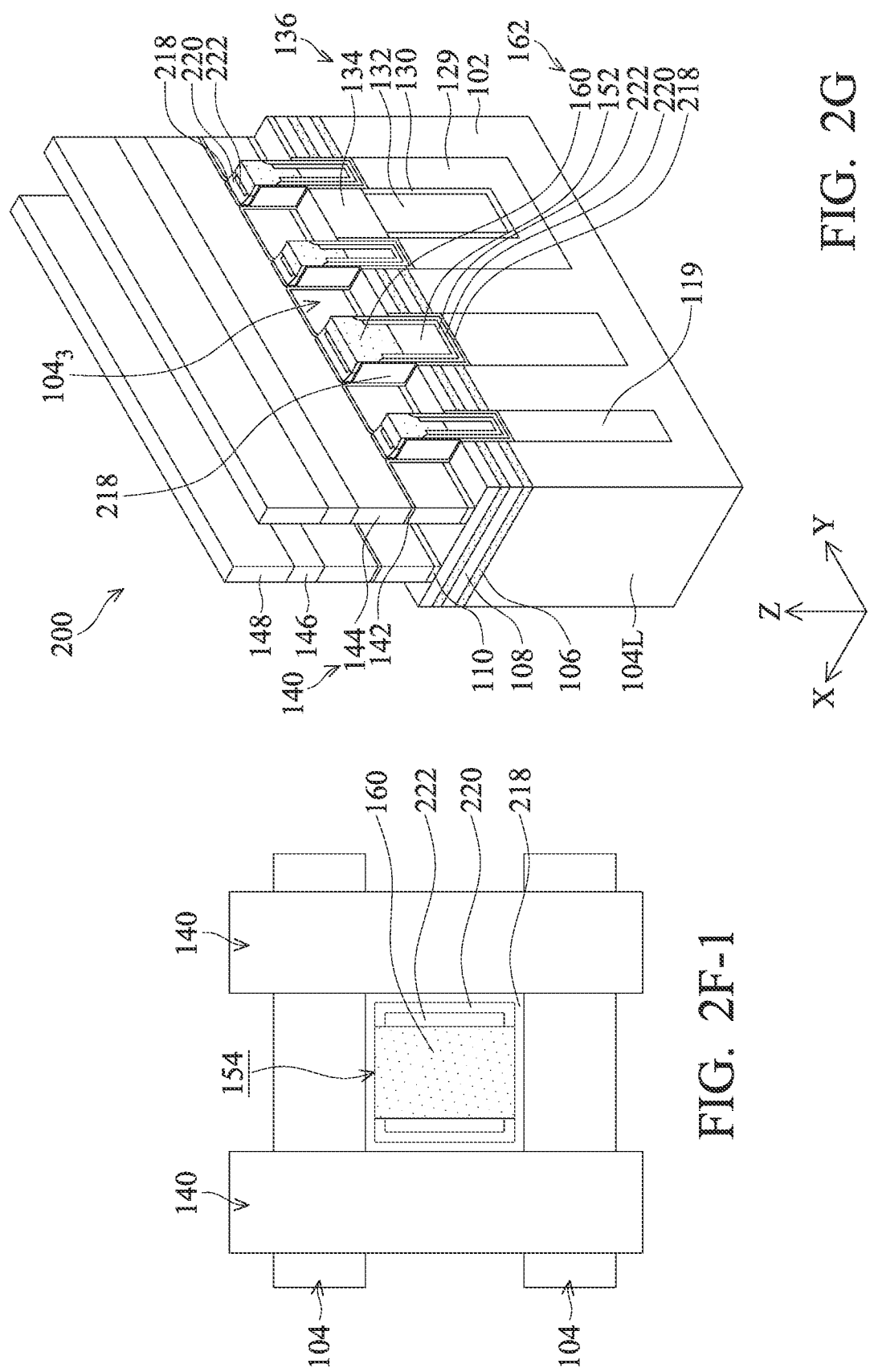

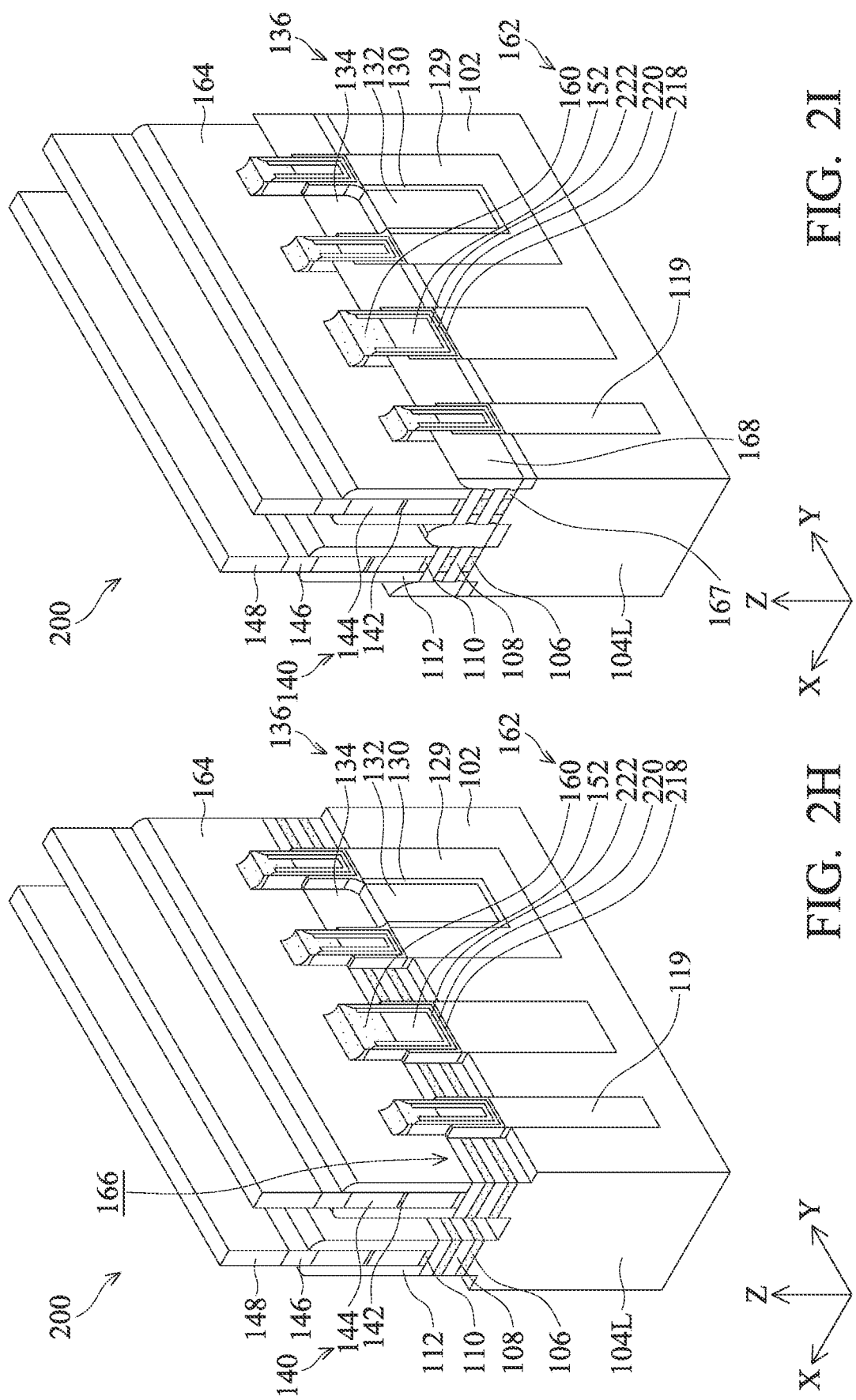

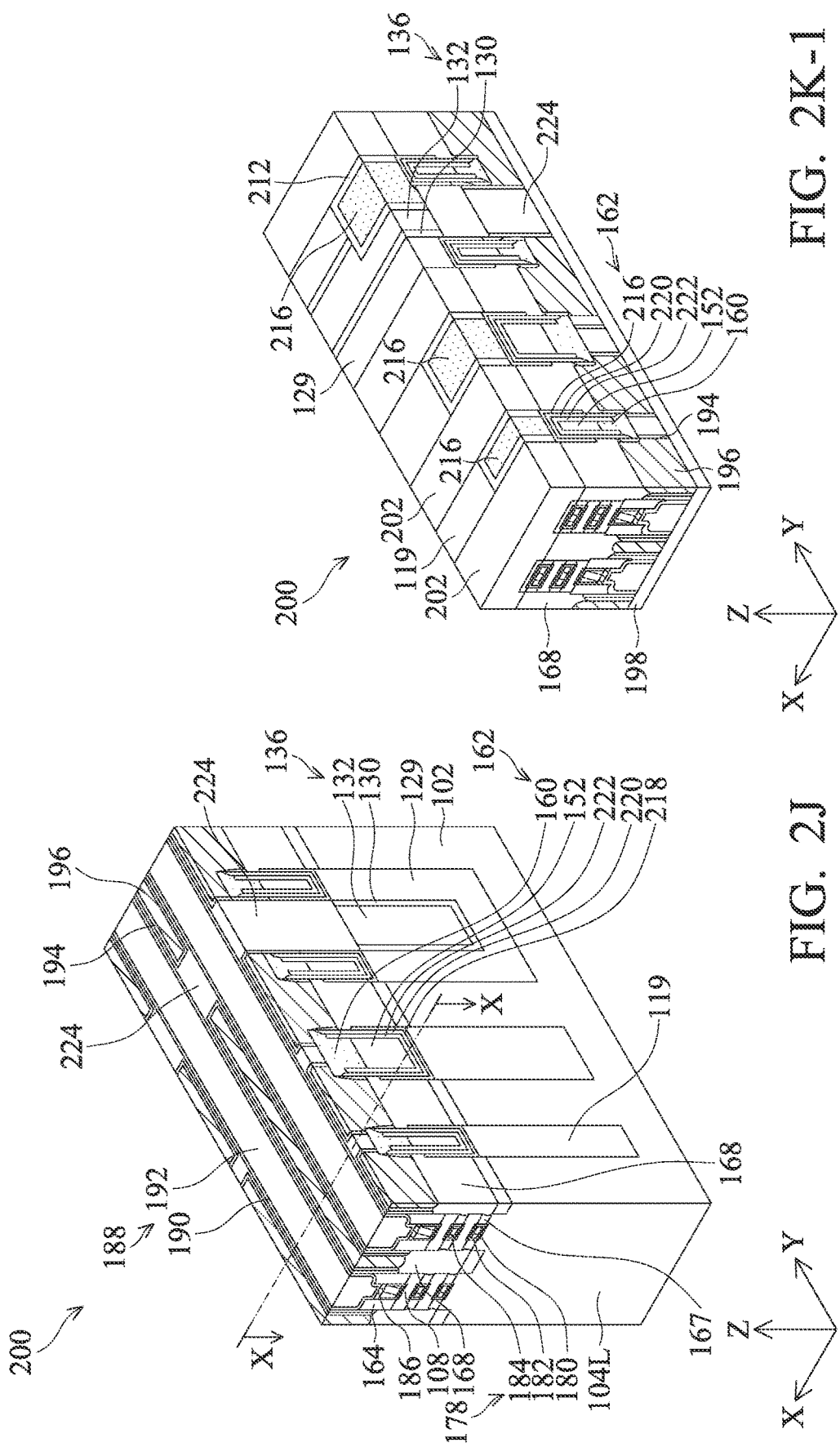

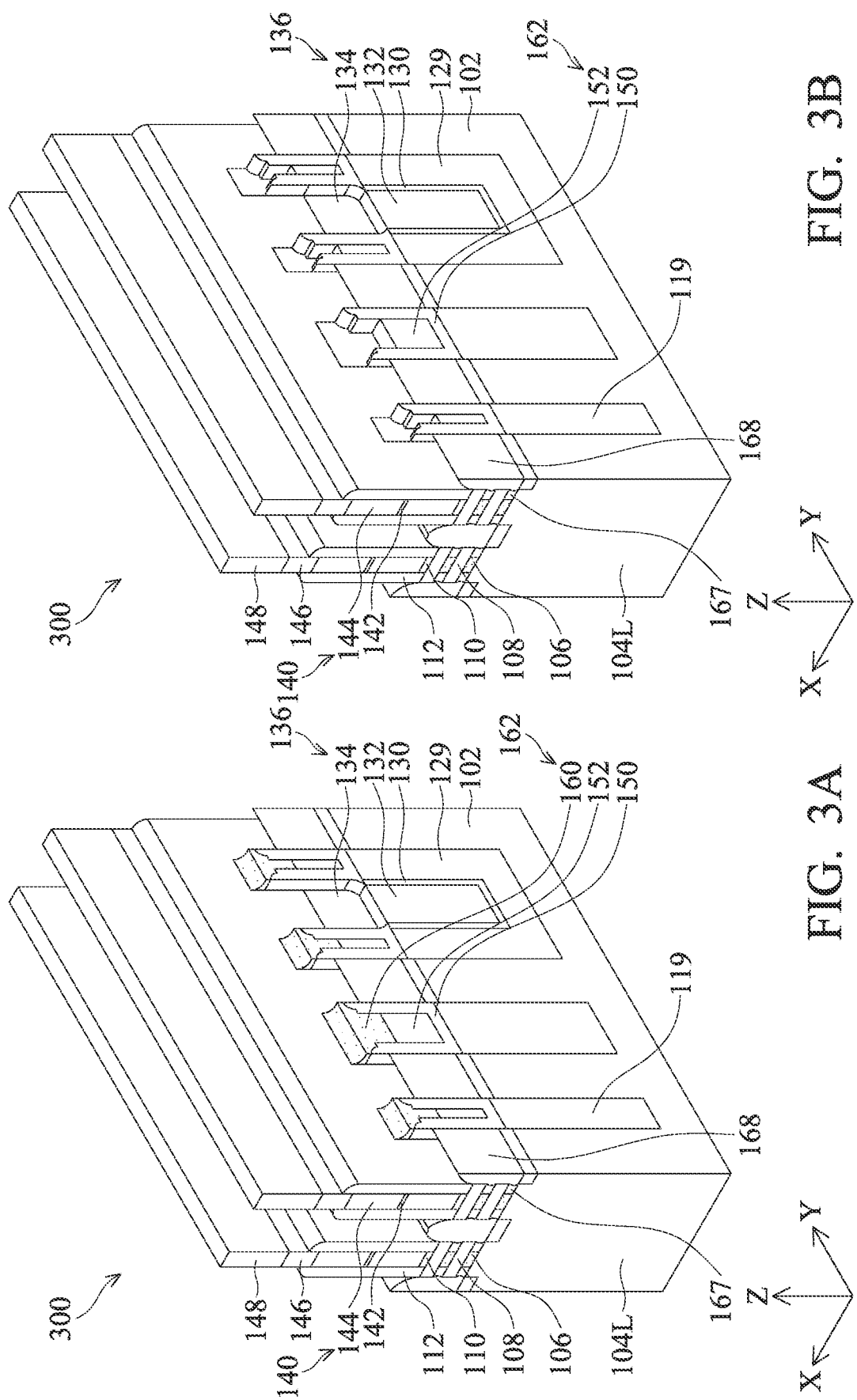

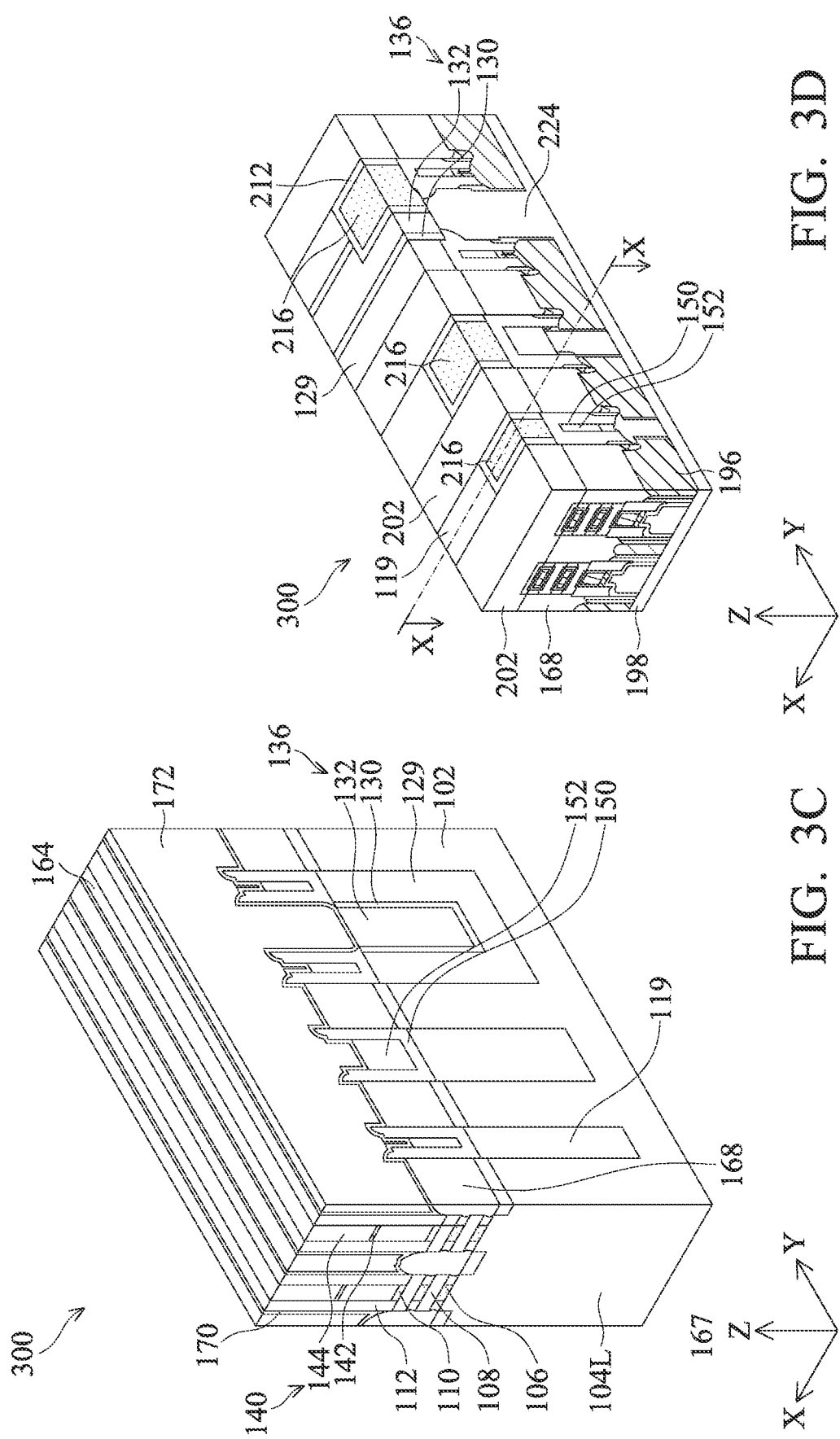

SEMICONDUCTOR STRUCTURE AND METHOD FOR FORMING THE SAME

PRIORITY CLAIM

This application claims the benefit of U.S. Provisional Application No. 63/226,295, filed on Jul. 28, 2021 and entitled "Semiconductor Memory Device with a Dielectric Fin Structure and Method for Forming the Same," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. GAA devices may provide a channel in a silicon nanowire.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A through 1X, 1Y-1 and 1Y-2, 1Z-1 and 1Z-2, 1AA-1 and 1AA-2 and 1AB-1 and 1AB-2 are perspective views illustrating the formation of a semiconductor structure at various intermediate stages, in accordance with some embodiments of the disclosure.

FIG. 1I-1 is a plan view of a semiconductor structure taken along plan A shown in FIG. 1I, in accordance with some embodiments of the disclosure.

FIG. 1O-1 is a plan view of a semiconductor structure taken along plan A shown in FIG. 1O, in accordance with some embodiments of the disclosure.

FIG. 1Q-1 is a plan view of a semiconductor structure taken along plan A shown in FIG. 1Q, in accordance with some embodiments of the disclosure.

FIG. 1Q-2 is a cross-sectional view of a semiconductor structure taken along cross-section X-X shown in FIG. 1Q, in accordance with some embodiments of the disclosure.

FIG. 1T-1 is a plan view of a semiconductor structure taken along plan A shown in FIG. 1T, in accordance with some embodiments of the disclosure.

FIG. 1X-1 is a cross-sectional view of a semiconductor structure taken along cross-section X-X shown in FIG. 1X, in accordance with some embodiments of the disclosure.

FIG. 1X-2 is an enlarged view of a source/drain spacer structure shown in FIG. 1X, in accordance with some embodiments of the disclosure.

FIGS. 1X-3, 1X-4 and 1X-5 are plan views of a semiconductor structure taken along plans A-A, B-B and C-C shown in FIG. 1X-2 respectively, in accordance with some embodiments of the disclosure.

FIG. 1Z-3 is a cross-sectional view of a semiconductor structure taken along cross-section X-X shown in FIG. 1Z-1, in accordance with some embodiments of the disclosure.

FIG. 1AA-3 is a cross-sectional view of a semiconductor structure taken along cross-section X-X shown in FIG. 1AA-1, in accordance with some embodiments of the disclosure.

FIG. 1AB-3 is a cross-sectional view of a semiconductor structure taken along cross-section X-X shown in FIG. 1AB-1, in accordance with some embodiments of the disclosure.

FIG. 1AB-4 is an enlarged view of a source/drain spacer structure shown in FIG. 1AB-1, in accordance with some embodiments of the disclosure.

FIGS. 1AB-5, 1AB-6 and 1AB-7 are plan views of a semiconductor structure taken along plans A-A, B-B and C-C shown in FIG. 1AB-4 respectively, in accordance with some embodiments of the disclosure.

FIGS. 2A through 2J and 2K-1 and 2K-2 are perspective views illustrating the formation of a semiconductor structure at various intermediate stages, in accordance with some embodiments of the disclosure.

FIG. 2A-1 is an enlarged view of area D shown in FIG. 2A, in accordance with some embodiments of the disclosure.

FIGS. 2B-1 and 2B-2 are enlarged views of areas D and E shown in FIG. 2B, in accordance with some embodiments of the disclosure.

FIG. 2B-3 is a plan view of a semiconductor structure taken along plan A shown in FIG. 2B, in accordance with some embodiments of the disclosure.

FIG. 2C-1 is an enlarged view of area F shown in FIG. 2C, in accordance with some embodiments of the disclosure.

FIG. 2F-1 is a plan view of a semiconductor structure taken along plan A shown in FIG. 2F, in accordance with some embodiments of the disclosure.

FIG. 2K-3 is a cross-sectional view of a semiconductor structure taken along cross-section X-X shown in FIG. 2K-1, in accordance with some embodiments of the disclosure.

FIG. 2K-4 is an enlarged view of a source/drain spacer structure shown in FIG. 2K-1, in accordance with some embodiments of the disclosure.

FIGS. 2K-5, 2K-6 and 2K-7 are plan views of a semiconductor structure taken along plans A-A, B-B and C-C shown in FIG. 2K-4 respectively, in accordance with some embodiments of the disclosure.

FIGS. 3A through 3D are perspective views illustrating the formation of a semiconductor structure at various intermediate stages, in accordance with some embodiments of the disclosure.

FIG. 3D-1 is an enlarged view of a source/drain spacer structure shown in FIG. 3D, in accordance with some embodiments of the disclosure.

FIG. 4 is a modification of a semiconductor structure shown in FIG. 1AB-1, in accordance with some embodiments of the disclosure.

FIG. 5 is a modification of a semiconductor structure shown in FIG. 1AB-1, in accordance with some embodiments of the disclosure.

DETAILED DESCRIPTION

Figure 1A:
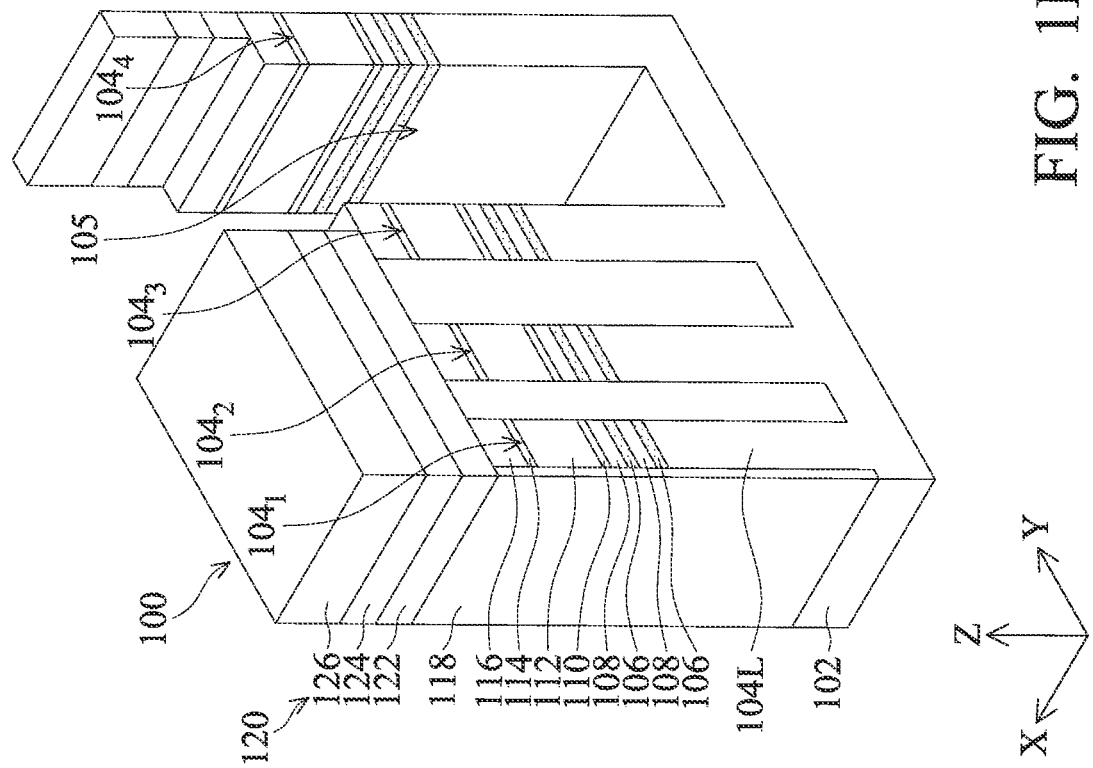

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Embodiments of a semiconductor structure are provided. The aspect of the present disclosure is directed to forming a semiconductor structure having source/drain spacer structures. The source/drain spacer structures may confine the lateral growth of source/drain features, and thus the source/drain features may be formed with column profiles and narrower widths. The source/drain spacer structures may be formed after dummy gate structures and may not extend directly below the dummy gate structures, which may enlarge the gap-fill window of forming a metal gate electrode. Therefore, the performance of the semiconductor device is enhanced.

In addition, the embodiments of the present disclosure also provide a method for forming gate isolation structures from the backside of a substrate. Gate-cut openings for the gate isolation structures may be formed using a self-alignment process. Therefore, the process limit of a photolithography process may be relaxed, and the overlay/CD shift issue may be of less concern. Therefore, the manufacturing yield of the semiconductor device may be increased.

FIGS. 1A through 1X, 1Y-1 and 1Y-2, 1Z-1 and 1Z-2, 1AA-1 and 1AA-2 and 1AB-1 and 1AB-2 are perspective views illustrating the formation of a semiconductor structure 100 at various intermediate stages, in accordance with some embodiments of the disclosure.

The semiconductor structure 100 includes a substrate 102 and fin structures 104 over the substrate 102, as shown in FIG. 1A, in accordance with some embodiments. The substrate 102 may be a portion of a semiconductor wafer, a semiconductor chip (or die), or the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

For a better understanding of the semiconductor structure 100, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structures 104 have longitudinal axes parallel to X direction, in accordance with some embodiments. The fin structures 104 include channel regions and source/drain regions, where the channel regions are defined between the source/drain regions, in accordance with some embodiments. In this disclosure, a source/drain refers to a source and/or a drain. It is noted that in the present disclosure, a source and a drain are interchangeably used and the structures thereof are substantially the same. X direction may also be referred to as the channel-extending direction. The current of the resulting semiconductor device (e.g., nanostructure transistor) flows in the X direction through the channel. Gate structures or gate stacks will be formed with longitudinal axes parallel to Y direction and extend across and/or surround the channel regions of the fin structures 104. Y direction may also be referred to as a gate-extending direction.

Furthermore, the plane Y-Z of the semiconductor structure 100 shown in FIGS. 1A through 1S, 1X, 1Y-1, 1Z-1, 1AA-1 and 1AB-1 illustrate the reference cross-sections of the semiconductor structure 100 that is cut along Y direction through the source/drain region of the fin structures 104. The plans Y-Z of the semiconductor structure 100 shown in FIGS. 1T through 1W, 1Y-2, 1Z-2, 1AA-2 and 1AB-2 illustrate the reference cross-sections of the semiconductor structure 100 that is cut along Y direction through the gate structure or gate stack (the channel region of the fin structures 104).

Each of the fin structures 104 includes a lower fin element 104L formed from a portion of the substrate 102, a middle fin element formed from an epitaxial stack including alternating first semiconductor layers 106 and second semiconductor layer 108, and an upper fin element including dummy layers 110 and 112, as shown in FIG. 1A, in accordance with some embodiments.

The formation of the fin structures 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range of about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0), and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate structure and gate stack will be formed across and wrap around the nanostructures, in accordance with some embodiments.

In some embodiments, the thickness of each of the first semiconductor layers 106 is in a range of about 3 nm to about 20 nm, such as about 4 nm to about 12 nm. In some embodiments, the thickness of each of the second semiconductor layers 108 is in a range of about 3 nm to about 20 nm, such as about 4 nm to about 12 nm. The thickness of the second semiconductor layers 108 may be greater than, equal to, or less than the first semiconductor layers 106, which may depend on the amount of gate materials to be filled in spaces where the first semiconductor layers 106 are removed. Although two first semiconductor layers 106 and two second semiconductor layers 108 are shown in FIG. 1A, the numbers are not limited to two, and can be 1, or more than 2. In some embodiments the numbers of the semiconductor layers are less than 8. By adjusting the number of the semiconductor layers, a driving current of the resulting nanostructure device can be adjusted.

Afterward, a dummy layer 110 is formed over the epitaxial stack, and a dummy layer 112 is formed over the dummy layer 110, in accordance with some embodiments. The dummy layers 110 and 112 serve as the upper fin element and are configured to adjust the height of subsequently formed source/drain spacer structures, in accordance with some embodiments.

In some embodiments, the dummy layer 110 is made of dielectric material, such as silicon oxide (SiO), silicon nitride (SiN), silicon oxynitride (SiON), and/or a combination thereof. In some embodiments, the dielectric material is formed using atomic layer deposition (ALD), chemical vapor deposition (CVD), thermal oxidation, another suitable technique, and/or a combination thereof. In some embodiments, the dummy layer 112 is made of semiconductor material such as polysilicon, poly-silicon germanium. In some embodiments, the semiconductor material is formed using CVD, another suitable technique, and/or a combination thereof.

The dummy layers 112 and 110, the epitaxial stack (including the first semiconductor layers 106 and the second semiconductor layers 108) and the underlying substrate 102 are then patterned into the fin structures 104, in accordance with some embodiments. In some embodiments, the patterning process includes forming patterned hard mask layers 114 and 116 over the dummy layer 112. In some embodiments, the patterned hard mask layer 114 is made of oxide (such as silicon oxide) and the patterned hard mask layer 116 is made of nitride (such as silicon nitride). The patterning process further includes performing an etching process to remove portions of the dummy layers 110 and 112, the epitaxial stack and the substrate 102 uncovered by the patterned hard mask layers 114 and 116, thereby forming trenches and the fin structures 104 protruding from between the trenches, in accordance with some embodiments. The etching process may be an anisotropic etching process, e.g., dry plasma etching.

The portion of the substrate 102 protruding from between the trenches forms lower fin elements 104L of the fin structures 104, in accordance with some embodiments. The remainder of the epitaxial stack (including the first semiconductor layers 106 and the second semiconductor layers 108) forms the middle fin elements of the fin structures 104 over the lower fin elements 104L, in accordance with some embodiments. The remainder of the dummy layers 110 and 112 forms the upper fin elements of the fin structures 104 over the middle fin elements, in accordance with some embodiments. In some embodiments, the fin structures 104 may also be referred to as semiconductor fin structures and are configured as active regions (also referred to as oxide definition (OD)) of the semiconductor structure 100.

FIG. 1A illustrates four fin structures including $104_1$, $104_2$, $104_3$ and $104_4$. However, more than four fin structures 104 may be formed over a single device region and/or multiple device regions of the semiconductor structure 100. The trenches between the fin structures 104 may have different widths. For example, the trench between the fin structures $104_2$ and $104_3$ has a width W1 in the Y direction, and the trench between the fin structures $104_3$ and $104_4$ has a width W2 in the Y direction. In some embodiments, the widths W1 and W2 are in a range of about 14 nm to about 90 nm. In some embodiments, the width W2 is greater than the width W1. For example, the ratio of width W2 to width W1 may be in a range of about 1.2 to about 4.

The fin structures 104 may be patterned by any suitable method. For example, the fin structures 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 104.

Figure 1B:
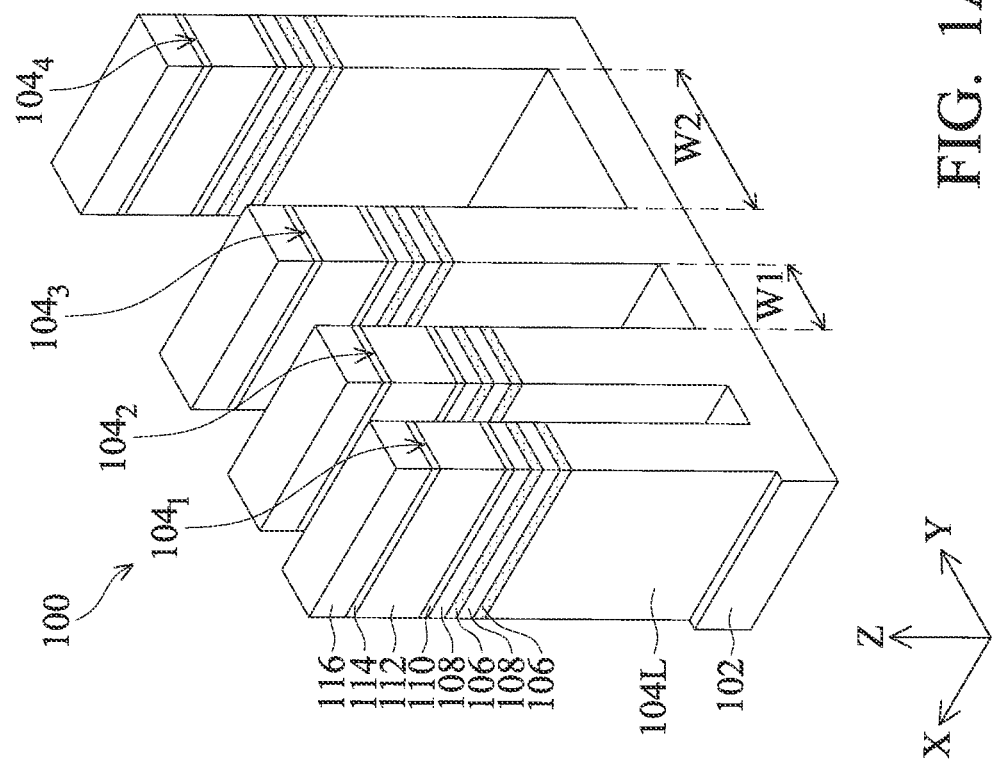

An insulating material 118 is formed over the semiconductor structure 100, and an etching process is then performed to remove the insulating material 118 in the trench between the fin structures $104_3$ and $104_4$, as shown in FIG. 1B, in accordance with some embodiments.

The insulating material 118 is deposited to overfill the trenches between the fin structures $104_1$ and $104_2$ and between the fin structures $104_2$ and $104_3$ and to partially fill the trench between the fin structures $104_3$ and $104_4$, in accordance with some embodiments. In some embodiments, the insulating material 118 is silicon oxide (SiO), silicon nitride (SiN), silicon oxynitride (SiON), another suitable insulating material, multilayers thereof, and/or a combination thereof. In some embodiments, the insulating material 118 is deposited using includes CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, and/or a combination thereof. In some embodiments, the insulating material 118 may be bi-layered, for example, a lining layer and a bulk layer over the lining layer. The lining layer may repair damage during the etching process that forms the fin structures. The bulk layer may have a good gap-fill ability to fill the trenches without forming voids or seams therein.

A planarization process is then performed on the insulating material 118 to remove a portion of the insulating material 118 above the patterned hard mask layer 116 until the patterned hard mask layer 116 is exposed, in accordance with some embodiments. The planarization may be chemical mechanical polishing (CMP), etching back process, or a combination thereof.

Afterward, a tri-layer mask structure 120 is formed over the semiconductor structure 100, in accordance with some embodiments. The tri-layer mask structure 120 covers the fin structures $104_{1-4}$ and exposes the portion (not shown) of the insulating material 118 formed in the trench between the fin structures $104_3$ and $104_4$, in accordance with some embodiments. The tri-layer mask structure 120 includes a bottom layer 122, a middle layer 124 and a top photoresist mask 126, in accordance with some embodiments. In some embodiments, the bottom layer 122 is made of dielectric material, and the middle layer 124 is made of bottom anti-reflective coating (BARC) material such as an inorganic material or an organic material (e.g., polymer, oligomer, or monomer). The photoresist mask 126 may be formed by a photolithography process, in accordance with some embodiments.

The etching process is performed using the tri-layer mask structure 120 to remove the insulating material 118 between the fin structures $104_3$ and $104_4$, in accordance with some embodiments. The etching process may be dry plasma etching and/or wet chemical etching. The trench between the fin structures $104_3$ and $104_4$ are reopened and denoted as a trench 105, in accordance with some embodiments.

Figure 1C:
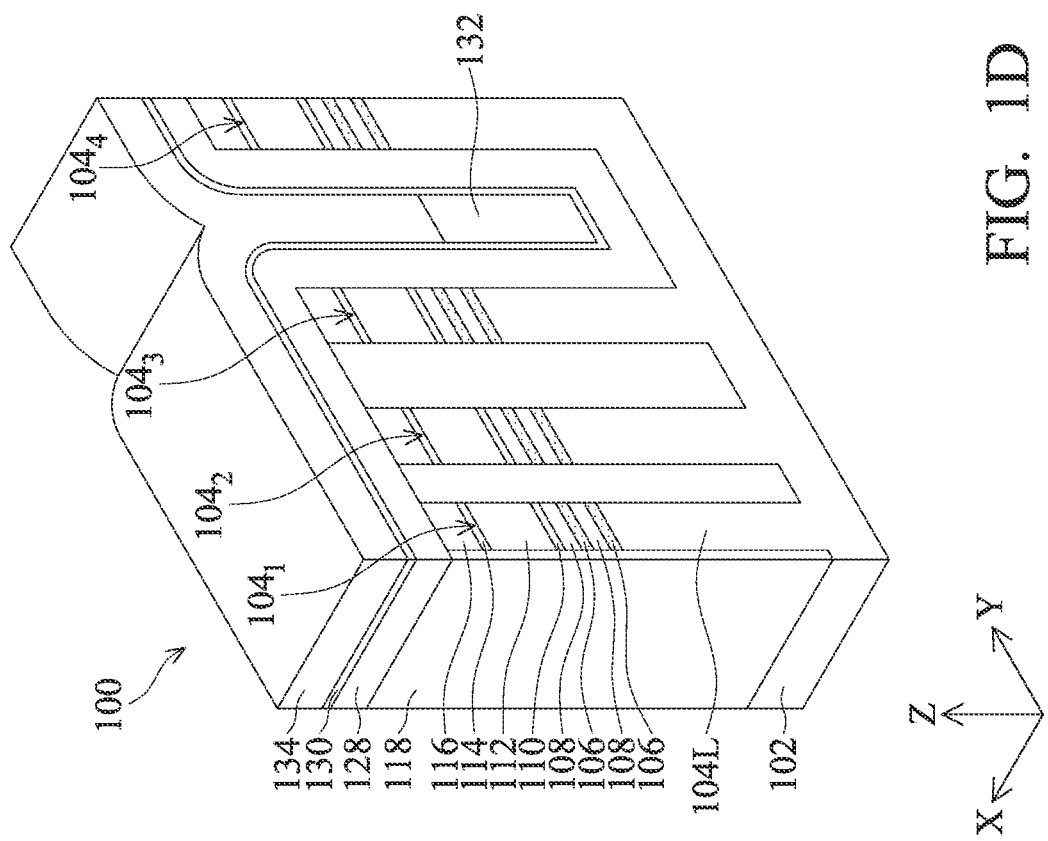

After the etching process, the tri-layer mask structure 120 is removed using one or more etching processes and/or an ashing process, in accordance with some embodiments. An insulating material 128 is formed over the semiconductor structure 100, as shown in FIG. 1C, in accordance with some embodiments. The insulating material 128 conformally extends along the sidewalls and the bottom surface of the trench 105 and partially fills the trench 105, in accordance with some embodiments.

In some embodiments, the insulating material 128 is made of silicon oxide (SiO), silicon nitride (SiN), silicon oxynitride (SiON), another suitable insulating material, multilayers thereof, and/or a combination thereof. In some embodiments, the insulating material 128 is deposited using includes ALD, CVD (such as LPCVD, PECVD, HDP-CVD, HARP, or FCVD), another suitable technique, and/or a combination thereof.

Afterward, a lining layer 130 is formed over the insulating material 128, as shown in FIG. 1C, in accordance with some embodiments. The lining layer 130 partially fills the trench 105, in accordance with some embodiments. In some embodiments, the lining layer 130 is made of dielectric material with a dielectric constant less than about 7. In some embodiments, the lining layer 130 is made of dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide (SiO$_2$), or a combination thereof.

In some embodiments, the lining layer 130 is made of a different material than the insulating materials 118 and 128 and has a different etching selectivity than the insulating materials 118 and 128. In some embodiments, lining layer 130 is made of a nitrogen-containing dielectric (such as silicon nitride or silicon oxynitride) and the insulating materials 118 and 128 are made of an oxide (such as silicon oxide). In some embodiments, the lining layer 130 is deposited using ALD, CVD (such as LPCVD, PECVD, HDP-CVD, or HARP), another suitable technique, and/or a combination thereof.

Afterward, a fill layer 132 is formed over the lining layer 130 to fill a lower portion of the trench 105, as shown in FIG. 1C, in accordance with some embodiments. In some embodiments, the fill layer 132 is made of dielectric material having a dielectric constant less than about 7. In some embodiments, the dielectric material is made of dielectric material such as silicon oxide (SiO$_2$), silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), or a combination thereof.

In some embodiments, the fill layer 132 and the lining layer 130 are made of different materials and have a difference in etching selectivity. For example, the fill layer 132 has a lower dielectric constant than the lining layer 130. In some embodiments, the fill layer 132 is made of an oxide (such as silicon oxide) and the lining layer 130 is made of a nitrogen-containing dielectric (such as silicon nitride or silicon oxynitride). In some embodiments, the dielectric material is deposited to overfill the remainder of the trench 105. In some embodiments, the deposition process may be CVD (such as FCVD, LPCVD, PECVD, HDP-CVD or HARP), ALD, another suitable technique, and/or a combination thereof.

The dielectric material for the fill layer 132 is etched thereby exposing the lining layer 130. An upper portion of the dielectric material in the trench 105 are further etched away, in accordance with some embodiments. The etching back process may be dry plasma etching and/or wet chemical etching. In some embodiments, the upper surface of the etched fill layer 132 is located at a level substantially equal to or lower than the bottom surface of the lowermost first semiconductor layer 106.

Figure 1D:
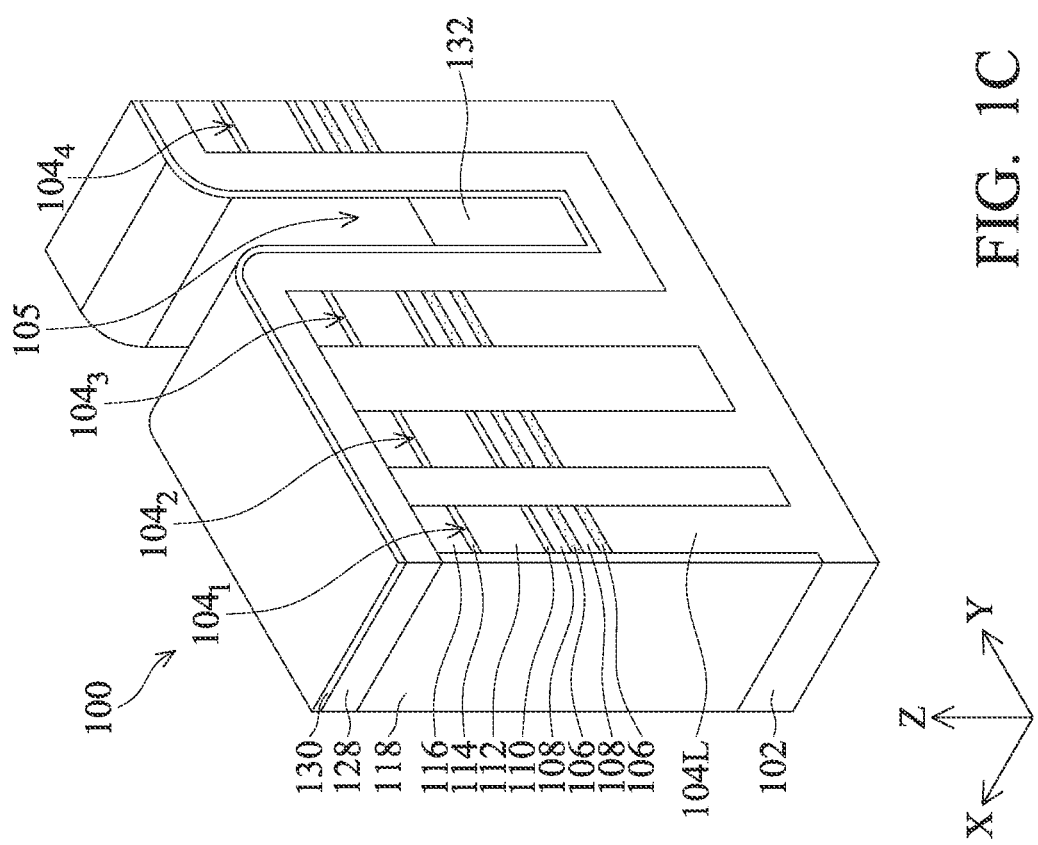

A protection layer 134 is formed over the semiconductor structure 100 to overfill the upper portion of the trench 105, as shown in FIG. 1D, in accordance with some embodiments. In some embodiments, the protection layer 134 is made of dielectric material with a dielectric constant less than about 7. In some embodiments, the protection layer 134 is made of dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide (SiO$_2$), or a combination thereof. In some embodiments, the protection layer 134 and the fill layer 132 are made of different materials and have a great difference in etching selectivity. For example, the fill layer 132 has a lower dielectric constant than the protection layer 134. In some embodiments, the fill layer 132 is made of an oxide (such as silicon oxide) and the protection layer 134 is made of a nitrogen-containing dielectric (such as silicon nitride or silicon oxynitride). In some embodiments, the protection layer 134 is deposited using ALD, CVD (such as LPCVD, PECVD, HDP-CVD, HARP, or FCVD), another suitable technique, and/or a combination thereof.

Figure 1F:
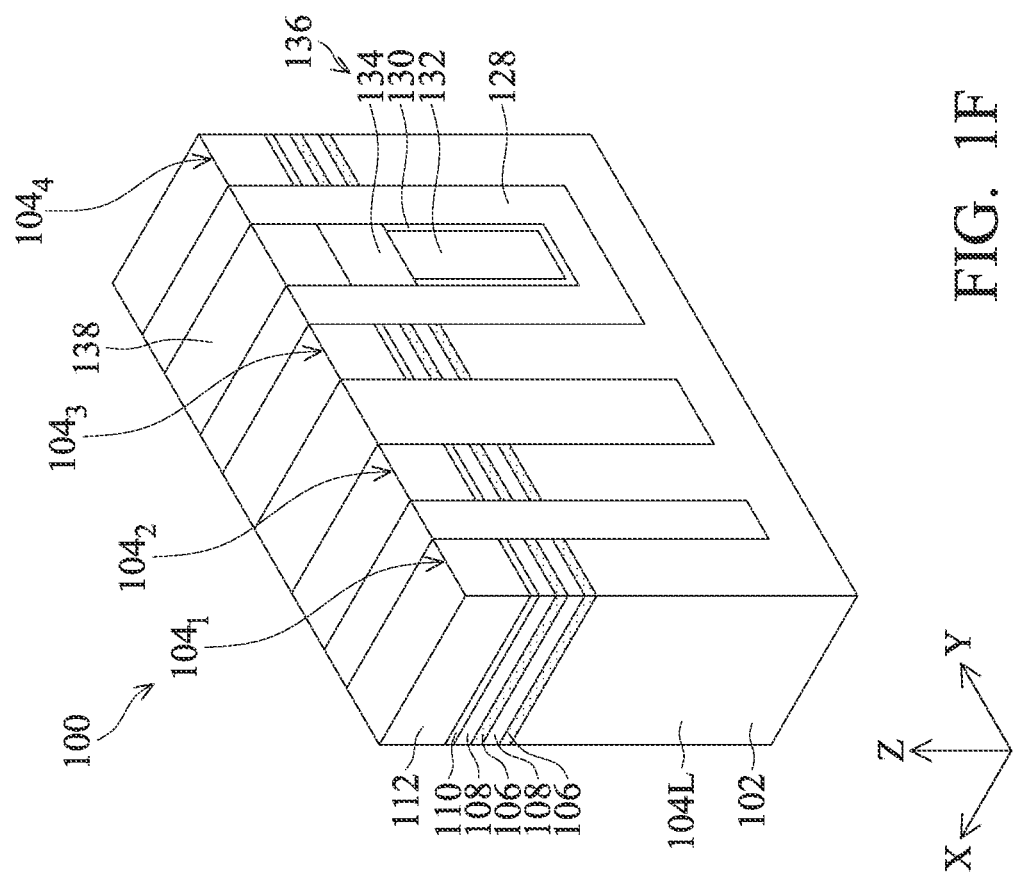
Figure 1E:
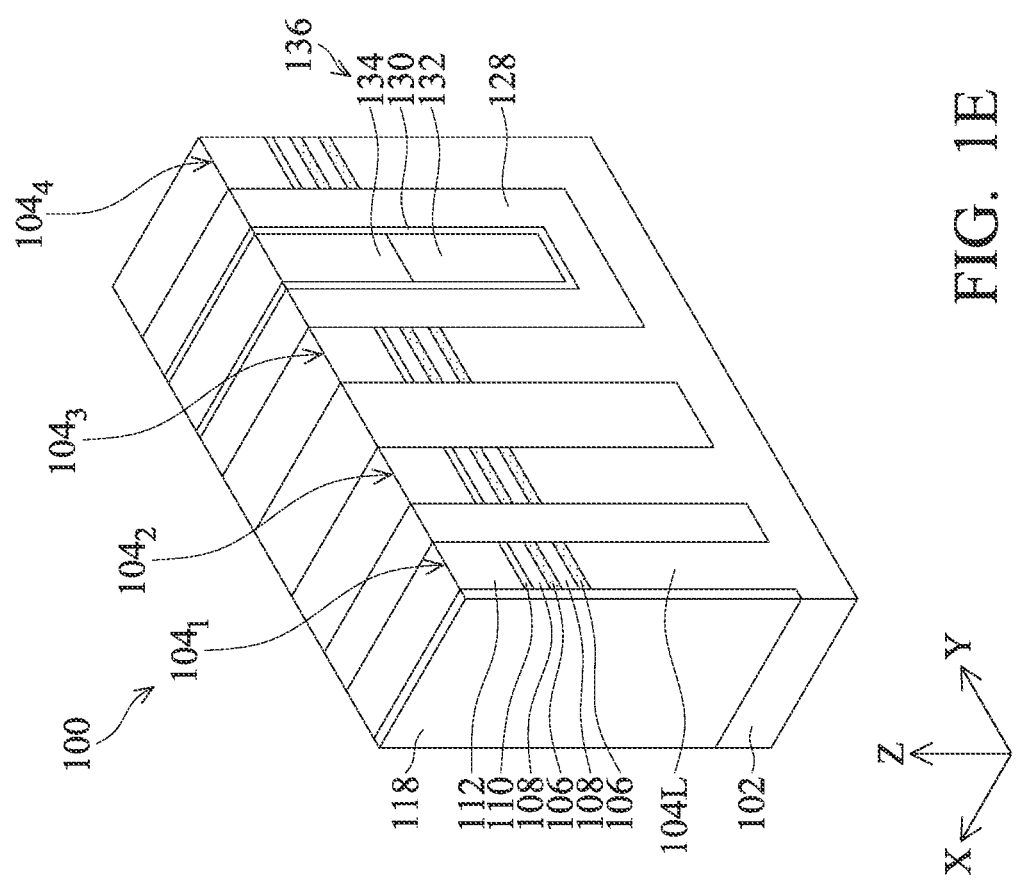

A planarization process is performed on the semiconductor structure 100 to remove portions of the protection layer 134, the lining layer 130 and the insulating material 128 until the upper surfaces of the dummy layers 112 of the fin structures 104 are exposed, as shown in FIG. 1E, in accordance with some embodiments. In some embodiments, the patterned hard mask layers 114 and 116 are also removed. In some embodiments, the planarization process is CMP, etching back process, or a combination thereof. The remainders of the protection layer 134, the fill layer 132 and the lining layer 130 in the trench 105 combine to form a dielectric fin structure 136, in accordance with some embodiments.

In some embodiments, the dielectric fin structure 136 is located between the fin structure $104_3$ and the fin structure $104_4$. In some embodiments, the dielectric fin structure 136 extends in the X direction. That is, the dielectric fin structure 136 has a longitudinal axis parallel to X direction and substantially parallel to the fin structures 104, in accordance with some embodiments. In some embodiments, the dielectric fin structure 136 may be referred to as a hybrid fin structure.

The protection layer 134 of the dielectric fin structure 136 is etched to form a recess, and a dummy layer 138 is then formed in the recess over the protection layer 134 of the dielectric fin structure 136, as shown in FIG. 1F, in accordance with some embodiments. In some embodiments, the etching process may be dry plasma etching and/or wet chemical etching. In some embodiments, the upper surface of the recessed protection layer 134 is located at a level substantially equal to the upper surface of the dummy layer 110.

If the thickness of the recessed protection layer 134 is too thick, the final gate stack may be cut off by the protection layer 134. If the thickness of the recessed protection layer 134 is too thin, the protection layer 134 may not sufficiently protect the lining layer 130 and the fill layer 132 from being recessed during the etching process for forming source/drain recesses as will be discussed in detail later.

In some embodiments, the dummy layer 138 is made of semiconductor material such as polysilicon, poly-silicon germanium. In some embodiments, the dummy layers 112 and 138 are made of the same semiconductor material (such as Si). In some embodiments, the semiconductor material is formed using CVD, another suitable technique, and/or a combination thereof. In some embodiments, the semiconductor material for the dummy layer 138 is deposited over the semiconductor structure 100 to overfill the recess, and then a planarization process is performed on the semiconductor material until the upper surfaces of the insulating materials 118 and 128 are exposed. In some embodiments, the planarization process is CMP, etching back process, or a combination thereof.

Figures 1G, 1H:
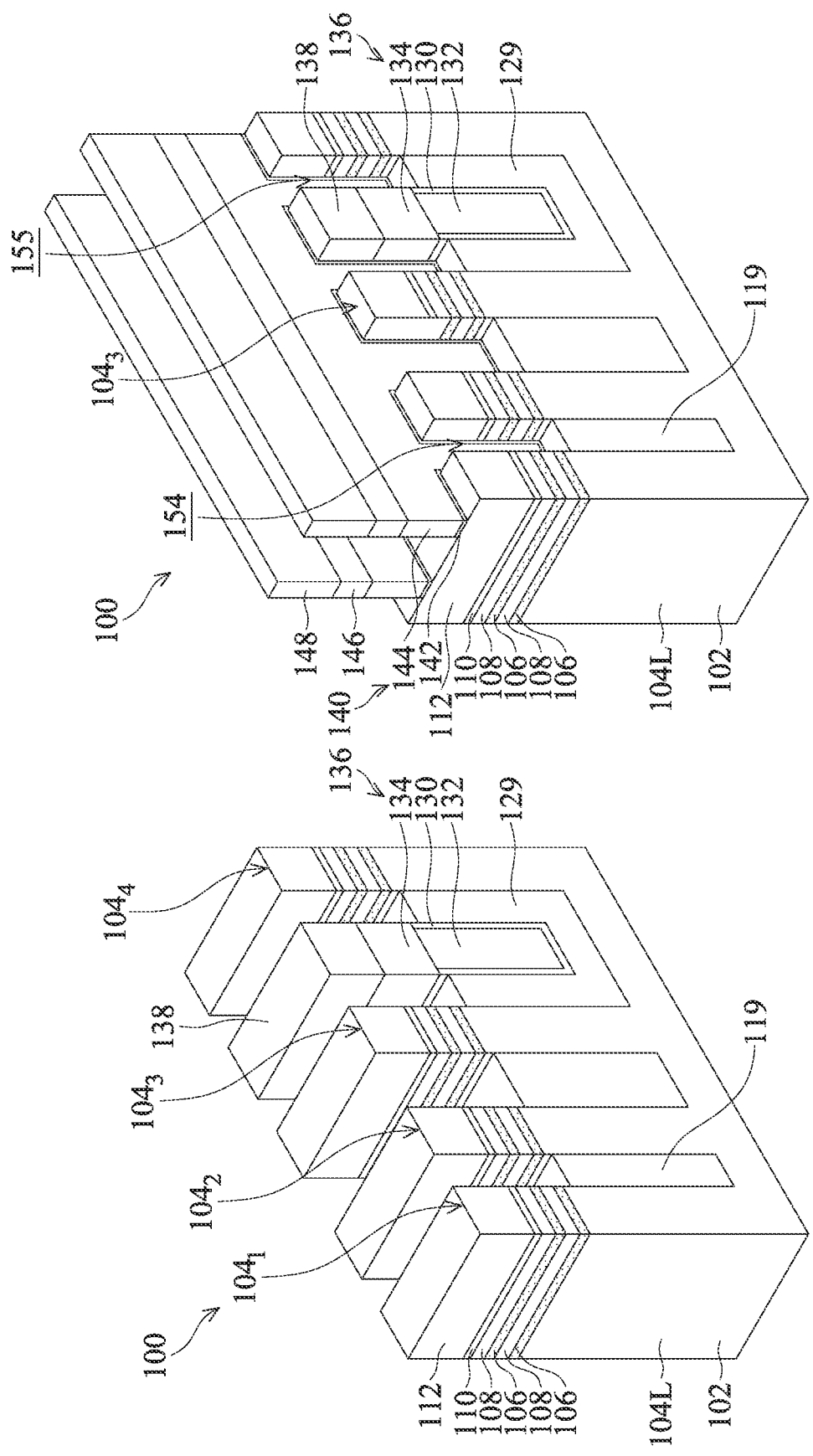

The insulating material 118 and the insulating material 128 are recessed using an etch process (such as dry plasma etching and/or wet chemical etching) to form gaps between the fin structures $104_1$ and $104_2$, between the fin structures $104_2$ and $104_3$, between the fin structures $104_3$ and the dielectric fin structure 136 and between the dielectric fin structure 136 and the fin structure $104_4$, as shown in FIG. 1G, in accordance with some embodiments. The gaps expose the upper fin elements, the middle fin elements, the dummy layer 138 and the protection layer 134, in accordance with some embodiments.

The remainder of the insulating material 118 forms an insulating layer 119, and the remainder of the insulating material 128 forms an insulating layer 129, as shown in FIG. 1G, in accordance with some embodiments of the disclosure. The insulating layers 119 and 129 are configured to electrically isolate active regions (e.g., the fin structure 104) of the semiconductor structure 100 and is also referred to as shallow trench isolation (STI) feature, in accordance with some embodiments. In some embodiments, the insulating layer 129 includes vertical portions separating the fin structure $104_3$ and $104_4$ from the dielectric fin structure 136 and a horizontal portion extending below the dielectric fin structure 136.

Dummy gate structures 140 are formed over the semiconductor structure 100, as shown in FIG. 1H, in accordance with some embodiments. The dummy gate structures 140 extend across and surround the channel regions of the fin structures 104 to define the channel regions and the source/drain regions, in accordance with some embodiments. The dummy gate structures 140 also extend across and surround the dielectric fin structure 136, in accordance with some embodiments. The dummy gate structures 140 are configured as sacrificial structures and will be replaced with active gate stacks, in accordance with some embodiments.

In some embodiments, the dummy gate structures 140 extend in the Y direction. That is, the dummy gate structures 140 have longitudinal axes parallel to Y direction, in accordance with some embodiments. FIG. 1H shows two dummy gate structures 140 for illustrative purpose and is not intended to be limiting. The number of the dummy gate structures 140 may be dependent on the semiconductor device design demand and/or performance consideration.

Each of the dummy gate structures 140 includes a dummy gate dielectric layer 142 and a dummy gate electrode layer 144 formed over the dummy gate dielectric layer 142, as shown in FIG. 1H, in accordance with some embodiments. In some embodiments, the dummy gate dielectric layer 142 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy layer 110 and the dummy gate dielectric layer 142 may be made of the same material, for example, silicon oxide.

In some embodiments, the dummy gate electrode layer 144 is made of semiconductor material such as polysilicon and/or poly-silicon germanium. In some embodiments, the dummy gate electrode layer 144 is made of a conductive material such as metallic nitrides, metallic silicides, metals, and/or a combination thereof. In some embodiments, the material for the dummy gate electrode layer 144 is formed using CVD, another suitable technique, and/or a combination thereof. In some embodiments, the dummy layer 112, the dummy layer 138 and the dummy gate electrode layer 144 may be made of the same material, for example, polysilicon.

In some embodiments, the formation of the dummy gate structures 140 includes globally and conformally depositing a dielectric material for the dummy gate dielectric layer 142 over the semiconductor structure 100, depositing a material for the dummy gate electrode layer 144 over the dielectric material, planarizing the material for the dummy gate electrode layer 144, and patterning the dielectric material and the material for the dummy gate electrode layer 144 into the dummy gate structures 140.

The patterning process includes forming patterned hard mask layers 146 and 148 over the material for the dummy gate electrode layer 144 over the channel regions of the fin structures 104, in accordance with some embodiments. In some embodiments, the patterned hard mask layer 146 is made of nitride (such as silicon nitride), and the patterned hard mask layer 148 is made of oxide (such as silicon oxide). The material for the dummy gate electrode layer 144 and dielectric material, uncovered by the patterned hard mask layers 146 and 148, are etched away until the source/drain regions of the fin structures 104 are exposed, in accordance with some embodiments.

Adjacent two fin structures (such as $104_1$ and $104_2$) and adjacent two dummy gate structures 140 collectively define a space 154, and the dielectric fin structure 136, adjacent fin structures 104 (such as $104_4$) and adjacent two dummy gate structures 140 collectively define a space 155, as shown in FIG. 1H, in accordance with some embodiments.

Figures 1, 1I:
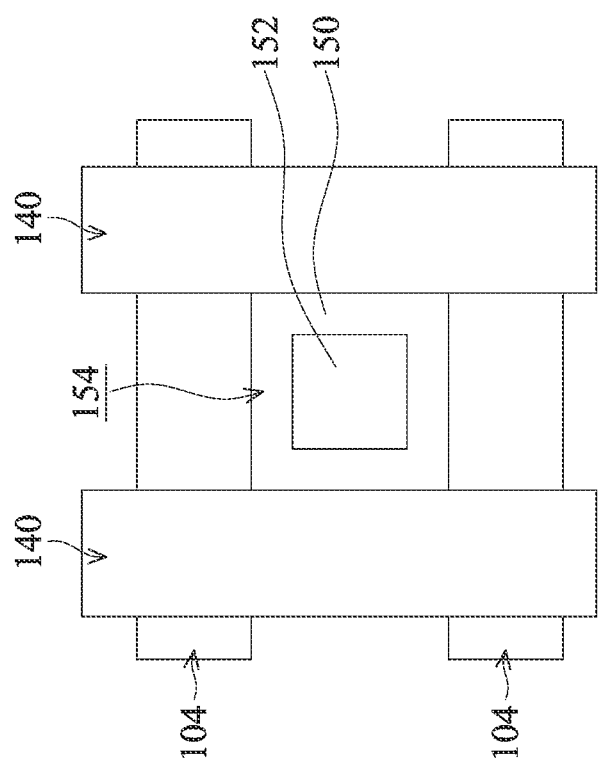
Figure 1I:
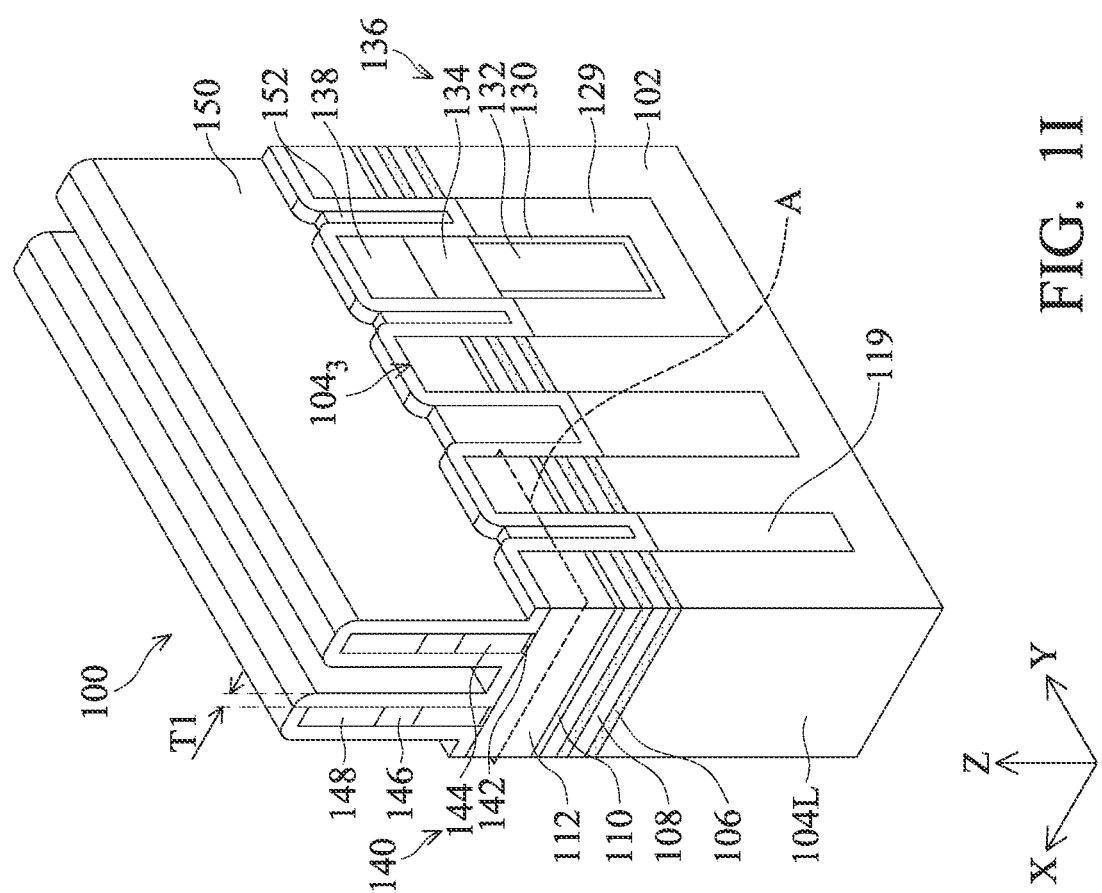

A lining layer 150 is formed over the semiconductor structure 100, as shown in FIGS. 1I and 1I-1, in accordance with some embodiments. FIG. 1I-1 is a plan view of the semiconductor structure 100 taken along plan A shown in FIG. 1I, in accordance with some embodiments of the disclosure. The lining layer 150 is conformally formed along the sidewalls of the fin structures 104, the sidewalls of the dielectric fin structure 136 and the sidewalls of the dummy gate structures 140, in accordance with some embodiments. The lining layer 150 partially fills the spaces 154 and 155, in accordance with some embodiments.

In some embodiments, the lining layer 150 is made of dielectric material with a dielectric constant less than about 7. In some embodiments, the lining layer 150 is made of dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide ($SiO_2$), or a combination thereof. In some embodiments, the lining layer 150 is deposited using ALD, CVD (such as LPCVD, PECVD, HDP-CVD, or HARP), another suitable technique, and/or a combination thereof.

Afterward, a fill layer 152 is formed over the lining layer 150 to fill the remainders of the spaces 154 and 155, as shown in FIGS. 1I and 1I-1, in accordance with some embodiments. In some embodiments, the fill layer 152 is made of dielectric material having a dielectric constant less than about 7. In some embodiments, the dielectric material is made of dielectric material such as silicon oxide ($SiO_2$), silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), or a combination thereof. In some embodiments, the fill layer 152 and the lining layer 150 are made of different materials and have a difference in etching selectivity. For example, the fill layer 152 has a lower dielectric constant than the lining layer 150. In some embodiments, the fill layer 152 is made of an oxide (such as silicon oxide) and the lining layer 150 is made of a nitrogen-containing dielectric (such as silicon nitride or silicon oxynitride). In some embodiments, the thickness of the fill layer 152 in Z direction is in a range from 20 nm about 40 nm. In some embodiments, the width of the fill layer 152 in the Y direction is in a range from 5 nm about 70 nm.

In some embodiments, the dielectric material for the fill layer 152 is deposited over the lining layer 150 to overfill the spaces 154 and 155 and further overfill the spaces between the dummy gate structures 140. The deposition process may be CVD (such as FCVD, LPCVD, PECVD, HDP-CVD or HARP), ALD, another suitable technique, and/or a combination thereof. A planarization process (such as CMP) is performed on the dielectric material for the fill layer 152 to remove a portion of the dielectric material over the top surface of the lining layer 150 over the patterned hard mask layer 148, and an etching back process is then performed to remove portions of the dielectric material outside the spaces 154 and 155, in accordance with some embodiments. In some embodiments, the etching back process may be dry plasma etching and/or wet chemical etching.

Figures 1J, 1K:
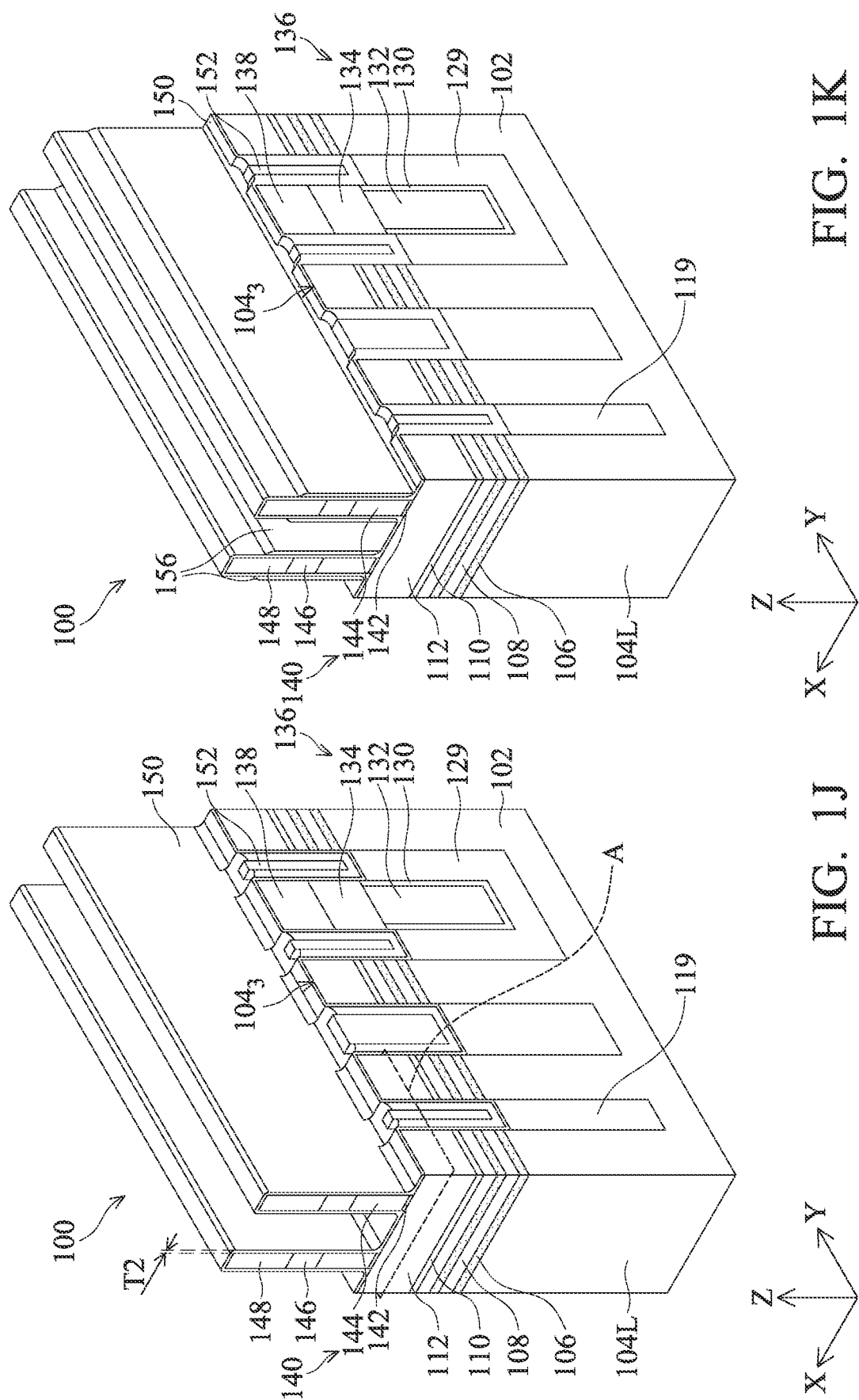

A trimming process is performed on the lining layer 150 to thin down portions of the lining layer 150 outside the spaces 154 and 155, as shown FIG. 1J, in accordance with some embodiments. In some embodiments, the trimming process expands the remaining space between the dummy gate structures 140. In some embodiments, the trimming process includes an isotropic etching process, such as wet etching or dry chemical etching.

For example, the portion of the as-deposited lining layer 150 formed along the dummy gate structure 140 has a thickness of T1 (shown in FIG. 1I) in a range of about 2 to about 15 nm. The portion of the as-trimmed lining layer 150 formed along the dummy gate structure 140 has a thickness of T2 (shown in FIG. 1J) in a range of about 1 to about 14 nm. The trimming amount (e.g., T1 minus T2) may be about 1 nm to about 10 nm, such as about 1 nm to about 2 nm. The ratio of thickness T2 to thickness T1 may be in a range of about 0.1 to about 0.5.

In some embodiments, due to the great difference in etching selectivity between the lining layer 150 and the fill layer 152, the fill layer 152 remains substantially unetched. In addition, the portion of the lining layer 150 formed within the spaces 154 and 155 are covered by the fill layer 152 and also remains substantially unetched, in accordance with some embodiments.

Dummy spacer layers 156 are formed on opposite sides of the dummy gate structures 140, as shown in FIG. 1K, in accordance with some embodiments. The dummy spacer layers 156 are formed in remaining spaces between the dummy gate structures 140, in accordance with some embodiments. The dummy spacer layers 156 cover (overlap) the portions of the lining layer 150 immediately adjacent to the sidewalls of the dummy gate structures 140 within the spaces 154 and 155, thereby protecting the lining layer 150 during a following recessing process, in accordance with some embodiments.

In some embodiments, the dummy spacer layers 156 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the dummy spacer layers 156 are formed by depositing the dielectric material followed by an anisotropic etching process.

Figures 1L, 1M:
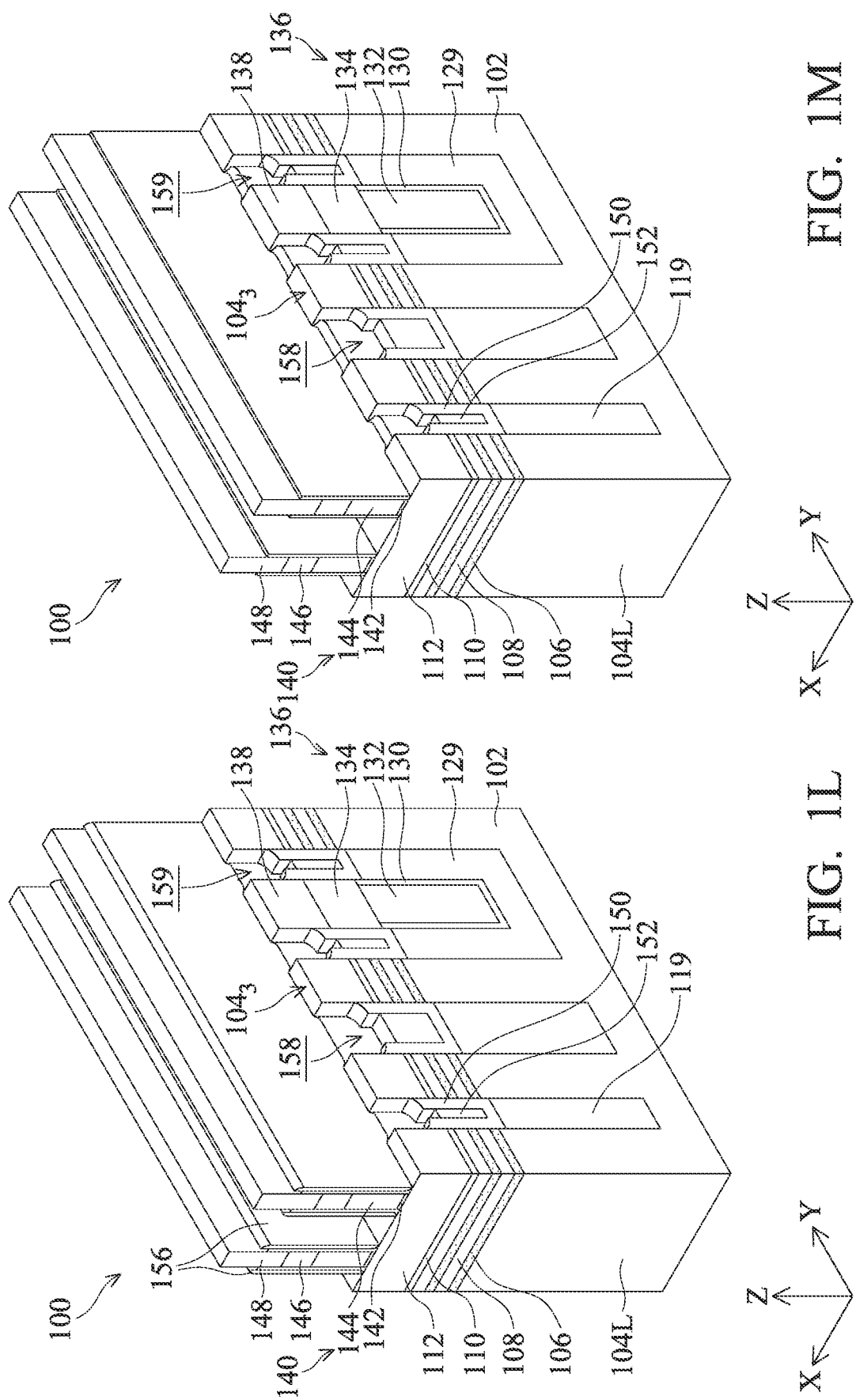

The fill layer 152 and the lining layer 150 are recessed using one or more etching processes to form recesses 158 and 159, as shown in FIG. 1L, in accordance with some embodiments. The recesses 158 are located between adjacent two fin structures 104 (such as $104_1$ and $104_2$), and the recess 159 is located between the dummy layer 138 (over the dielectric fin structure 136) and adjacent fin structures 104 (such as $104_4$), in accordance with some embodiments. The one or more etching processes may be an anisotropic etching process such as dry plasma etching, an isotropic etching process such as dry chemical etching, remote plasma etching or wet chemical etching, and/or a combination thereof.

The fill layer 152 is recessed such that the upper surface of the fill layer 152 is located a level substantially equal to or lower than the upper surface of the uppermost second semiconductor layer 108, in accordance with some embodiments.

Afterward, the portions of the lining layer 150 uncovered by the dummy spacer layers 156 (e.g., the portions formed along the sidewalls of the fin structure 104 and the dielectric fin structure 136 within the spaces 154 and 155) are recessed, in accordance with some embodiments. During the etching process, the dummy spacer layers 156 protects the portions of the lining layer 150 immediately adjacent to the sidewalls of the dummy gate structures 140 within the spaces 154 and 155 from being etched, in accordance with some embodiments. The upper surfaces of the recessed portions of the lining layer 150 are located at a higher level than the upper surface of fill layer 152, in accordance with some embodiments.

Therefore, the recesses 158 and 159 have wider upper portions than their lower portions, which may be helpful in the gap-fill window for subsequently formed material, in accordance with some embodiments. In some embodiments, the portions of the lining layer 150 immediately adjacent to the sidewalls of the dummy gate structures 140 within the spaces 154 and 155 remain substantially unetched, and thus may sufficiently separate the subsequently formed high-k material from active gate stacks, which may decrease the risk of leakage between subsequently formed gate stacks and contact plugs. This will be discussed in detail later.

After the recessing of the fill layer 152 and the lining layer 150, the dummy spacer layers 156 are removed using an etching process, as shown in FIG. 1M, in accordance with some embodiments. The etching process may be an anisotropic etching process such as dry plasma etching, an isotropic etching process such as dry chemical etching, remote plasma etching or wet chemical etching, and/or a combination thereof.

Figure 1O:
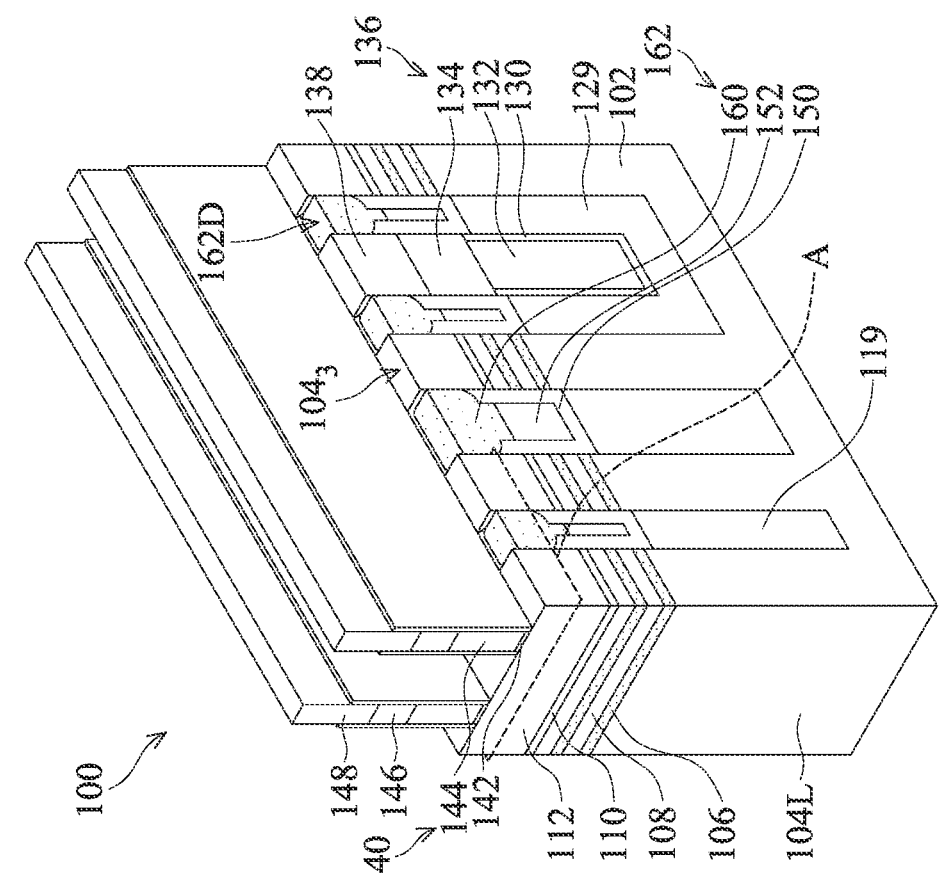
Figure 1N:
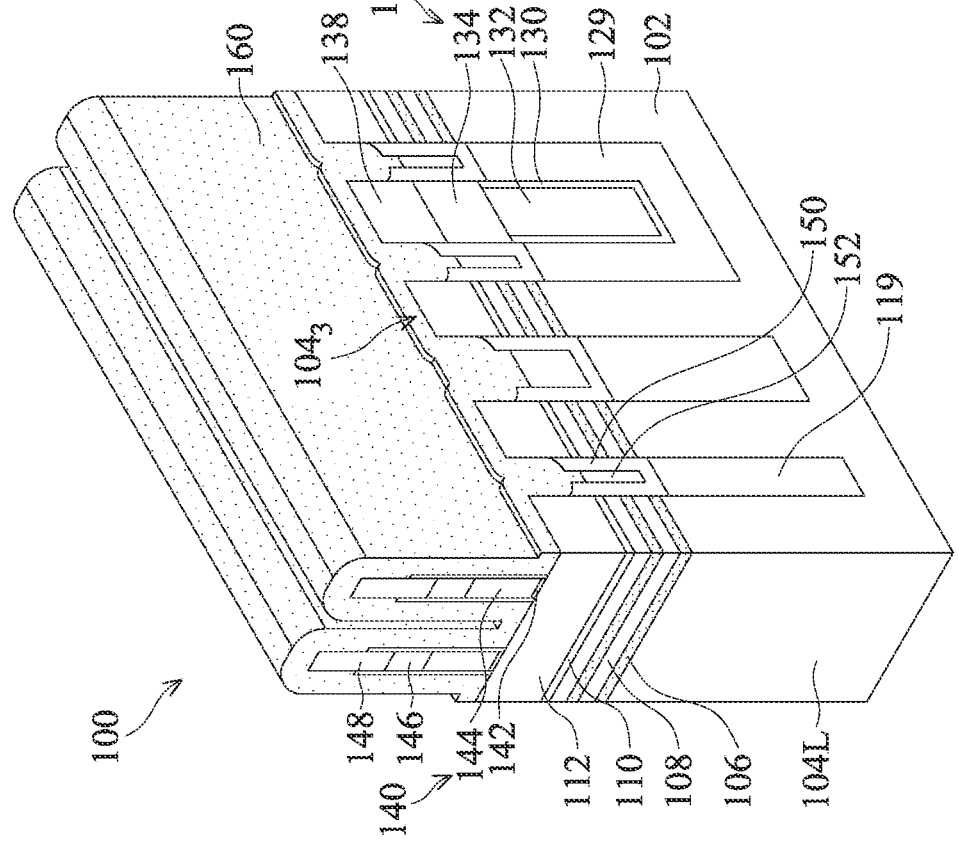

A protection layer 160 is formed over the semiconductor structure 100 to overfill recesses 158 and 159, as shown in FIG. 1N, in accordance with some embodiments. In some embodiments, the protection layer 160 is made of dielectric material with a dielectric constant greater than about 7. In some embodiments, the dielectric material for the protection layer 160 is $Al_2O_3$, $HfO_2$, $ZrO_2$, HfAlO, HfSiO, or a combination thereof. In some embodiments, the protection layer 160 has different etching selectivity than the dummy layer 112, the dummy layer 110, the first semiconductor layers 106 and the second semiconductor layer 108. In some embodiments, the protection layer 160 is deposited using ALD, CVD (such as LPCVD, PECVD, HDP-CVD, HARP, or FCVD), another suitable technique, and/or a combination thereof.

An etching back process is performed on the protection layer 160 to remove the portions of the protection layer 160 outside the recesses 158 and 159, as shown in FIG. 1O, in accordance with some embodiments. In some embodiments, the etching back process may be an anisotropic etching process such as dry plasma etching, an isotropic etching process such as dry chemical etching, remote plasma etching or wet chemical etching, and/or a combination thereof.

The remainder of the protection layer 160, the fill layer 152 and the lining layer 150 in the spaces 154 and 155 combine to form source/drain spacer structures 162 and 162D, in accordance with some embodiments. The source/drain spacer structure 162 is formed between adjacent two fin structures (such as $104_1$ and $104_2$) and adjacent two dummy gate structures 140; the source/drain spacer structure 162D is formed between the dielectric fin structure 136, adjacent fin structures 104 (such as $104_4$) and adjacent two dummy gate structures 140, in accordance with some embodiments. The source/drain spacer structures 162 and 162D are used to confine the lateral growth of the subsequently formed source/drain features, thereby forming the source/drain features with a desirable profile, in accordance with some embodiments. In some embodiments, the width of the source/drain spacer structure 162 or 162D in the Y direction is in a range of about 10 nm to about 80 nm, the height of the source/drain spacer structure 162 or 162D in Z direction is in a range of about 28 nm to about 64 nm.

FIG. 1O-1 is a plan view of the semiconductor structure 100 taken along plan A shown in FIG. 1O, in accordance with some embodiments of the disclosure.

In some embodiments, the lining layer 150 of the source/drain spacer structure 162 (and the source/drain spacer structure 162D) separates the high-k protection layer 160 from the dummy gate structures 140. The source/drain spacer structures 162 (and the source/drain spacer structure 162D) are formed adjacent to the dummy gate structure 140 but does not extend directly below the dummy gate structures 140, which may improve the gap-fill window of the forming gate electrode materials. This will be discussed in detail below.

Figures 1, 1O, 1P:
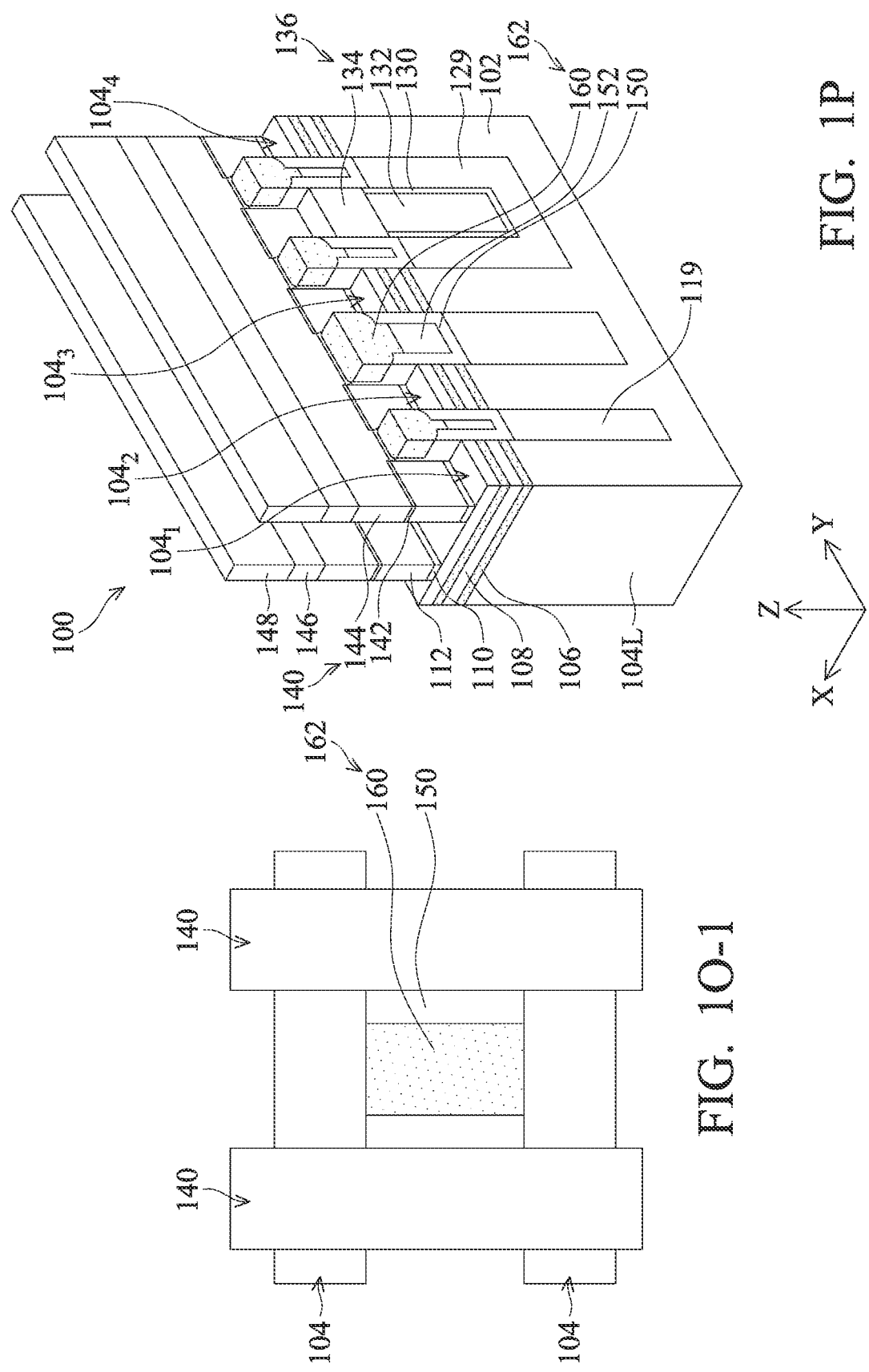

Afterward, a portion of the lining layer 150 outside the recesses 158 and 159 are removed using an etching process. Portions of the upper fin elements (including the dummy layers 112 and 110) and a portion of the dummy layer 138, uncovered by the dummy gate structures 140, are removed using one or more etching processes, as shown in FIG. 1P, in accordance with some embodiments. The one or more etching processes may be an anisotropic etching process such as dry plasma etching, an isotropic etching process such as dry chemical etching, remote plasma etching or wet chemical etching, and/or a combination thereof.

Figures 1, 1Q:
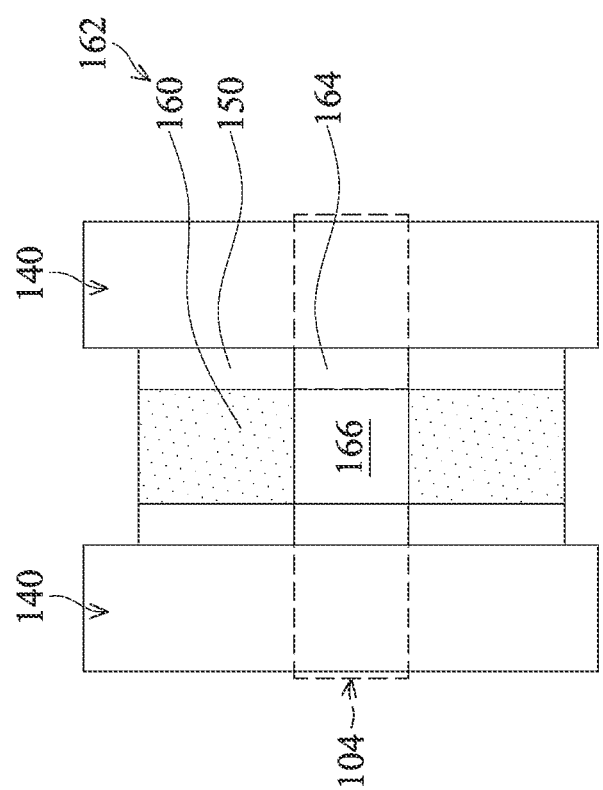
Figure 1Q:
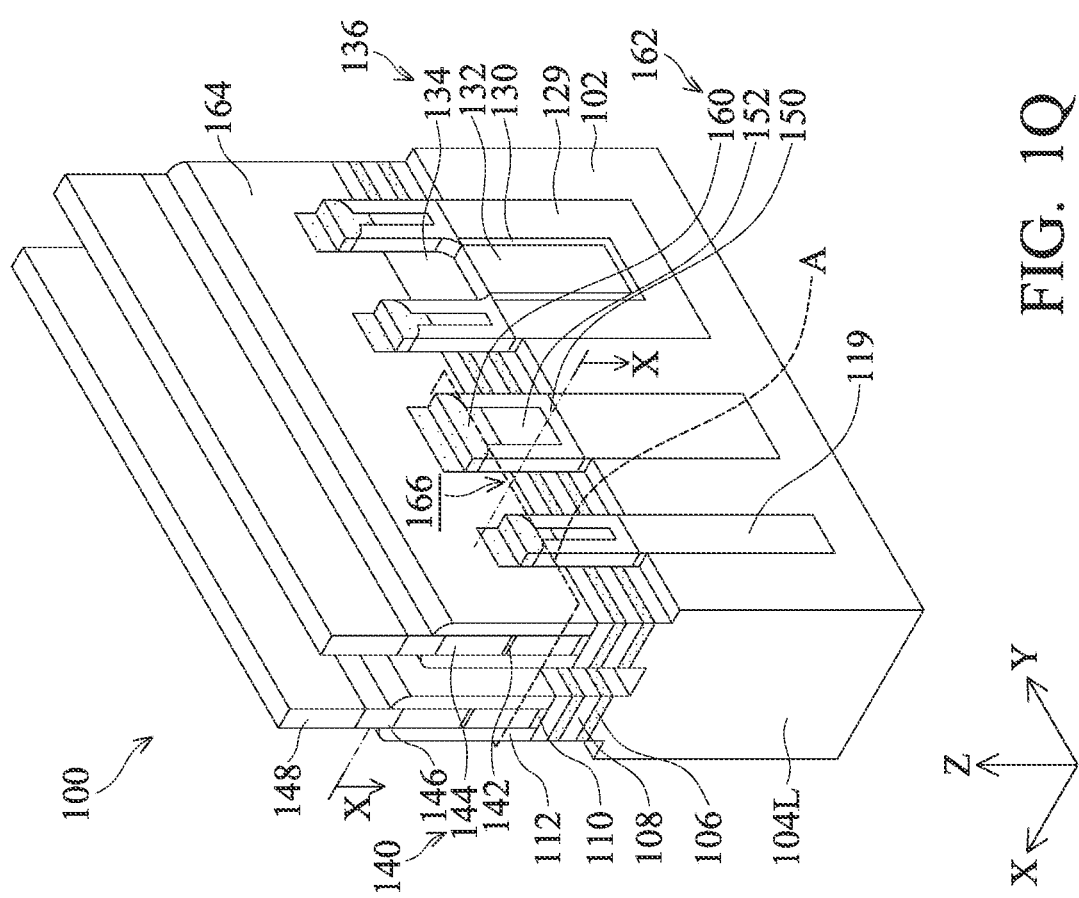

The gate spacer layers 164 are formed on opposite sides of the dummy gate structures 140, as shown in FIG. 1Q, in accordance with some embodiments. The gate spacer layers 164 are used to offset the subsequently formed source/drain features and separate the source/drain features from the gate structure, in accordance with some embodiments.

In some embodiments, the gate spacer layer 164 is made of dielectric material, such as a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layer 164 is a bi-layered structure and is made of low-k dielectric materials. For example, the dielectric constant (k) of the gate spacer layer 164 may be lower than the k-value of silicon oxide (SiO), such as lower than 4.2, equal to or lower than about 3.9, such as in a range of about 3.5 to about 3.9. In some embodiments, the formation of the gate spacer layer 164 includes globally and conformally depositing the dielectric material for the gate spacer layer 164 followed by an anisotropic etching process. Vertical portions of the dielectric material are left remaining on the sidewalls of the dummy gate structures 140 to act as gate spacer layers 164, in accordance with some embodiments.

Figures 1, 1Q, 1R, 2:
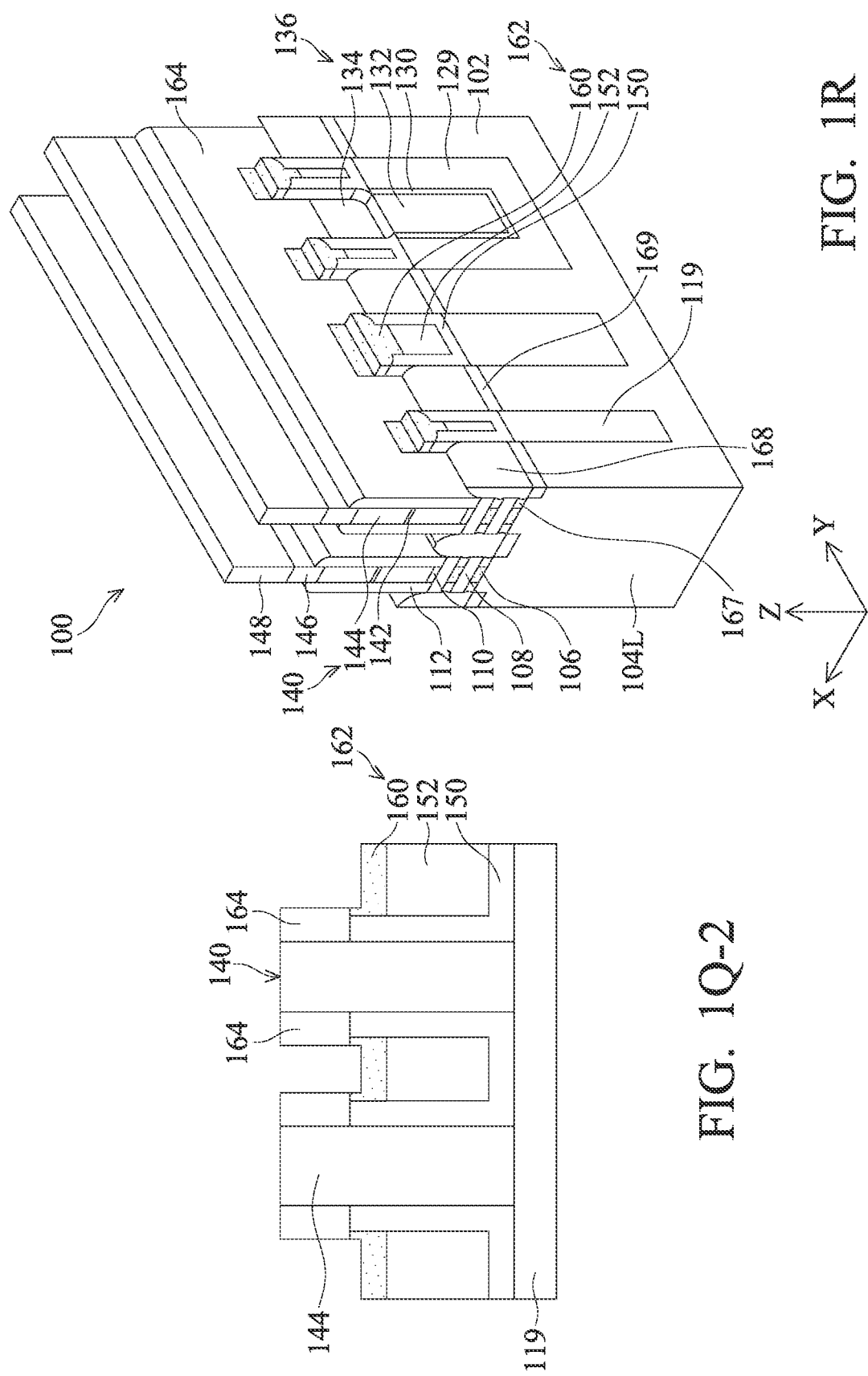

Afterward, an etching process is performed to recess the source/drain regions of the fin structures 104, thereby forming source/drain recesses 166, as shown in FIGS. 1Q, 1Q-1 and 1Q-2, in accordance with some embodiments. FIG.

1Q-1 is a plan view of the semiconductor structure 100 taken along plan A shown in FIG. 1Q, in accordance with some embodiments of the disclosure. FIG. 1Q-2 is a cross-sectional view of the semiconductor structure 100 taken along cross-section X-X shown in FIG. 1Q, in accordance with some embodiments of the disclosure. The recesses 166 penetrate through the middle fin elements (including the first semiconductor layers 106 and the second semiconductor layers 108) until the lower fin elements 104L are exposed, in accordance with some embodiments.

The etching process may be an anisotropic etching process such as dry plasma etching. The gate spacer layers 164, the patterned hard mask layers 148 (over the dummy gate structures 140) and the source/drain spacer structures 162/162D may serve as etch masks such that the source/drain recesses 166 are formed self-aligned between the dummy gate structures 140 and the source/drain spacer structures 162/162D, as shown in FIGS. 1Q and 1Q-1, in accordance with some embodiments. In some embodiments, the etching process is performed without the need for an additional photolithography process.

The protection layers 160 may protect the lining layers 150 and the fill layers 152 from being recessed, in accordance with some embodiments. During the etching process, the protection layers 160 of the source/drain spacer structures 162 are partially recessed, as shown in FIGS. 1Q and 1Q-2, in accordance with some embodiments. The protection layer 160 has a first upper surface covered by the gate spacer layer 164 and a second upper surface uncovered by the gate spacer layer 164 and lower than the first upper surface, in accordance with some embodiments.

In addition, a portion of the protection layer 134 of the dielectric fin structure 136 uncovered by the gate spacer layers 164 and the dummy gate structures 140 is removed, thereby exposing the lining layer 130 and the fill layer 132, as shown in FIG. 1Q, in accordance with some embodiments. In some embodiments, the portion of the protection layer 134 of the dielectric fin structure 136 uncovered by the gate spacer layers 164 and the dummy gate structures 140 may remain after the etching process.

Inner spacer layers 167 are formed on the exposed sidewalls of the first semiconductor layers 106, as shown in FIG. 1R. in accordance with some embodiments. The inner spacer layers 167 interpose subsequently formed source/drain features and gate stack to avoid the source/drain features and the gate stack from being in direct contact and are configured to reduce the parasitic capacitance between the gate stack and the source/drain features (e.g. Cgs and Cgd), in accordance with some embodiments.

In some embodiments, the inner spacer layers 167 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 167 are made of low-k dielectric materials. For example, the dielectric constant of the inner spacer layers 167 may be lower than a k-value of silicon oxide (SiO), such as lower than 4.2, equal to or lower than about 3.9, such as in a range of about 3.5 to about 3.9.

The formation of the inner spacer layers 167 includes laterally etching the first semiconductor layers 106 of the fin structures 104 to form notches, in accordance with some embodiments. In some embodiments, in the etching process, the first semiconductor layers 106 have a greater etching rate (or etching amount) than the second semiconductor layers 108, thereby forming notches between adjacent second semiconductor layers 108 and between the lowermost second semiconductor layer 108 and the lower fin element 104L. In some embodiments, the etching process is an isotropic etching such as dry chemical etching, remote plasma etching, wet chemical etching, another suitable technique, and/or a combination thereof.

The formation of the inner spacer layers 167 further includes depositing a dielectric material for the inner spacer layers 167 over the semiconductor structure 100 to fill the notches, and then etching back the dielectric material to remove the dielectric material outside the notches. The dielectric material remains in the notches and forms the inner spacer layers 167, in accordance with some embodiments. In some embodiments, the deposition process includes ALD, CVD (such as PECVD, LPCVD or HARP), another suitable technique, and/or a combination thereof. In some embodiments, the etching back process includes an anisotropic etching process such as dry plasma etching, an isotropic etching process such as dry chemical etching, remote plasma etching or wet chemical etching, and/or a combination thereof.

Etching stop layers 169 are formed over the lower fin elements 104L in the source/drain recesses 166 using an epitaxial growth process, as shown in FIG. 1R, in accordance with some embodiments. The epitaxial growth process may be MBE, MOCVD, or VPE, another suitable technique, or a combination thereof. The etching stop layers 169 are configured to protect subsequently formed source/drain features from being damaged during a subsequent substrate removal process. In some embodiments, the etching stop layers 169 are made of semiconductor material with a different etching selectivity than the substrate 102 (and the lower fin element 104L). For example, the etching stop layers 169 are made of silicon germanium.

The semiconductor material of the etching stop layers 169 may be also grown on the exposed semiconductor surfaces of the second semiconductor layers 108 of the fin structures 104. An etching back process may be then performed to remove the semiconductor material of the etching stop layers 169 grown on the second semiconductor layers 108, thereby exposing the second semiconductor layers 108 again.

Afterward, source/drain features 168 are formed over the etching stop layers 169 in the source/drain recesses 166 using an epitaxial growth process, as shown in FIG. 1R, in accordance with some embodiments. The epitaxial growth process may be MBE, MOCVD, or VPE, another suitable technique, or a combination thereof. The source/drain features 168 are formed on opposite sides of the dummy gate structures 140, in accordance with some embodiments. In some embodiments, the source/drain features 168 adjoin the second semiconductor layers 108.

The source/drain spacer structures 162 confine the lateral growth (in the Y direction) of the source/drain features 168, and thus the source/drain features 168 have column profiles, in accordance with some embodiments. In cases where the source/drain spacer structures are not formed, the source/drain feature may have a wider dimension in the Y direction due to lateral growth, and adjacent source/drain features may even merge to each other. The source/drain feature 168 having a narrower width in the Y direction can reduce the parasitic capacitance between the gate stack and the source/drain feature, thereby enhancing the performance (e.g., speed) of the semiconductor device. In some embodiments, the source/drain spacer structure 162 is higher than the source/drain feature 168, for example, by a distance about less than 20 nm.

By forming the upper fin element (including dummy layers 112 and 110) and the dummy layer 138, the protection layer 160 of the source/drain spacer structure 162 is located at a higher level than the upper surface of the middle fin element (including semiconductor layers 106 and 108), in accordance with some embodiments. As a result, the source/drain feature 168 is formed not protruding the protection layer 160 of the source/drain spacer structure 162, in accordance with some embodiments. That is, the upper surface of the source/drain feature 168 is located at a lower level than the upper surface of the source/drain spacer structures 162, in accordance with some embodiments. Therefore, the lateral growth of the source/drain feature 168 may be entirely prevented.

In some embodiments, the source/drain features 168 are made of any suitable semiconductor material for n-type semiconductor devices or p-type semiconductor devices. In some embodiments, wherein the fin structures 104 are to be formed as N-type nanostructure devices (such as n-channel GAA FETs), the source/drain features 168 are made of semiconductor material such as SiP, SiAs, SiCP, SiC, Si, GaAs, another suitable semiconductor material, or a combination thereof. In some embodiments, the source/drain features 168 are doped with the n-type dopant during the epitaxial growth process. For example, the n-type dopant may be phosphorous (P) or arsenic (As). For example, the source/drain features 168 may be the epitaxially grown Si doped with phosphorous to form silicon:phosphor (Si:P) source/drain features and/or arsenic to form silicon:arsenic (Si:As) source/drain feature.

In some embodiments, wherein the fin structure 104 is to be formed as P-type nanostructure devices (such as p-channel GAA FETs), the source/drain features 168 are made of semiconductor material such as SiGe, Si, GaAs, another suitable semiconductor material, or a combination thereof. In some embodiments, the source/drain features 168 are doped with the p-type dopant during the epitaxial growth process. For example, the p-type dopant may be boron (B) or $BF_2$. For example, the source/drain features 168 may be the epitaxially grown SiGe doped with boron (B) to form silicon germanium:boron (SiGe:B) source/drain feature.

A contact etching stop layer 170 is formed over the semiconductor structure 100, as shown in FIG. 1S, in accordance with some embodiments. In some embodiments, the contact etching stop layer 170 is made of dielectric material, such as silicon oxide ($SiO_2$), silicon nitride (SiN), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 170 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 172 is formed over the contact etching stop layer 170 to fill spaces between the dummy gate structures 140, as shown in FIG. 1S, in accordance with some embodiments. In some embodiments, the interlayer dielectric layer 172 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 172 and the contact etching stop layer 170 are made of different materials and have a great difference in etching selectivity. In some embodiments, the dielectric material for the interlayer dielectric layer 172 is deposited using such as CVD (such as HDP-CVD, PECVD, HARP or FCVD), another suitable technique, and/or a combination thereof.

The dielectric materials for the contact etching stop layer 170 and the interlayer dielectric layer 172 above the upper surface of the dummy gate electrode layer 144 are removed using such as CMP until the upper surface of the dummy gate electrode layer 144 is exposed, in accordance with some embodiments. In some embodiments, the patterned hard mask layers 146 and 148 are also removed. In some embodiments, the upper surface of the interlayer dielectric layer 172 is substantially coplanar with the upper surfaces of the dummy gate electrode layers 144.

Figures 1, 1T, 1U:
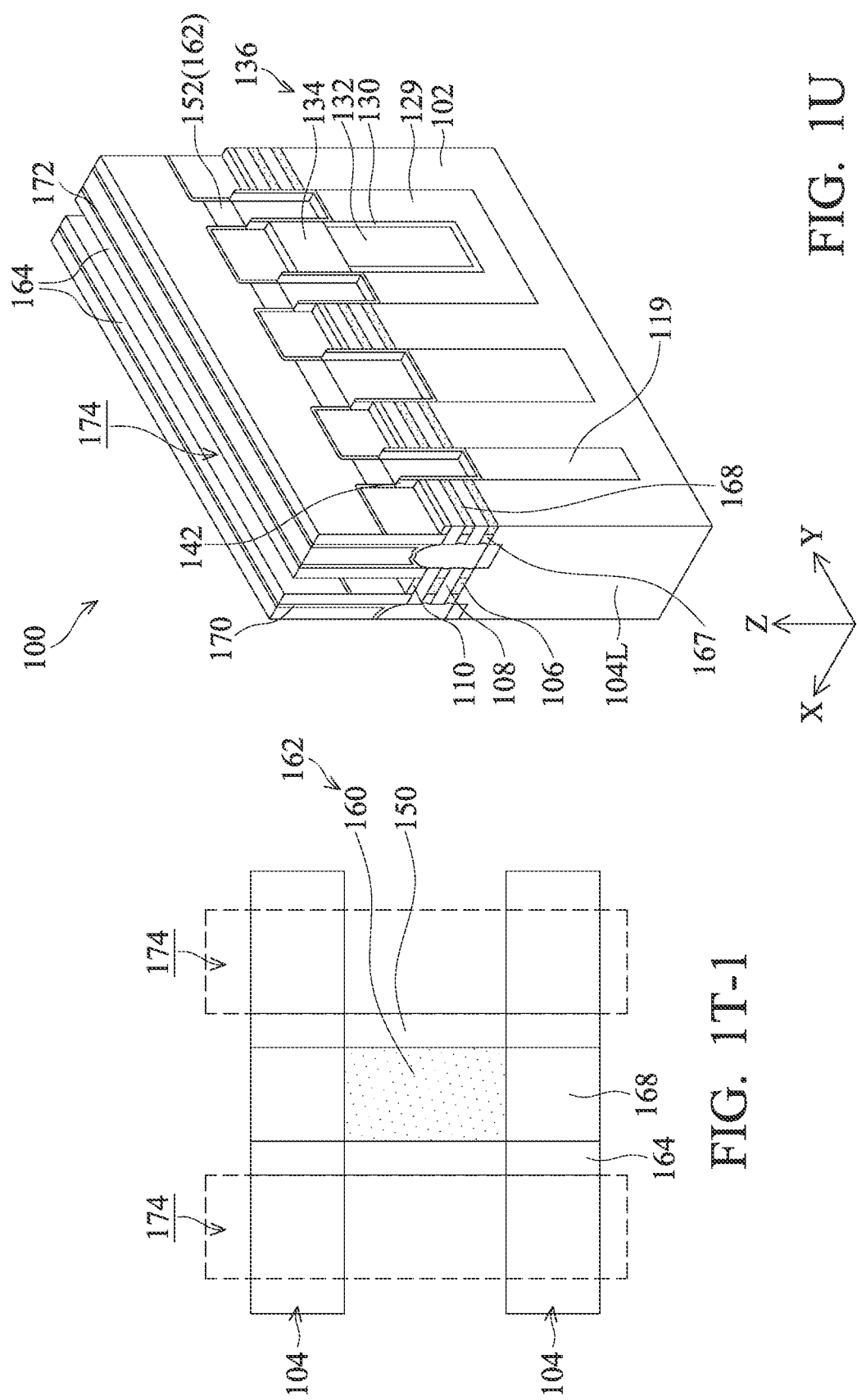

The dummy gate electrode layer 144 is partially removed using an etching process, thereby forming gate trenches 174, as shown in FIGS. 1T and 1T-1, in accordance with some embodiments. FIG. 1T-1 is a plan view of the semiconductor structure taken along plan A shown in FIG. 1T, in accordance with some embodiments of the disclosure. The etching process may be an anisotropic etching process such as dry plasma etching, an isotropic etching process such as dry chemical etching, remote plasma etching or wet chemical etching, and/or a combination thereof.

The etching process removes the portion of the dummy gate electrode layer 144 above the fin structure 104 to expose the dummy gate dielectric layer 142, and further recesses the portions of the dummy gate electrode layer 144 between the fin structures 104 and between the fin structure 104 and dielectric fin structure 136, in accordance with some embodiments. In some embodiments, the trenches 174 expose the sidewalls of the gate spacer layers 164 facing the channel region. In some embodiments, the trenches 174 also expose the sidewalls of the lining layer 150 of the source/drain spacer structure 162 facing the channel region, as shown in FIG. 1T-1.

The portion of the dummy gate dielectric layer 142 uncovered by the dummy gate electrode layer 144 is removed using an etching process to expose the dummy layer 112, in accordance with some embodiments. The remaining portion of the gate electrode layer 144 and the dummy layer 112 are then removed using an etching process to expose the dummy layer 110 and the remaining portion of the dummy gate dielectric layer 142, as shown in FIG. 1U, in accordance with some embodiments. The etching processes may be an anisotropic etching process such as dry plasma etching, an isotropic etching process such as dry chemical etching, remote plasma etching or wet chemical etching, and/or a combination thereof.

Afterward, the remaining portion of the dummy gate dielectric layer 142 and the dummy layer 110 are removed using an etching process, in accordance with some embodiments. The etching process may be an anisotropic etching process such as dry plasma etching, an isotropic etching process such as dry chemical etching, remote plasma etching or wet chemical etching, and/or a combination thereof.

The first semiconductor layers 106 of the middle fin elements are removed using an etching process to form gaps 176, as shown in FIG. 1V, in accordance with some embodiments. The inner spacer layers 167 may be used as an etching stop layer in the etching process, which may protect the source/drain features 168 from being damaged. The etching process may be an anisotropic etching process such as dry plasma etching, an isotropic etching process such as dry chemical etching, remote plasma etching or wet chemical etching, and/or a combination thereof.

The gaps 176 are located between the neighboring second semiconductor layers 108 and between the lowermost second semiconductor layers 108 and the lower fin elements 104L, in accordance with some embodiments. In some embodiments, the gaps 176 also expose the sidewalls of the inner spacer layers 167 facing the channel region.

After the etching process, the four main surfaces of the second semiconductor layers 108 are exposed, in accordance with some embodiments. The exposed second semiconductor layers 108 of each of the fin structures 104 form a set of nanostructures that vertically stacked over one another and function as channel layers of the resulting semiconductor devices (e.g., a nanostructure transistor), in accordance with some embodiments.

Interfacial layer 180 is formed on the exposed surfaces of the nanostructures 108 and the lower fin element 104L, as shown in FIG. 1W, in accordance with some embodiments. The interfacial layer 180 wraps around the nanostructures 108, in accordance with some embodiments. In some embodiments, the interfacial layer 180 is made of a chemically formed silicon oxide. In some embodiments, the interfacial layer 180 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 104L is oxidized to form the interfacial layer 180, in accordance with some embodiments.

A gate dielectric layer 182 is formed conformally along the interfacial layer 180 to wrap around the nanostructures 108, as shown in FIG. 1W, in accordance with some embodiments. The gate dielectric layer 182 is also conformally formed along the sidewalls of the gate spacer layers 164 facing the channel region and the sidewalls of the inner spacer layers 167 facing the channel region, in accordance with some embodiments. The gate dielectric layer 182 is also conformally formed along the upper surface of the insulating layers 119 and 129, in accordance with some embodiments.

The gate dielectric layer 182 is also conformally formed along sidewalls and the upper surface of the protection layer 134 of the dielectric fin structure 136, in accordance with some embodiments. The gate dielectric layer 182 is also formed along the sidewalls of the lining layer 150 of the source/drain spacer structure 162, in accordance with some embodiments.

The gate dielectric layer 182 may be high-k dielectric layer. In some embodiments, the high-k dielectric layer is made of dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

A metal gate electrode layer 184 is formed over the gate dielectric layer 182 and fills remainders of the gate trenches 174 and the gaps 176, as shown in FIG. 1W, in accordance with some embodiments. The metal gate electrode layer 184 wraps around the nanostructures 108, in accordance with some embodiments. In some embodiments, the metal gate electrode layer 184 is made of more than one conductive material, such as a metal, metal alloy, conductive metal oxide and/or metal nitride, another suitable conductive material, and/or a combination thereof. For example, the metal gate electrode layer 184 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 184 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 184 may be formed using ALD, PVD, CVD, e-beam evaporation, or another suitable process. The metal gate electrode layer 184 may be formed separately for n-channel nanostructure transistors and p-channel nanostructure transistors, which may use different work function materials.

A planarization process such as CMP may be performed on the semiconductor structure 100 to remove the materials of the gate dielectric layer 182 and the metal gate electrode layer 184 formed above the upper surface of the interlayer dielectric layer 172, in accordance with some embodiments.

The interfacial layer 180, the gate dielectric layer 182 and the metal gate electrode layer 184 combine to form final gate stacks 178, in accordance with some embodiments. In some embodiments, the final gate stacks 178 extend in the Y direction. That is, the final gate stack 178 has longitudinal axes parallel to Y direction, in accordance with some embodiments. The final gate stacks 178 extend across and wrap around each of the nanostructures 108, in accordance with some embodiments. The final gate stacks 178 extend across the dielectric fin structure 136 but not the source/drain spacer structures 162 in accordance with some embodiments. The final gate stack 178 is interposed between the source/drain features 168, in accordance with some embodiments.

The final gate stacks 178 combines with the source/drain features 168 to form nanostructure transistors, in accordance with some embodiments. The final gate stack 178 may engage the channel region of the nanostructures 108, such that current can flow between the source/drain features 168 during operation.

Because the source/drain spacer structures 162 are formed after the dummy gate structures 140 and do not extend directly below the dummy gate structures 140, the gate trenches 174 (FIG. 1V) may provide more space to accommodate the gate materials, which may enlarge the gap-fill window of forming the metal gate electrode 184. Therefore, the nanostructures 108 may be sufficiently surrounded by the metal gate electrode 184, which may improve the short channel effect (SCE), and/or be helpful in continuously scaling down the semiconductor device (e.g., shrinkage in cell height).

Afterward, an etching process is performed to recess the final gate stacks 178 and the gate spacer layers 164, thereby forming recesses within the interlayer dielectric layer 172, in accordance with some embodiments. The etching process may be an anisotropic etching process such as dry plasma etching, an isotropic etching process such as dry chemical etching, remote plasma etching or wet chemical etching, and/or a combination thereof.

The upper surface of the recessed final gate stacks 178 is located higher than the upper surface of the protection layer 134 of the dielectric fin structure 136, as shown in FIG. 1W, in accordance with some embodiments. As discussed above in FIG. 1F, if the thickness of the protection layer 134 of the dielectric fin structure 136 is too thick, the recessed final gate stack 178 may be cut off by the protection layer 134. In addition, the upper surface of the recessed gate spacer layers 164 may be higher than the upper surface of the recessed final gate stacks 178, in accordance with some embodiments.

Afterward, metal cap layers 186 are formed over the upper surfaces of the recessed final gate stacks 178 using a deposition process and an etching back process, as shown in FIG. 1W, in accordance with some embodiments. In some embodiments, the metal cap layers 186 are made of metal such as W, Re, Ir, Co, Ni, Ru, Mo, Al, Ti, Ag, another suitable metal, or multilayers thereof. The metal cap layers 186 and the metal gate electrode layer 184 are made of different materials. In some embodiments, the metal cap layers 186 are made of fluorine-free tungsten, which may lower the total resistance of the gate stack. In some embodiments, the overall thickness of the metal cap layers 186 and the portion of the metal gate electrode layer 184 above the topmost nanostructure 108 is in a range of about 8 nm to about 30 nm.

Afterward, dielectric cap structures 188 are formed in the recesses over the metal cap layers 186 and the gate spacer layers 164, as shown in FIG. 1W, in accordance with some embodiments. In some embodiments, the dielectric cap structures 188 is a bi-layered structure including a lining layer 190 and a bulk layer 192 over the lining layer 190. The dielectric cap structures 188 may be configured to protect the gate spacer layers 164 and the final gate stacks 178 during the subsequent etching process for forming contact plugs.

The lining layer 190 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the dielectric material for the lining layer 190 is conformally deposited over the semiconductor structure 100 to partially fill the recesses using such as ALD, CVD (such as LPCVD, PECVD, HDP-CVD, or HARP), another suitable technique, and/or a combination thereof.

The bulk layer 192 is made of dielectric material such as silicon oxide ($SiO_2$), silicon nitride (SiN), silicon oxynitride (SiON), silicon carbon nitride (SiCN), silicon oxycarbonitride (SiOCN), oxygen-doped silicon carbonitride (Si(O)CN), or a combination thereof. In some embodiments, the dielectric material for the bulk layer 192 is then formed over the lining layer 190 to overfill the recesses using such as CVD (such as FCVD, LPCVD, PECVD, HDP-CVD or HARP), ALD, another suitable technique, and/or a combination thereof. In some embodiments, the bulk layer 192 and the lining layer 190 are made of different materials and have a great difference in etching selectivity. For example, the bulk layer 192 has a lower dielectric constant than the lining layer 190. In some embodiments, the bulk layer 192 is made of an oxide (such as silicon oxide) and the lining layer 190 is made of a nitrogen-containing dielectric (such as silicon nitride or silicon oxynitride).

Afterward, a planarization process is then performed on the bulk layer 192 and the lining layer 190 until the interlayer dielectric layer 172 is exposed, in accordance with some embodiments. The planarization may be CMP, etching back process, or a combination thereof.

Figures 1, 1X:
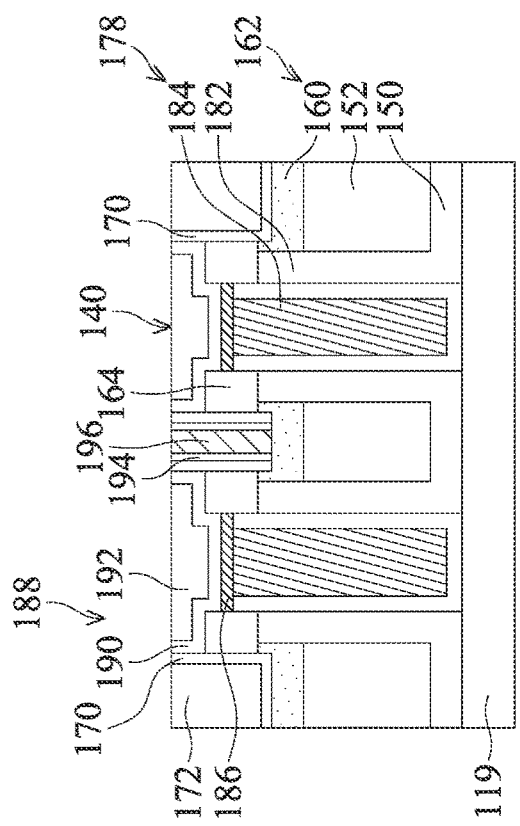
Figure 1X:
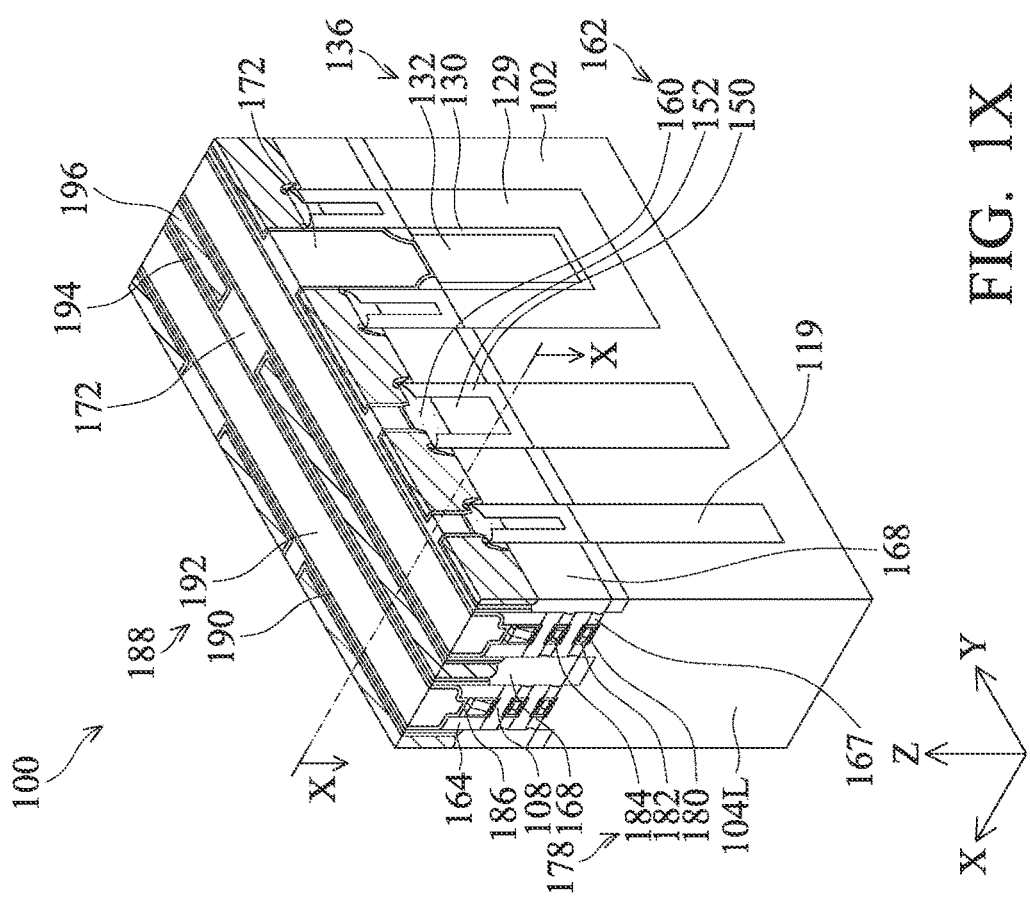

Contact plugs 196 are formed through the interlayer dielectric layer 172 and the contact etching stop layer 170, as shown in FIGS. 1X and 1X-1, in accordance with some embodiments. FIG. 1X-1 is a cross-sectional view of the semiconductor structure 100 taken along cross-section X-X shown in FIG. 1X, in accordance with some embodiments of the disclosure. The contact plugs 196 land on and are electrically connected to the source/drain features 168, in accordance with some embodiments. The contact plug 196 may also land on a portion of the source/drain spacer structure 162. In some embodiments, some of the contact plug 196 continuously extend across and land on the source/drain features 168 and the protect layer 160 of the source/drain spacer structure 162.

In some embodiments, the formation of the contact plugs 196 includes patterning the interlayer dielectric layer 172 and the contact etching stop layer 170 to form contact openings (where the contact plugs 196 are to be formed) through the interlayer dielectric layer 172 and the contact etching stop layer 170 and exposing the source/drain features 168. The patterning process includes forming a patterned mask layer (not shown) using a photolithography process over the interlayer dielectric layer 172 followed by an anisotropic etching process. In some embodiments, the contact openings partially expose the protection layers 160 of the source/drain spacer structures 162.

Contact liners 194 may be then formed on the sidewalls of the contact openings using deposition and etching back processes. In some embodiments, the contact liners 194 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), $HfO_2$, $ZrO_2$, ZrAlO, HfAlO, HfSiO, $Al_2O_3$, or a combination thereof. In some embodiments, the thickness of the contact liner 194 in the Y direction is in a range of about 2 nm to about 5 nm.

The formation of the contact plugs 196 also includes forming a silicide layer (such as WSi, NiSi, TiSi, TaSi, PtSi, WSi and/or CoSi) on the exposed source/drain features 168, depositing one or more conductive materials for the contact plugs 196 to fill the contact openings, and planarizing the one or more conductive materials over the upper surface of the interlayer dielectric layer 172 using, for example, CMP. In some embodiments, the conductive material is deposited using CVD, PVD, e-beam evaporation, ALD, electroplating (ECP), electroless deposition (ELD), another suitable method, or a combination thereof. After the planarization process (such as CMP), the upper surfaces of the contact plugs 196, the upper surface of the interlayer dielectric layer 172 and the upper surfaces of the dielectric cap structures 188 are substantially coplanar, in accordance with some embodiments.

The contact plugs 196 may be a single layer or a multilayer structure including, for example, liner layers, glue layers, barrier layers, seed layers, metal bulk layers, another suitable layer, and/or a combination thereof. For example, a barrier/adhesive layer (not shown) may optionally be formed along the sidewall and the bottom surface of the contact openings. The barrier/adhesive layer is used to prevent the metal from the subsequently formed metal material from diffusing into the dielectric material (e.g., the interlayer dielectric layer 172) and/or improve adhesion between the subsequently formed metal material and the dielectric material (e.g., the interlayer dielectric layer 172). The barrier/adhesive layer may be made of tantalum (Ta), tantalum nitride (TaN), titanium (Ti), titanium nitride (TiN), cobalt tungsten (CoW), another suitable material, and/or a combination thereof. If the subsequently formed metal material does not easily diffuse into the dielectric material, the barrier layer may be omitted.

A metal bulk layer is then formed on the barrier/adhesive layer (if formed) to fill the remainder of the contact openings. In some embodiments, the metal bulk layer is formed using a selective deposition technique such as cyclic CVD process or ELD process, and it is not necessary to form an adhesive layer in the contact openings before depositing the metal bulk layer. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), aluminum (Al), ruthenium (Ru), molybdenum (Mo), another suitable metal material, and/or a combination thereof.

FIG. 1X-2 is an enlarged view of a source/drain spacer structure 162 shown in FIG. 1X, in accordance with some embodiments of the disclosure. The protection layers 160 of the source/drain spacer structures 162 may be used as an etching stop layer in the etching process of forming the contact opening to protect the underlying lining layer 150 and the fill layer 152, and thus the contact opening may have a wider critical dimension (CD), thereby relaxing process limit of the photolithography process. Therefore, the manufacturing yield of the semiconductor device may be increased.

FIG. 1X-2 illustrates the remaining portion 170' of the contact etching stop layer 170 which remains on the upper surface of the source/drain feature 168 after the etching process of forming the contact opening. FIG. 1X-2 also illustrates the remaining portion 194' of the contact liner 194 which remains on the sidewalls of the source/drain spacer structure 162 after the etching process of forming the contact liner 194.

FIGS. 1X-3, 1X-4 and 1X-5 are plan views of the semiconductor structure 100 taken along plans A-A, B-B and C-C shown in FIG. 1X-2 respectively, in accordance with some embodiments of the disclosure.

The lining layer 150 with the lower dielectric constant (e.g., lower than about 7) is interposed between the protection layer 160 with the higher dielectric constant (e.g., greater than about 7) and the metal gate electrode layer 184, as shown in FIGS. 1X-3 and 1X-4, in accordance with some embodiments. As a result, the parasitic capacitance between the contact plug 196 and the metal gate electrode layer 184 and/or the parasitic capacitance between the source/drain feature 168 and the metal gate electrode layer 184 may be reduced, in accordance with some embodiments.

Furthermore, as-deposited protection layer 160 may be amorphous. After the protection layer 160 undergoes some high-temperature processes, defect (such as void) may be formed within the protection layer 160 due to crystallization. The conductive material (such as from the contact plug) fills the void and thus may provide a leakage pass path. Therefore, the lining layer 150 may prevent the leakage between the contact plug 196 and the metal gate electrode layer 184, in accordance with some embodiments.

The fill layer 152 is nested within the lining layer 150, as shown in FIG. 1X-5, in accordance with some embodiments. In some embodiments, the fill layer 152 may have lower dielectric constant than the lining layer 150, which may further reduce the overall capacitance of the semiconductor device.

The semiconductor structure 100 may undergo further CMOS processes to form various features (not shown) over the frontside of the semiconductor structure 100, such as a multilayer interconnect structure (e.g., contacts to gate, vias, lines, inter metal dielectric layers, passivation layers, etc.). Afterward, a carrier substrate 198 is attached to the frontside of the semiconductor structure 100, and then the semiconductor structure 100 is turned upside down, as shown in FIGS. 1Y-1 and 1Y-2, in accordance with some embodiments. As shown in FIGS. 1Y-1 and 1Y-2, the backside of the semiconductor structure 100 faces upwardly and the frontside of the semiconductor structure 100 faces downwardly.

Afterward, a planarization process is performed to remove the substrate 102 until the insulating layer 119 and the insulating layer 129 are exposed, as shown in FIGS. 1Y-1 and 1Y-2, in accordance with some embodiments. The planarization process may be as an etching process, a CMP process, a mechanical grinding process, a dry polishing process, one or more other applicable processes, or a combination thereof.

An etching process is performed to remove the lower fin element 104L until the etching stop layers 167 are exposed, thereby forming trenches (not shown) between the insulating layers 119 and 129, in accordance with some embodiments. An etching process is then performed to remove the etching stop layers 167 until the source/drain features 168 are exposed, in accordance with some embodiments. In some embodiments where the lower fin elements 104L and the source/drain features 168 have a small difference in the etching selectivity, the etching stop layer 167 may be used to reduce the loss of the source/drain features 168 during the etching processes. The etching process may be an isotropic etching process, e.g., wet etching or dry chemical etching or an anisotropic etching process such as dry plasma etching. In some embodiments, the removal of the lower fin elements 104L may reduce the leakage, thereby enhancing the performance of the semiconductor device (e.g., off-state current).

Figures 1, 1Z, 2:
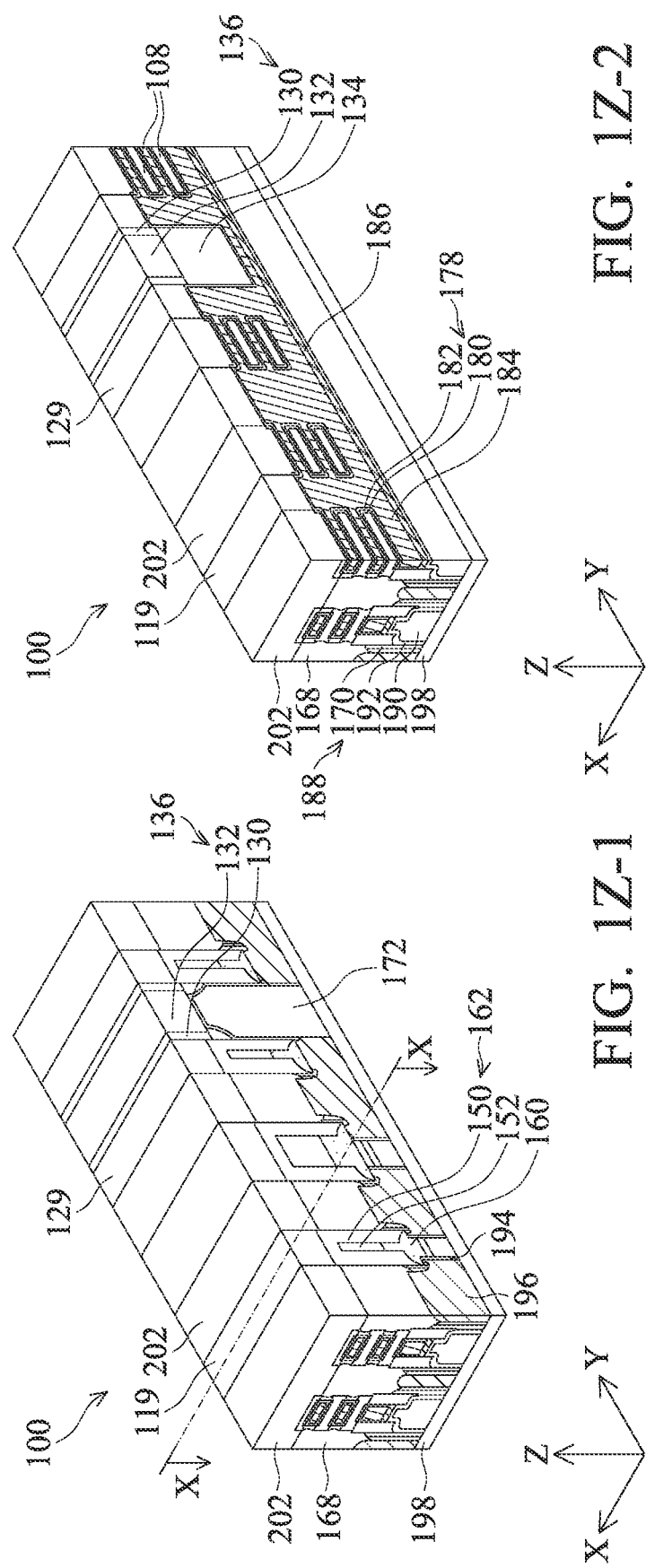
Figure 1A:
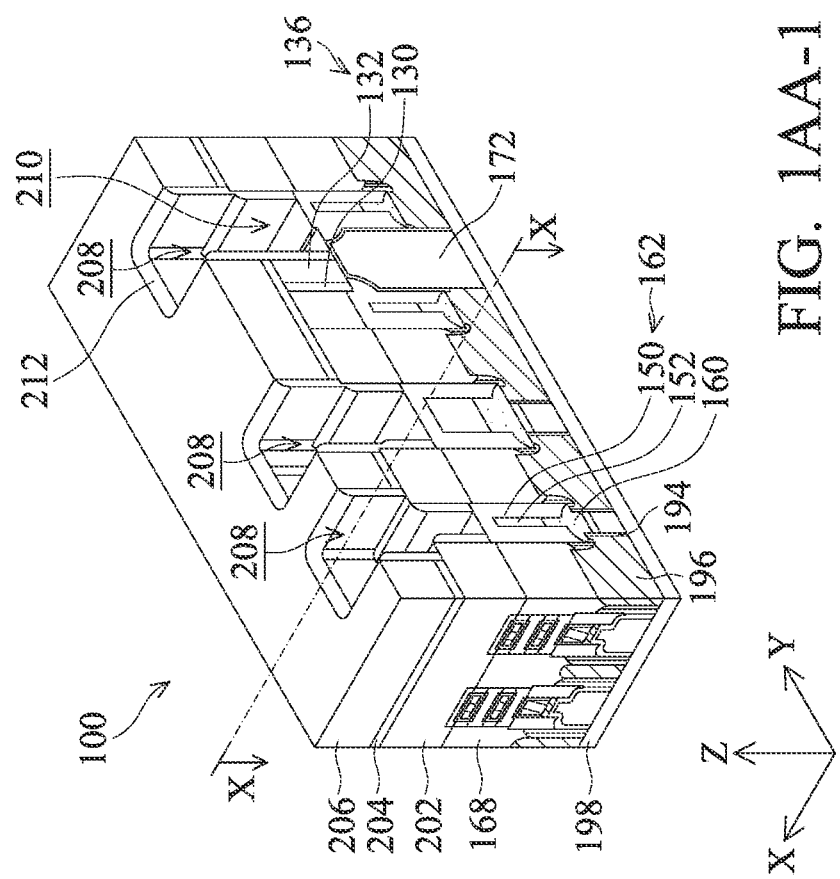

Afterward, an insulating layer 202 is formed in the trenches between the insulating layers 119 and 129, as shown in FIGS. 1Z-1 and 1Z-2, in accordance with some embodiments. FIG. 1Z-3 is a cross-sectional view of the semiconductor structure 100 taken along cross-section X-X shown in FIG. 1Z-1, in accordance with some embodiments of the disclosure. In some embodiments, the insulating layer 202 is made of dielectric material such as silicon nitride (SiN), silicon oxynitride (SiON), silicon oxide (SiO), another suitable insulating material, multilayers thereof, and/or a combination thereof. In some embodiments, the insulating layer 202 is made of a different material than the insulating layers 119 and 129 and has different etching selectivity than the insulating layers 119 and 129. For example, the insulating layers 119 and 129 are made of an oxide (such as silicon oxide) and the insulating layer 202 is made of a nitrogen-containing dielectric (such as silicon nitride or silicon oxynitride).

In some embodiments, the formation of insulating material 202 includes depositing a dielectric material over the semiconductor structure 100 to overfill the trenches, and planarizing a portion of the dielectric material over the insulating layers 119 and 129. The deposition process may be CVD (such as FCVD, LPCVD, PECVD, HDP-CVD or HARP), ALD, another suitable technique, and/or a combination thereof.

A patterning process is performed to form gate-cut openings 214, as shown in FIGS. 1AA-1, 1AA-2 and 1AA-3, in accordance with some embodiments. FIG. 1AA-3 is a cross-sectional view of the semiconductor structure taken along cross-section X-X shown in FIG. 1AA-1, in accordance with some embodiments of the disclosure. The gate-cut openings 214 cut through the final gate stack 178 into several segments $178_{1-4}$, as shown in FIG. 1AA-2, in accordance with some embodiments.

The patterning process includes forming patterned mask layers 204 and 206 over the semiconductor substrate 100. In some embodiments, the patterned mask layers 204 and 206 have openings 208, in accordance with some embodiments. The openings 208 are aligned over the portions of final gate stacks 178 between adjacent pairs of the nanostructures 108, in accordance with some embodiments. The openings 208 also partially overlap the nanostructures 108, as shown in FIGS. 1AA-2, in accordance with some embodiments. That is, the extension lines of the opposite edges of the opening 208 with respect to the Y direction pass through the nanostructures 108, in accordance with some embodiments. The opening 208 also partially overlaps the source/drain spacer structure 162, as shown in FIGS. 1AA-1 and 1AA-3, in accordance with some embodiments. That is, the extension lines of the other two edges of the opening 208 with respect to the X direction pass through the source/drain spacer structure 162, in accordance with some embodiments.

In some embodiments, the patterned mask layer 204 is made of a nitrogen-free anti-reflection layer (NFARL), carbon-doped silicon dioxide (e.g., $SiO_2$:C), titanium nitride (TiN), titanium oxide (TiO), boron nitride (BN), another suitable material, and/or a combination thereof. In some embodiments, the patterned mask layer 206 is made of silicon nitride (SiN), silicon oxynitride (SiON), and/or a combination thereof.

For example, the materials for the patterned mask layers 204 and 206 are sequentially deposited over the insulating layers 119, 129 and 202. A photoresist may be formed over the material for the patterned mask layer 206 such as by using spin-on coating, and patterned with opening patterns corresponding to the openings 208 by exposing the photoresist to light using an appropriate photomask. Exposed or unexposed portions of the photoresist may be removed depending on whether a positive or negative resist is used. The materials for the patterned mask layers 204 and 206 may be etched using the photoresist to have opening 208.

The patterning process for cutting the final gate stacks 178 further includes one or more etching processes, in accordance with some embodiments. In some embodiments, a first etching process is performed using the patterned hard mask layers 204 and 206 to remove portions of the insulating layer 119 exposed from the openings 208, thereby forming openings 210, as shown in FIGS. 1AA-1, 1AA-2 and 1AA-3. The insulating layer 202 has different etching selectivity than the insulating layer 119, and thus portions of the insulating layer 202 exposed from the openings 208 remain substantially unetched or slightly etched, as shown in FIGS. 1AA-1 and 1AA-2, in accordance with some embodiments. The openings 210 may be formed in self-alignment in the Y direction, and thus the openings 208 of the patterned mask layers 204 and 206 may be formed with greater critical dimension in the Y direction. Therefore, the process limit of the photolithography process may be relaxed, and the overlay/CD shift issue may be of less concern. Therefore, the manufacturing yield of the semiconductor device may be increased.

Afterward, dielectric liners 212 are formed along the sidewalls of the openings 208 and the openings 210, as shown in FIGS. 1AA-1, 1AA-2 and 1AA-3, in accordance with some embodiments. The dielectric liners 212 are configured to shrink the critical dimensions of the openings 210 in the Y direction. In cases where the dielectric liners 212 are not formed, too much of the metal gate electrode layer may be removed, resulting in decreasing the control of the gate over the channel. In some embodiments, the thickness of the dielectric liners 212 is in a range of about 4 nm to about 40 nm.

In some embodiments, the dielectric liners 212 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the dielectric material is deposited over the semiconductor structure 100 to partially fill the openings 208 and 210, and then an etching back process is performed to removed horizontal portions of the dielectric material. The vertical portions of the dielectric material leave remaining on the sidewalls of the openings 208 and 210 and serve as the dielectric liners 212, in accordance with some embodiments.

In some embodiments, a second etching process is then performed using the patterned insulating layer 119 and the dielectric liners 212 as etch mask to remove portions of the final gate stacks 178 and the metal cap layers 186 exposed from the openings 210 until the lining layer 190 of the dielectric cap structures 188 is exposed, thereby forming the gate-cut openings 214, as shown in FIGS. 1AA-2 and 1AA-3.

The lining layer 150 of the source/drain spacer structure 162 has different etching selectivity than the gate dielectric layer 182 and the metal gate electrode layer 184, and thus portions of the lining layer 150 exposed from the opening 210 remain substantially unetched or slightly etched, in accordance with some embodiments. The gate-cut opening 214 may be formed in self-alignment in the X direction, and thus the opening 208 of the patterned mask layer 204 and 206 may be formed with greater critical dimension in the X direction. Therefore, the process limit of the photolithography process may be relaxed, and the overlay/CD shift issue may be of less concern. Therefore, the manufacturing yield of the semiconductor device may be increased.

Gate isolation structures 216 are formed in the gate-cut openings 214, as shown in FIGS. 1AB-1, 1AB-2 and 1AB-3, in accordance with some embodiments. FIG. 1AB-3 is a cross-sectional view of the semiconductor structure 100 taken along cross-section X-X shown in FIG. 1AB-1, in accordance with some embodiments of the disclosure. The gate isolation structures 216 may be also referred to as cut metal gate (CMG). The gate isolation structures 216 are configured to separate and electrically isolate neighboring segments $178_{1-4}$ of the final gate stacks 178, in accordance with some embodiments. In some embodiments, the width of the gate isolation structure 216 in the Y direction is in a range of about 15 nm to about 35 nm. In some embodiments, the thickness of the gate isolation structure 216 in the X direction is in a range of about 28 nm to about 60 nm.

In some embodiments, the gate isolation structures 216 are made of a dielectric material with a dielectric constant less than about 7. In some embodiments, the dielectric material for the gate isolation structures 216 is dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide ($SiO_2$), or a combination thereof. In some embodiments, the dielectric material for gate isolation structures 216 is deposited over the semiconductor structure 100 to overfill the gate-cut openings 214, openings 210 and 208. A planarization process is performed to remove the portion of the dielectric material over the insulating layers 119, 129 and 202 until the upper surface of the insulating layers 119, 129 and 202 are exposed, in accordance with some embodiments. In some embodiments, the patterned mask layers 204 and 206 are also removed. The portions of the dielectric material remaining in the gate-cut openings 214 serve as the gate isolation structures 216. The planarization process may be CMP or etching back process. After the planarization process, the upper surfaces of the insulating layers 119, 129 and 202 and the upper surfaces of the gate isolation structures 216 are substantially coplanar, in accordance with some embodiments. In some embodiments, after the planarization process, the thickness of the insulating layers 202 in the Z direction is in range from about 15 nm to about 35 nm.

FIG. 1AB-4 is an enlarged view of a source/drain spacer structure 162 shown in FIG. 1AB-1, in accordance with some embodiments of the disclosure. The gate isolation structure 216 partially covers the upper surface of the lining layers 150 of the source/drain spacer structure 162, in accordance with some embodiments. The lining layers 150 of the source/drain spacer structures 162 protect the fill layer 152 from being etched in the etching process of forming the gate-cut opening 214, in accordance with some embodiments. In some embodiments, the portion of the isolation structure 216 above the source/drain spacer structure 162 has a thickness in a range from 15 nm to about 35 nm.

In some embodiments, the lining layer 150 includes two vertical portions 150V and a horizontal portion 150H connecting the vertical portions 150V, as shown in FIG. 1AB-4. The vertical portion 150V has an inner sidewall 150I facing the fill layer 152 and an outer sidewall 150O facing the source/drain region 168, and a bottom surface 150B connecting the inner sidewall 150I and the outer sidewall 150O, in accordance with some embodiments. In some embodiments, the bottom surface 150B is non-horizontal. In some embodiments, the bottom surface 150B has a linear profile or curved profile. For example, the corner C1 between the inner sidewall 150I and the bottom surface 150B is located at a higher level than the corner C2 between the outer sidewall 150O and the bottom surface 150B.

In some embodiments, the distance D1 from the bottom surface of the fill layer 152 to the corner C1 in Z direction is in a range of about 5 nm to about 40 nm. In some embodiments, the distance D2 from the level of the corner C1 to the level of the corner C2 in Z direction is in a range of about 5 nm to about 40 nm.

FIGS. 1AB-5, 1AB-6 and 1AB-7 are plan views of the semiconductor structure 100 taken along plans A-A, B-B and C-C shown in FIG. 1AB-4 respectively, in accordance with some embodiments of the disclosure. The gate isolation structure 216 cutting through the final gate structure 178 is located immediately adjacent to the source/drain spacer structure 162 and contacts one sidewall of the lining layer 150 of the source/drain spacer structure 162, in accordance with some embodiments.

FIGS. 2A through 2J and 2K-1 and 2K-2 are perspective views illustrating the formation of a semiconductor structure 200 at various intermediate stages, in accordance with some embodiments of the disclosure. The embodiments of FIGS. 2A through 2K-2 are similar to the embodiments shown in FIGS. 1A through 1AB-2 except that the lining layer of the source/drain spacer structure is a multilayered structure.

Figures 1, 2A:
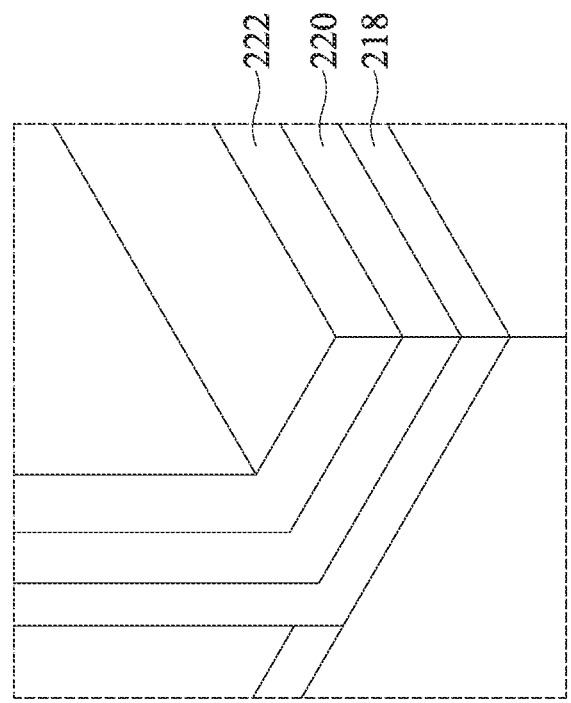
Figure 2A:
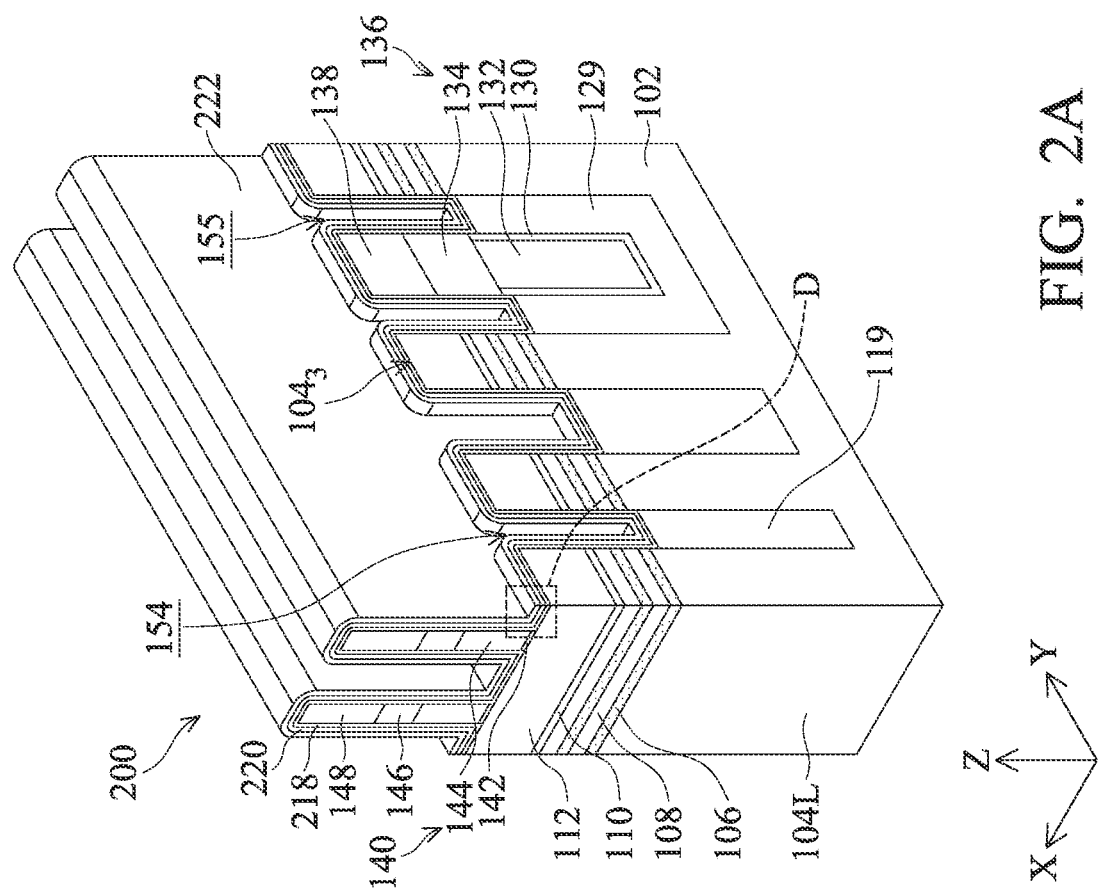
Figures 1, 2B:
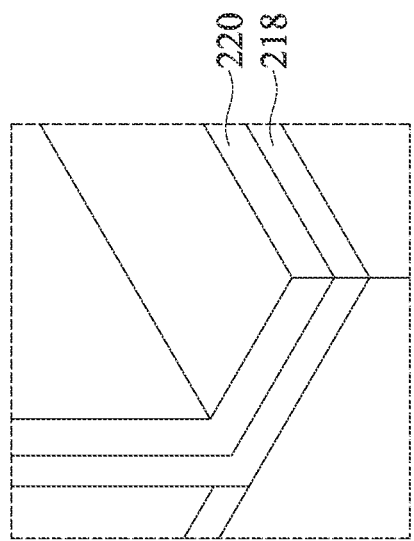
Figures 2, 2B:
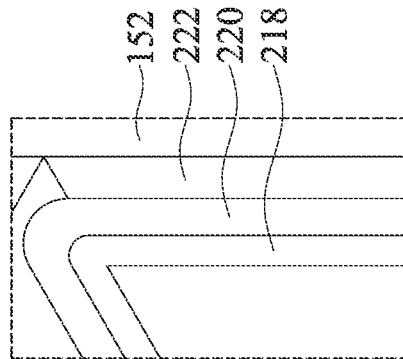
Figure 2B:
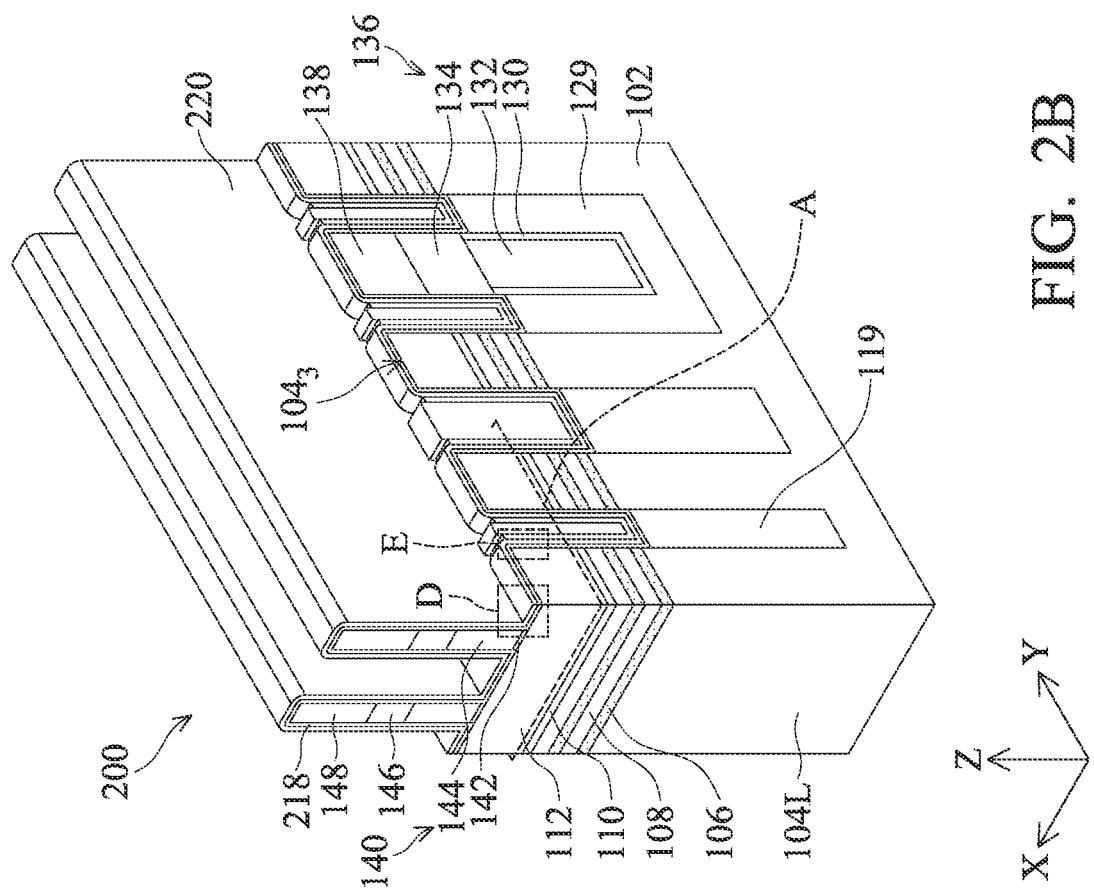
Figures 2E, 2F:
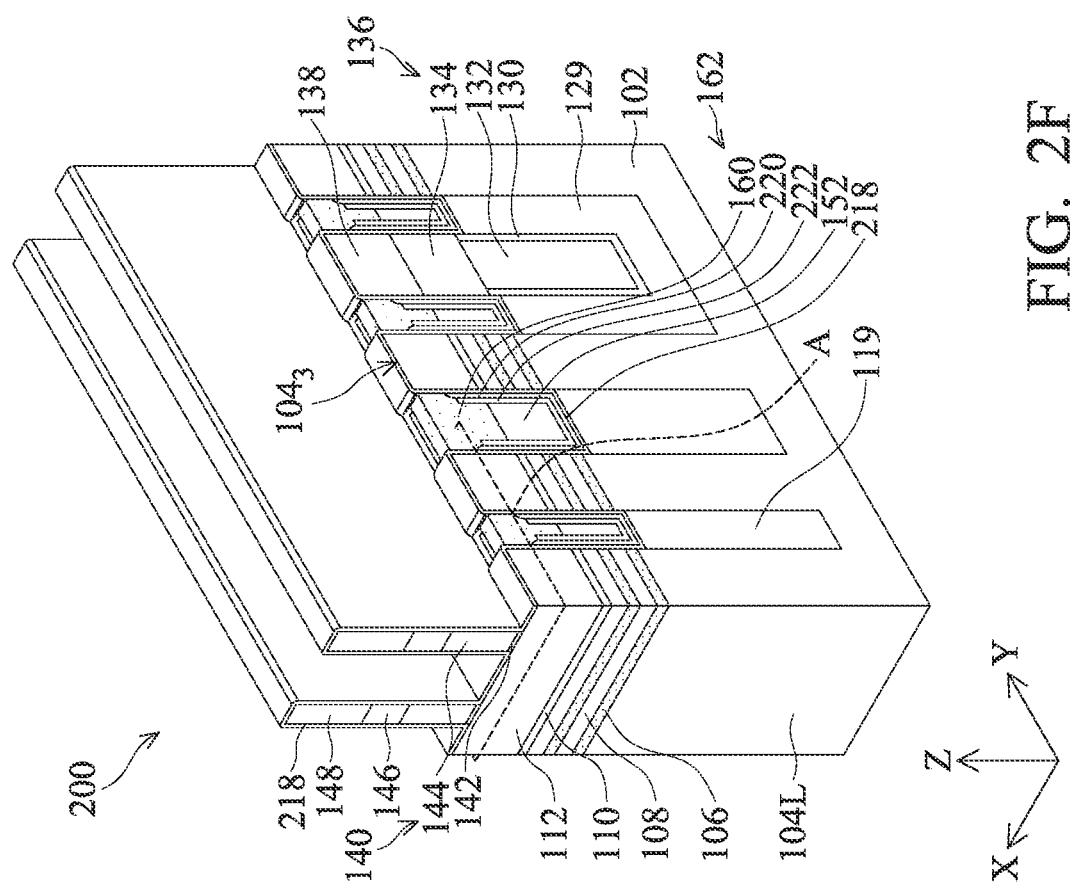
Figures 2, 2K, 3:
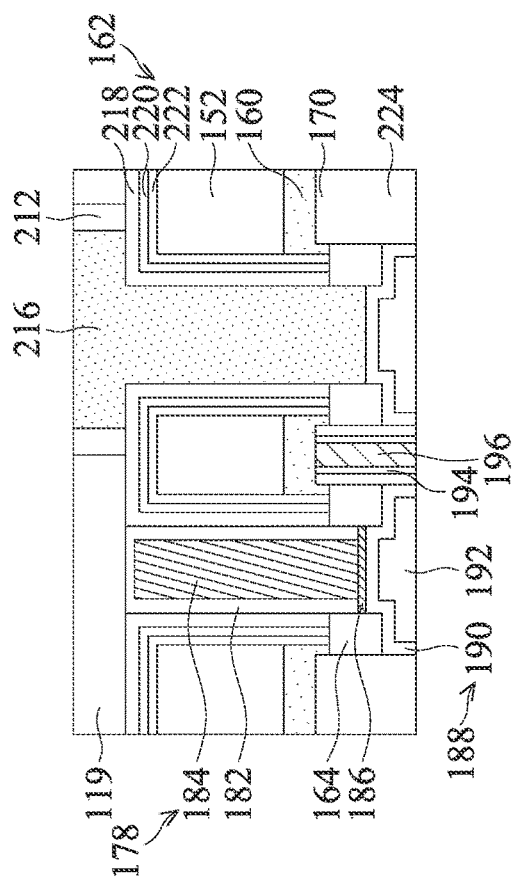
Figures 2, 2K:
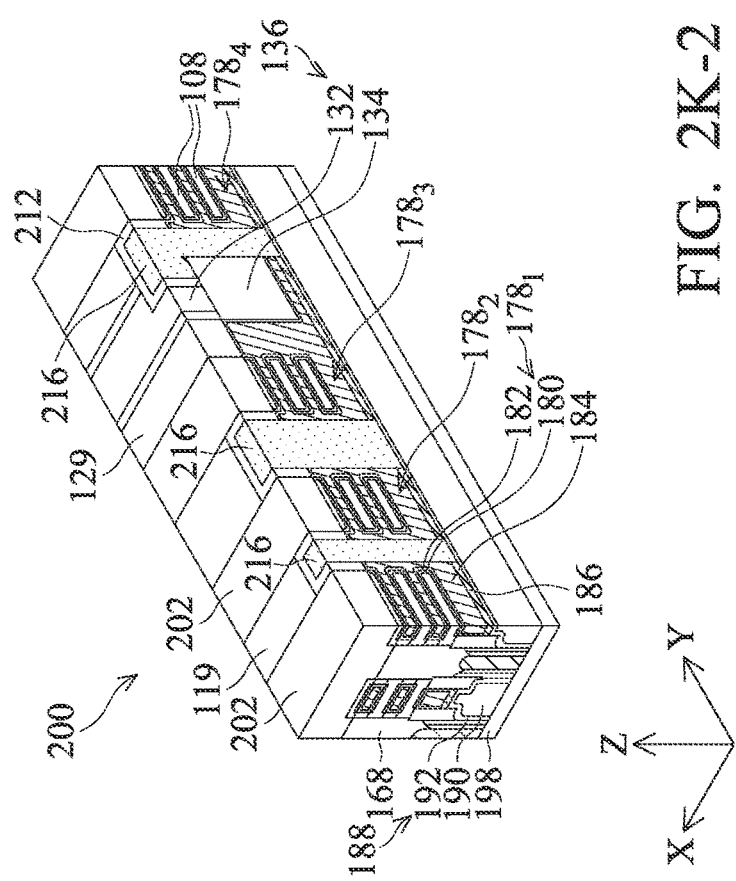

The plane Y-Z of the semiconductor structure 200 shown in FIGS. 2A through 2J and 2K-1 illustrate the reference cross-sections of the semiconductor structure 200 that is cut along Y direction through the source/drain region of the fin structures 104. The plan Y-Z of the semiconductor structure 200 shown in FIG. 2K-2 illustrates the reference cross-section of the semiconductor structure 200 that is cut along Y direction through the gate structure or gate stack (the channel region of the fin structures 104).

FIG. 2A illustrates a cross-sectional view of the semiconductor structure 200 which has been subjected to the steps described above with respect to FIGS. 1A through 1H, in accordance with some embodiments. Afterward, lining layers 218, 220 and 222 are sequentially formed over the semiconductor structure 200, as shown in FIGS. 2A and 2A-1, in accordance with some embodiments. FIG. 2A-1 is an enlarged view of area D shown in FIG. 2A, in accordance with some embodiments of the disclosure. The lining layers 218, 220 and 222 are conformally formed along the sidewalls of the fin structures 104, the sidewalls of the dielectric fin structure 136 and the sidewalls of the dummy gate structures 140, in accordance with some embodiments. The lining layers 218, 220 and 222 partially fill the spaces 154 and 155, in accordance with some embodiments.

In some embodiments, the first lining layer 218 is made of dielectric material with a low-k dielectric material. For example, the dielectric constant (k) of the first lining layer 218 may be lower than 7, or substantially equal to or lower than the k-value of silicon oxide (SiO), such as lower than 4.2, equal to or lower than about 3.9, such as in a range of about 3.5 to about 3.9. In some embodiments, the first lining layer 218 is made of dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide ($SiO_2$), or a combination thereof.

In some embodiments, the second and third lining layers 220 and 222 are made of dielectric material with a dielectric constant less than about 7. The dielectric constant of the second and third lining layers 220 and 222 may be greater than that of the first lining layer 218. In some embodiments, the second and third lining layers 220 and 222 are made of dielectric material such as silicon nitride (SiN), silicon oxynitride (SiON), silicon oxycarbide (SiOC), silicon carbon nitride (SiCN), silicon oxycarbonitride (SiOCN), oxygen-doped silicon carbonitride (Si(O)CN), silicon oxide ($SiO_2$), or a combination thereof. In some embodiments, the second lining layer 220 and the first lining layer 218 are made of different materials and have a great difference in etching selectivity. In some embodiments, the lining layers 218, 220, 222 are deposited using ALD, CVD (such as LPCVD, PECVD, HDP-CVD, or HARP), another suitable technique, and/or a combination thereof.

Figures 1, 1Z, 2, 3:
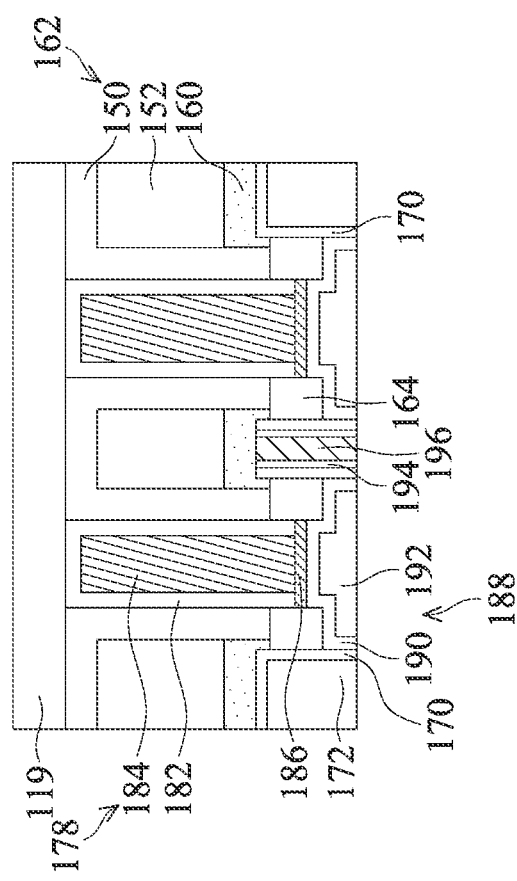
Figure 1A:
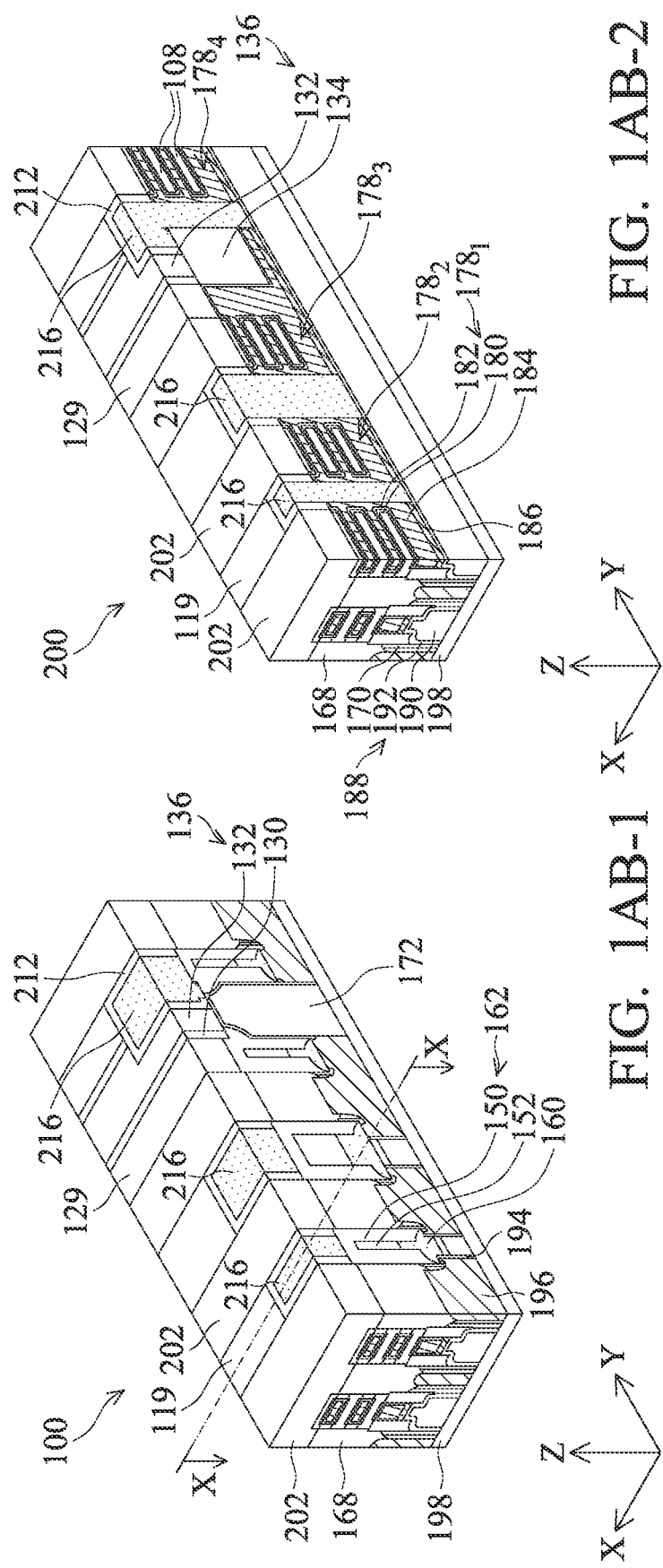

A fill layer 152 is formed over the third lining layer 222 to fill remainders of the spaces 154 and 155, as shown FIGS. 2B, 2B-1, 2B-2 and 2B-3, in accordance with some embodiments. FIGS. 2B-1 and 2B-2 are enlarged views of areas D and E shown in FIG. 2B, in accordance with some embodiments of the disclosure. FIG. 2B-3 is a plan view of the semiconductor structure 200 taken along plan A shown in FIG. 2B, in accordance with some embodiments of the disclosure, in accordance with some embodiments. The formation and the material of the fill layer 152 are similar to or the same as that described above with respect to FIG. 1I.

In some embodiments, the fill layer 152 and the third lining layer 222 are made of different materials and have a difference in etching selectivity. In some embodiments, the fill layer 152 is made of an oxide (such as silicon oxide) and the third lining layer 222 is made of a nitrogen-containing dielectric (such as silicon nitride or silicon oxynitride). In some embodiments, due to the difference in etching selectivity between the third lining layer 222 and the fill layer 152, the third lining layer 222 remains substantially unetched during the etching back process for forming the fill layer 152.

Afterward, an etching back process is performed on the third lining layer 222 to remove portions of the third lining layer 222 outside the spacers 154 and 155, thereby exposing the second lining layer 220, as shown FIGS. 2B, 2B-1 and 2B-2, in accordance with some embodiments. In some embodiments, the etching back process expands the remaining space between the dummy gate structures 140. The etching process may be an anisotropic etching process such as dry plasma etching, an isotropic etching process such as dry chemical etching, remote plasma etching or wet chemical etching, and/or a combination thereof. In some embodiments, due to the difference in etching selectivity between the third lining layer 222 and the fill layer 152, the fill layer 152 remains substantially unetched during the etching process.

The fill layer 152 and the portions of the lining layers 220 and 222 in the spaces 154 and 155 are recessed using one or more etching processes to form recesses 158 and 159, as shown in FIGS. 2C and 2C-1, in accordance with some embodiments. FIG. 2C-1 is an enlarged view of area F shown in FIG. 2C, in accordance with some embodiments of the disclosure. The one or more etching processes may be an anisotropic etching process such as dry plasma etching, an isotropic etching process such as dry chemical etching, remote plasma etching or wet chemical etching, and/or a combination thereof.

After the etching processes, the upper surfaces of the recessed portions of the third lining layer 222 are located at a higher level than the upper surface of the recessed fill layer 152, and the upper surfaces of the recessed portions of the second lining layer 220 are located at a higher level than the upper surfaces of the recessed portions of the third lining layer 222, in accordance with some embodiments. Therefore, the widths of the recesses 158 and 159 downwardly decrease, which may be helpful in the gap-fill window for subsequently formed material, in accordance with some embodiments.

An etching process is performed on the second lining layer 220 to remove the portions of the second lining layer 220 outside the recesses 158 and 159, thereby exposing the first lining layer 218, as shown FIG. 2D, in accordance with some embodiments. The one or more etching processes may be an anisotropic etching process such as dry plasma etching, an isotropic etching process such as dry chemical etching, remote plasma etching or wet chemical etching, and/or a combination thereof. In some embodiments, due to the great difference in etching selectivity between the first lining layer 218 and the second lining layer 220, the first lining layer 218 remains substantially unetched during the etching process.

A protection layer 160 is formed over the semiconductor structure 200 to overfill recesses 158 and 159, as shown in FIG. 2E, in accordance with some embodiments. The formation and the material of the protection layer 160 are similar to or the same as that described above with respect to FIG. 1N.

An etching back process is performed on the protection layer 160 to remove the portions of the protection layer 160 outside in the spaces 154 and 155, as shown in FIG. 2F, in accordance with some embodiments. In some embodiments, the etching back process may be an anisotropic etching process such as dry plasma etching, an isotropic etching process such as dry chemical etching, remote plasma etching or wet chemical etching, and/or a combination thereof. The remainders of the protection layer 160, the fill layer 152 and the lining layers 218, 220 and 222 in the recesses 158 and 159 combine to form source/drain spacer structures 162 and 162D, in accordance with some embodiments.

FIG. 2F-1 is a plan view of the semiconductor structure 200 taken along plan A shown in FIG. 2F, in accordance with some embodiments of the disclosure. The source/drain spacer structure 162 includes low-k lining layer 218 immediately adjacent to the dummy gate structure 140, which may further reduce the overall capacitance of the semiconductor device.

A portion of the first lining layer 218 outside the recesses 158 and 159 are removed using an etching process. Afterward, portions of the upper fin elements (including the dummy layers 112 and 110) and a portion of the dummy layer 138, uncovered by the dummy gate structures 140, are removed using one or more etching processes, as shown in FIG. 2G, in accordance with some embodiments. The etching process is similar to or the same as that described above with respect to FIG. 1P.

The gate spacer layers 164 are formed on opposite sides of the dummy gate structures 140, as shown in FIG. 2H, in accordance with some embodiments. The formation and the material of the gate spacer layers 164 are similar to or the same as that described above with respect to FIG. 1Q.

Afterward, an etching process is performed to recess the source/drain regions of the fin structures 104, thereby forming source/drain recesses 166, as shown in FIG. 2H, in accordance with some embodiments. The etching process is similar to or the same as that described above with respect to FIG. 1Q. In some embodiments, portions of the first lining layer 218 exposed from the source/drain recesses 166 are also recessed.

The semiconductor structure 200 is subjected to the steps described above with respect to FIG. 1R, thereby forming inner spacer layers 167, etching stop layers 169 and source/drain features 168, as shown in FIG. 2I, in accordance with some embodiments. The source/drain spacer structures 162 confine the lateral growth of the source/drain features 168, and thus the source/drain features 168 have column profiles and narrower widths, in accordance with some embodiments, thereby enhancing the performance (e.g., speed) of the semiconductor device.

The semiconductor structure 200 is subjected to the steps described above with respect to FIGS. 1S-1W, thereby forming contact etching stop layer 170, interlayer dielectric layer 172, the final gate stacks 178, and the metal cap layer 186, as shown in FIG. 2J, in accordance with some embodiments.

Portions of the interlayer dielectric layer 172 where are defined as contact plug-free region are replaced with a second interlayer dielectric layer 224, as shown in FIG. 2J, in accordance with some embodiments. The second interlayer dielectric layer 224 may be also referred to as cut metal drain (CMD). In some embodiments, the second interlayer dielectric layer 224 is made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide ($SiO_2$), or a combination thereof. In some embodiments, the interlayer dielectric layer 172 and the second interlayer dielectric layer 224 are made of different materials and have a great difference in etching selectivity.

In some embodiments, the formation of the second interlayer dielectric layer 224 includes patterning the interlayer dielectric layer 172 to form openings through the interlayer dielectric layer 172 and the contact etching stop layer 170 and exposing the protection layers 160 of the source/drain space structures 162 using photolithography and etching processes. In some embodiments, the dielectric material for the second interlayer dielectric layer 224 is deposited to overfill the openings, and a planarization process is performed on the dielectric material until the interlayer dielectric layer 172 is exposed. The deposition process may be CVD (such as LPCVD, PECVD, HDP-CVD, HARP, or FCVD), another suitable technique, and/or a combination thereof. The planarization may be CMP or etching back process.

Afterward, the remainder of the interlayer dielectric layer 172 is removed using an etching process to form contact openings, in accordance with some embodiments. Contact liners 194 and contact plugs 196 are then formed in the contact openings, as shown in FIG. 2J, in accordance with some embodiments. The formations and the materials of the contact liners 194 and the contact plugs 196 are similar to that described above with respect to FIG. 1X.

The semiconductor structure 200 is subjected to the steps described above with respect to FIGS. 1Y-1 through 1AB-2, thereby forming insulating layer 202, dielectric liners 212 and gate isolation structures 216, as shown in FIGS. 2K-1, 2K-2 and 2K-3, in accordance with some embodiments. FIG. 2K-3 is a cross-sectional view of the semiconductor structure 200 taken along cross-section X-X shown in FIG. 2K-1, in accordance with some embodiments of the disclosure. FIG. 2K-4 is an enlarged view of a source/drain spacer structure 162 shown in FIG. 2K-1, in accordance with some embodiments of the disclosure. The gate isolation structure 216 covers the upper surface and one sidewall of the first lining layers 218 of the source/drain spacer structure 162, in accordance with some embodiments. A portion of the source/drain feature 168 extends directly below the bottom surface of the first lining layer 218, as shown in FIG. 2K-4, in accordance with some embodiments.

FIGS. 2K-5, 2K-6 and 2K-7 are plan views of the semiconductor structure 200 taken along plans A-A, B-B and C-C shown in FIG. 2K-4 respectively, in accordance with some embodiments of the disclosure. The gate isolation structure 216 cutting through the final gate structure 178 is located immediately adjacent to the source/drain spacer structure 162 and contacts one sidewall of the first lining layer 218 of the source/drain spacer structure 162, in accordance with some embodiments.

FIGS. 3A through 3D are perspective views illustrating the formation of a semiconductor structure 300 at various intermediate stages, in accordance with some embodiments of the disclosure. The embodiments of FIGS. 3A through 3D are similar to the embodiments shown in FIGS. 1A through 1AB-2 except that the protection layer 160 of the source/drain spacer structure 162 is removed after the formation of the source/drain features 168.

FIG. 3A illustrates a semiconductor structure 300 which has been subjected to the steps described above with respect to FIGS. 1A through 1R, in accordance with some embodiments. The protection layer 160 of the source/drain spacer structure 162 is removed using an etching process, thereby exposing the lining layers 150 and the fill layers 152 of the source/drain features 162, as shown in FIG. 3B, in accordance with some embodiments. The etching process may be an isotropic etching process, e.g., wet etching or dry chemical etching or an anisotropic etching process such as dry plasma etching.

The semiconductor structure 300 is subjected to the steps described above with respect to FIG. 1S, thereby forming contact etching stop layer 170 and the interlayer dielectric layer 172, as shown in FIG. 3C, in accordance with some embodiments. In some embodiments, the contact etching stop layer 170 extends along and cover the exposed surfaces of the lining layer 150 and the fill layer 152 of the source/drain feature 162, in accordance with some embodiments.

Figures 1, 3D:
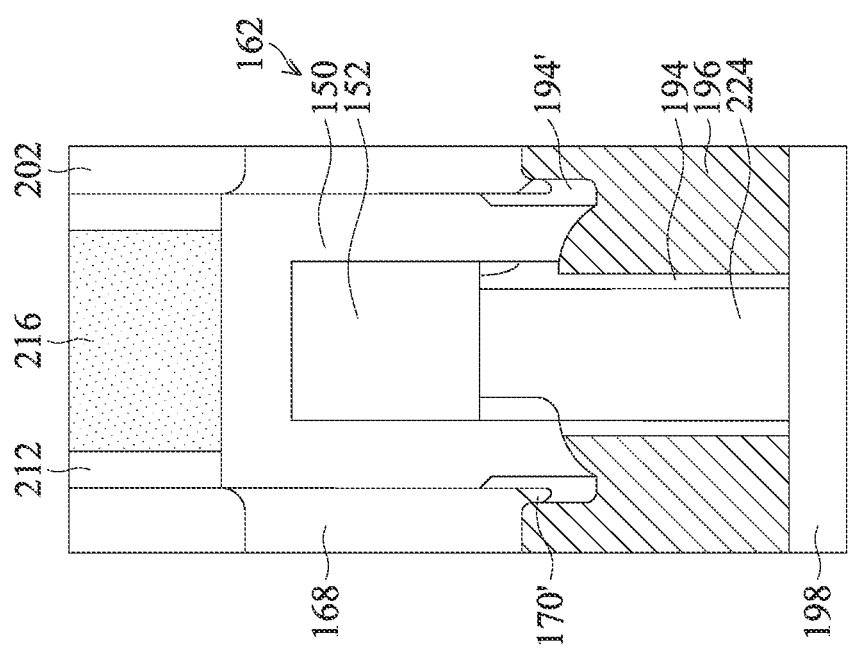
Figure 5:
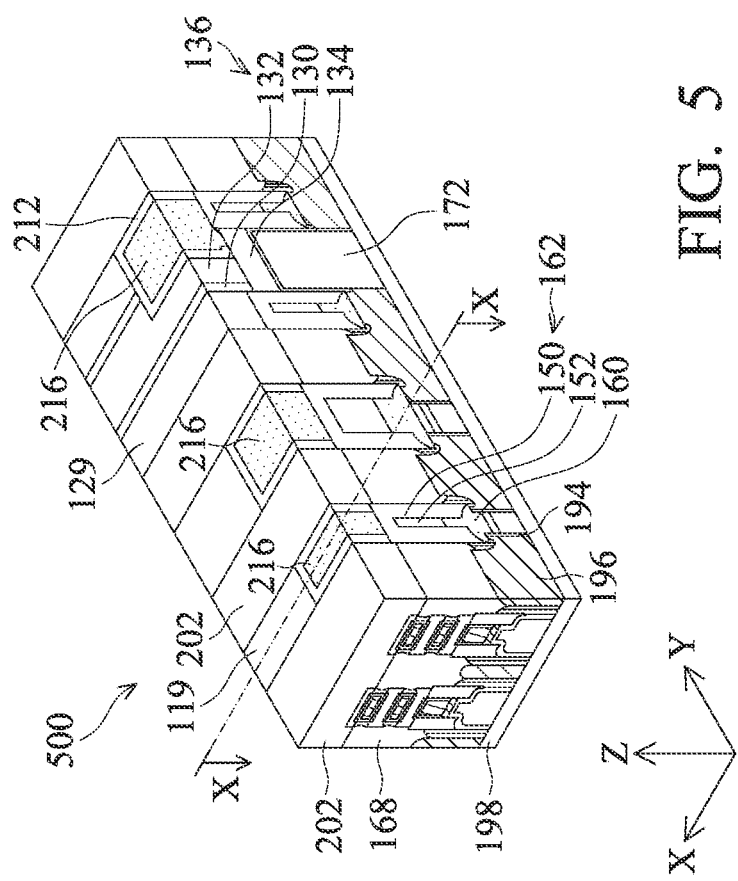
Figure 4:
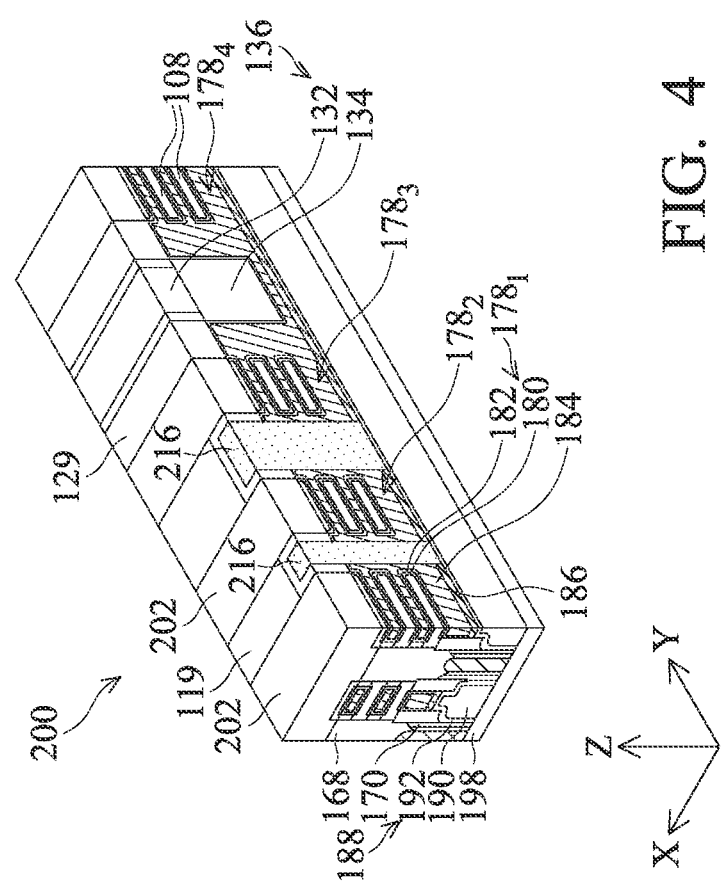

The semiconductor structure 300 is subjected to the steps described above with respect to FIGS. 1T through 1AB-2, thereby forming the final gate stacks 178, the metal cap layer 186, contact liners 194, contact plugs 196, insulating layer 202, dielectric liners 212 and gate isolation structures 216, as shown in FIG. 3D, in accordance with some embodiments. In addition, before forming the contact plugs 196, a second interlayer dielectric layer 224 may be formed to replace portions of the interlayer dielectric layer 172 where are defined as contact plug-free region, as described above with respect to FIG. 2J, in accordance with some embodiments.

FIG. 3D-1 is an enlarged view of a source/drain spacer structure 162 shown in FIG. 3D, in accordance with some embodiments of the disclosure. Because the protection layer 160 is removed, the parasitic capacitance between the gate stack and the source/drain features and between the gate stack and the contact plug is reduced, thereby enhancing the performance (e.g., speed) of the semiconductor device, in accordance with some embodiments.

Figures 2, 2K, 3, 4, 5, 6:
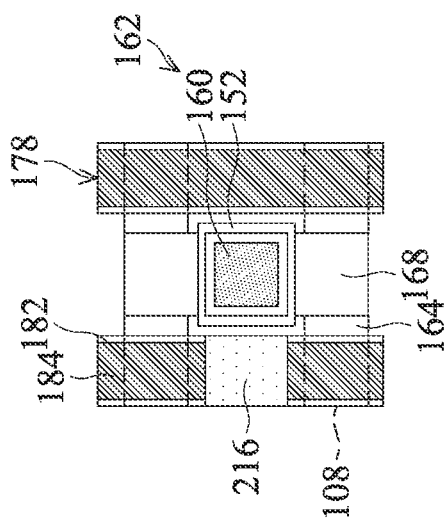
Figures 2, 2K, 3, 4, 5, 6, 7:
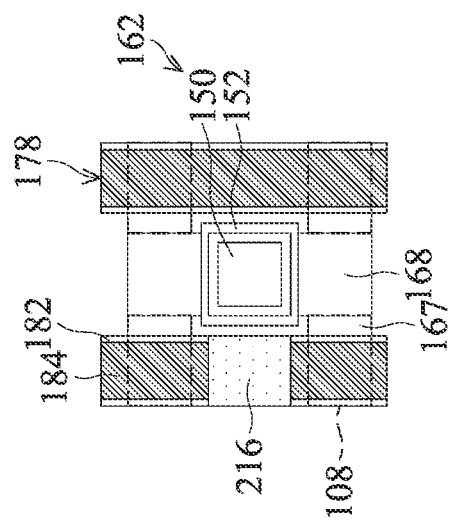
Figures 2, 2K, 3, 4, 5:
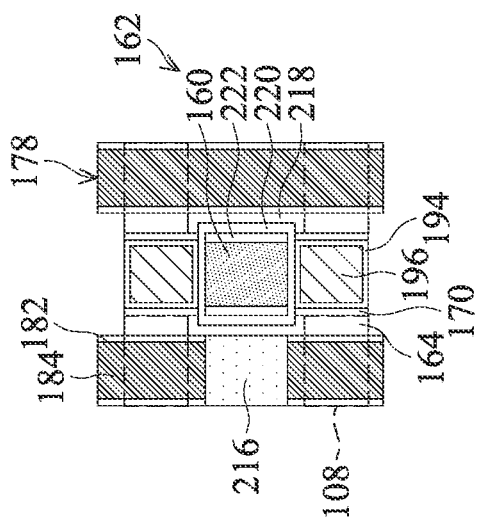
Figures 2, 2K, 3, 4:
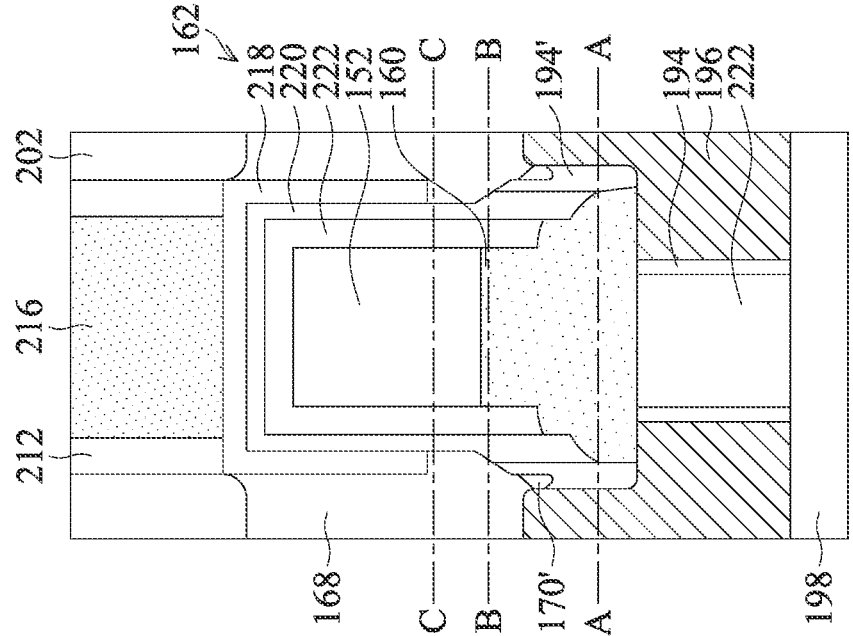

FIG. 4 is a modification of the semiconductor structure 100 shown in FIG. 1AB-1, in accordance with some embodiments of the disclosure. There is no gate isolation structure 216 formed through the final gate stack 178 between the adjacent two sets of nanostructures 108 (of the fin structure $104_3$ and $104_4$), as shown in FIG. 4, in accordance with some embodiments. Therefore, the final gate stack 178 continuously extends across and is shared by the two sets of nanostructures 108, in accordance with some embodiments.

FIG. 5 is a modification of the semiconductor structure shown 100 in FIG. 1AB-1, in accordance with some embodiments of the disclosure. In the etching process for forming the source/drain recesses 166 (FIG. 1Q), the portion of the protection layer 134 of the dielectric fin structure 136 uncovered by the gate spacer layers 164 and the dummy gate structures 140 are not removed, and the contact etching stop layer 170 is formed on the protection layer 134, as shown in FIG. 5, in accordance with some embodiments.

As described above, the aspect of the present disclosure is directed to forming a semiconductor structure having source/drain spacer structures. The source/drain spacer structures 162 confine the lateral growth of the source/drain features 168, and thus the source/drain features 168 are formed with column profiles and narrower widths, thereby reducing the parasitic capacitance between the gate stack and the source/drain feature, thereby enhancing the performance of the semiconductor device.

In addition, the source/drain spacer structures 162 are formed after the dummy gate structures 140 and do not extend directly below the dummy gate structures 140, and thus the gate trenches 174 may provide more space to accommodate the gate materials, which may enlarge the gap-fill window of forming the metal gate electrode 184. Therefore, the short channel effect (SCE) is improved.

In addition, the source/drain spacer structure 162 includes the lining layer 150 having a lower dielectric constant, which may prevent the leakage between the contact plug 196 and the metal gate electrode layer 184, but also reduces the parasitic capacitance. Therefore, the performance of the semiconductor device is enhanced.

In addition, the embodiments of the present disclosure provide a method for forming gate isolation structures from the backside of the substrate. The gate-cut openings 214 for the gate isolation structures 216 may be formed in self-alignment. Therefore, the process limit of the photolithography process may be relaxed, and the overlay/CD shift issue may be of less concern. Therefore, the manufacturing yield of the semiconductor device may be increased.

Embodiments of a semiconductor structure and the method for forming the same may be provided. The semiconductor structure may include a first gate stack adjacent to a first source/drain feature, a second gate stack adjacent to a second source/drain feature, a gate isolation structure interposed between the first and second gate stacks, and a source/drain spacer structure interposed between the first and the second source/drain features. The gate isolation structure covers the sidewall of the source/drain spacer structure. As a result, the source/drain spacer structure may confine the lateral growth of the source/drain features, the gap-fill window of forming the gate stacks is enlarged, and the process limit of forming the gate isolation structure may be relaxed. Therefore, the performance of the semiconductor device is enhanced, and the manufacturing yield of the semiconductor device may be increased.

In some embodiments, a semiconductor structure is provided. The semiconductor structure includes a first gate stack wrapping around first nanostructures, a second gate stack wrapping around second nanostructures, a gate isolation structure interposing between the first gate stack and the second gate stack, a first source/drain feature adjoining the first nanostructures, a second source/drain feature adjoining the second nanostructures, and a source/drain spacer structure interposing between the first source/drain feature and the second source/drain feature. The gate isolation structure covers a sidewall of the source/drain spacer structure.

In some embodiments, a semiconductor structure is provided. The semiconductor structure includes first nanostructures and second nanostructures laterally spaced apart from the first nanostructures, a first gate stack across the first nanostructures and the second nanostructures, a first source/drain feature adjoining the first nanostructures, a second source/drain feature adjoining the second nanostructures, and a source/drain spacer structure between the first source/drain feature and the second source/drain feature. The first gate stack includes a gate dielectric layer and a gate electrode layer over the gate dielectric layer. The gate dielectric layer includes a first portion surrounding the first nanostructures, a second portion surrounding the second nanostructures, and a third portion interposing between a first sidewall of the source/drain spacer structure and the gate electrode layer.

In some embodiments, a method for forming semiconductor structure is provided. The method includes forming a first fin structure and a second fin structure over a substrate, and each of the first fin structure and the second fin structure includes first semiconductor layers and second semiconductor layers alternatingly stacked. The method also includes forming a first dummy gate structure and a second dummy gate structure across a channel region of the first fin structure and a channel region of the second fin structure, forming a lining layer along the first fin structure, the second fin structure, the first dummy gate structure and the second dummy gate structure, and forming a fill layer over the lining layer and filling a space defined by the first fin structure, the second fin structure, the first dummy gate structure and the second dummy gate structure. The method also includes recessing a source/drain region of the first fin structure to form a first recess and recessing a source/drain region of the second fin structure to form a second recess, and forming a first source/drain feature in the first recess and a second source/drain feature in the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first gate stack wrapping around first nanostructures;
   a second gate stack wrapping around second nanostructures;
   a gate isolation structure interposed between the first gate stack and the second gate stack;
   a first source/drain feature adjoining the first nanostructures;
   a second source/drain feature adjoining the second nanostructures; and
   a source/drain spacer structure interposed between the first source/drain feature and the second source/drain feature, wherein the gate isolation structure covers a sidewall of the source/drain spacer structure, wherein the gate isolation structure covers an upper surface of the source/drain spacer structure.

2. The structure of claim 1, wherein the source/drain spacer structure comprises:
   a first lining layer in contact with the first source/drain feature, the second source/drain feature and the gate isolation structure; and
   a fill layer over the first lining layer, wherein the fill layer and the first lining layer are made of different dielectric materials.

3. The structure of claim 2, wherein the source/drain spacer structure comprises:
   a protection layer below the first lining layer and the fill layer, wherein the protection layer is made of a dielectric material having a higher dielectric constant than the dielectric materials of the first lining layer and the fill layer.

4. The structure of claim 3, wherein the protection layer includes a top portion surrounded by the first lining layer and a bottom portion extending directly below a bottom surface of the first lining layer.

5. The structure of claim 2, wherein the source/drain spacer structure comprises:
   a second lining layer between the first lining layer and the fill layer, wherein the first lining layer is made of a dielectric material having a lower dielectric constant than a dielectric material of the second lining layer.

6. The structure of claim 5, wherein the source/drain spacer structure comprises:
   a third lining layer between the second lining layer and the fill layer, wherein a bottom surface of the third lining layer is higher than a bottom surface of the second lining layer.

7. The structure of claim 1, further comprising:
   a first contact plug below the first source/drain feature;

a second contact plug below the second source/drain feature; and an interlayer dielectric layer between the first contact plug and the second contact plug.

8. The structure of claim 7, wherein a portion of the interlayer dielectric layer is surrounded by the source/drain spacer structure.

9. The structure of claim 1, further comprising:

a third gate stack wrapping around third nanostructures, wherein the source/drain spacer structure extends between the third gate stack and the gate isolation structure.

10. A semiconductor structure, comprising:

first nanostructures and second nanostructures laterally spaced apart from the first nanostructures;

a first gate stack across the first nanostructures and the second nanostructures;

a first source/drain feature adjoining the first nanostructures;

a second source/drain feature adjoining the second nanostructures; and a source/drain spacer structure between the first source/drain feature and the second source/drain feature, wherein the source/drain spacer structure does not extend over the first source/drain feature or over the second source/drain feature, wherein the first gate stack comprises a gate dielectric layer and a gate electrode layer over the gate dielectric layer, the gate dielectric layer comprising a first portion surrounding the first nanostructures, a second portion surrounding the second nanostructures, and a third portion extending between a first sidewall of the source/drain spacer structure and the gate electrode layer.

11. The structure of claim 10, further comprising:

a gate spacer layer along a sidewall of the first gate stack and below the source/drain spacer structure.

12. The structure of claim 10, further comprising:

third nanostructures and fourth nanostructures laterally spaced apart from the third nanostructures;

a second gate stack across the third nanostructures;

a third gate stack across the fourth nanostructures; and a gate isolation structure separating the second gate stack from the third gate stack, wherein the gate isolation structure is interfaced with a second sidewall of the source/drain spacer structure.

13. The structure of claim 12, further comprising:

a first insulating layer over the first source/drain feature and the second source/drain feature; and a second insulating layer over the source/drain spacer structure, wherein the first insulating layer and the second insulating layer are made of different dielectric materials.

14. A semiconductor structure, comprising:

first nanostructures and second nanostructures laterally spaced apart from the first nanostructures;

third nanostructures and fourth nanostructures laterally spaced apart from the third nanostructures;

a first gate structure across the first nanostructures and the second nanostructures;

a second gate structure across the third nanostructures;

a third gate structure across the fourth nanostructures;

a first source/drain feature adjoining the first nanostructures and the third nanostructures;

a second source/drain feature adjoining the second nanostructures and the fourth nanostructures;

a dielectric fin adjacent the first gate structure, wherein the dielectric fin extends above the first nanostructures, wherein the first gate structure extends over a first surface of the dielectric fin and over an uppermost surface of the first nanostructures, wherein the first surface of the dielectric fin and the uppermost surface of the first nanostructures face a same direction;

a first source/drain spacer structure between the first source/drain feature and the second source/drain feature, wherein the first gate structure comprises a gate dielectric layer and a gate electrode layer over the gate dielectric layer, the gate dielectric layer comprising a first portion surrounding the first nanostructures, a second portion surrounding the second nanostructures, and a third portion extending between a first sidewall of the first source/drain spacer structure and the gate electrode layer; and a gate isolation structure separating the second gate structure from the third gate structure, wherein the gate isolation structure contacts the first source/drain spacer structure.

15. The structure of claim 14, wherein the first source/drain spacer structure comprises:

a first lining layer in contact with the first source/drain feature and the second source/drain feature; and a fill layer over the first lining layer, wherein the fill layer and the first lining layer are made of different dielectric materials.

16. The structure of claim 15, wherein the first source/drain spacer structure comprises:

a protection layer below the first lining layer and the fill layer, wherein the protection layer is made of a dielectric material being a different material than the first lining layer and the fill layer.

17. The structure of claim 15, wherein the gate isolation structure contacts the first lining layer.

18. The structure of claim 14, wherein the dielectric fin extends lower than a bottom surface of the first gate structure.

19. The structure of claim 14, wherein the first gate structure extends along opposing sidewalls of the dielectric fin.

20. The structure of claim 14, further comprising:

an interlayer dielectric adjacent the first gate structure and over the dielectric fin, wherein a height of the dielectric fin under the first gate structure is greater than a height of the dielectric fin under the interlayer dielectric.

* * * * *